US012599035B2

(12) United States Patent
Park et al.

(10) Patent No.: US 12,599,035 B2
(45) Date of Patent: Apr. 7, 2026

(54) DISPLAY DEVICE

(71) Applicant: Samsung Display Co., LTD., Yongin-si (KR)

(72) Inventors: Jin Taek Park, Seoul (KR); Soo Chul Kim, Hwaseong-si (KR); Dae Ho Song, Hwaseong-si (KR); So Young Yeo, Suwon-si (KR); Ok Yi Lee, Seoul (KR); Joo Woan Cho, Seongnam-si (KR); Jin Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 829 days.

(21) Appl. No.: 17/710,183

(22) Filed: Mar. 31, 2022

(65) Prior Publication Data

US 2022/0352140 A1    Nov. 3, 2022

(30) Foreign Application Priority Data

Apr. 29, 2021    (KR) ........................ 10-2021-0056014

(51) Int. Cl.
H01L 25/18 (2023.01)
G02B 5/20 (2006.01)
    (Continued)

(52) U.S. Cl.
CPC .............. H01L 25/18 (2013.01); G02B 5/201 (2013.01); H10H 20/8513 (2025.01);
    (Continued)

(58) Field of Classification Search
CPC ...... G02F 1/133514–133521; G02F 1/136222; H10H 20/8513
See application file for complete search history.

(56) References Cited

U.S. PATENT DOCUMENTS

| 11,004,910 B2 | 5/2021 | Jung et al. |
| 11,672,154 B2 | 6/2023 | Jung et al. |
| (Continued) | | |

FOREIGN PATENT DOCUMENTS

| KR | 10-2015-0097357 A | 8/2015 |
| KR | 10-2017-0100999 A | 9/2017 |
| (Continued) | | |

OTHER PUBLICATIONS

Chang Hyun Jeong et al., "A Study of Sapphire Etching Characteristics Using BCl$_3$-based Inductively Coupled Plasmas", Japanese Journal of Applied Physics, 2002, pp. 6206-6208, vol. 41, Part 1, No. 10, The Japan Society of Applied Physics.

(Continued)

*Primary Examiner* — Amar Movva
(74) *Attorney, Agent, or Firm* — Womble Bond Dickinson (US) LLP

(57) ABSTRACT

A display device includes: a first substrate; a plurality of light-emitting elements on the first substrate; a second substrate opposite to the first substrate, and including one face facing the first substrate, and an opposite face to the one face; a plurality of grooves at the opposite face of the second substrate; a plurality of wavelength conversion layers, each of the wavelength conversion layers being located in a corresponding groove of the plurality of grooves to convert a wavelength of light emitted from a corresponding light-emitting element of the plurality of light-emitting elements; and a plurality of color filters on the wavelength conversion layers, respectively.

28 Claims, 40 Drawing Sheets

(51) Int. Cl.

| | |
|---|---|
| *H01L 23/00* | (2006.01) |
| *H10H 20/851* | (2025.01) |
| *H10H 20/855* | (2025.01) |
| *H10H 29/14* | (2025.01) |

(52) U.S. Cl.

CPC ........ *H10H 20/855* (2025.01); *H10H 29/142* (2025.01); *H01L 24/05* (2013.01); *H01L 24/13* (2013.01); *H01L 24/14* (2013.01); *H01L 24/16* (2013.01); *H01L 24/48* (2013.01); *H01L 2224/05124* (2013.01); *H01L 2224/05561* (2013.01); *H01L 2224/05611* (2013.01); *H01L 2224/05624* (2013.01); *H01L 2224/05644* (2013.01); *H01L 2224/05647* (2013.01); *H01L 2224/13006* (2013.01); *H01L 2224/13007* (2013.01); *H01L 2224/13013* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2224/1403* (2013.01); *H01L 2224/16148* (2013.01); *H01L 2224/48101* (2013.01); *H01L 2224/48159* (2013.01)

(56) References Cited

U.S. PATENT DOCUMENTS

| | | | | |
|---|---|---|---|---|
| 2012/0218173 | A1* | 8/2012 | Ohta | G02B 27/1046 |
| | | | | 345/76 |
| 2017/0287887 | A1* | 10/2017 | Takeya | H01L 25/167 |
| 2017/0309798 | A1 | 10/2017 | Bonar et al. | |
| 2018/0190615 | A1 | 7/2018 | Pan | |
| 2019/0064595 | A1 | 2/2019 | Tran et al. | |
| 2020/0259042 | A1* | 8/2020 | Park | H10H 20/825 |

FOREIGN PATENT DOCUMENTS

| | | | |
|---|---|---|---|
| KR | 10-2018-0118488 | A | 10/2018 |
| KR | 10-2020-0047943 | A | 5/2020 |
| KR | 10-2020-0127777 | A | 11/2020 |

OTHER PUBLICATIONS

Kazuyuki Tadatomo et al., "Development of patterned sapphire substrate and the application to the growth of non-polar and semi-polar GaN for light-emitting diodes", Proc. of SPIE, 2011, pp. 795416-1 to 795416-10, vol. 7954.

Qinhuawei et al., "Enhanced Transparency of Rough Surface Sapphire by Surface Vitrifaction Process", Applied Materials & Interfaces, 2018, 4 pages, American Chemical Society.

Tetsuya Takeuchi, Foreword to "Advanced Plasma Science and Its Application for Nitrides and Nanomaterials", Japanese Journal of Applied Physics, 2021, 2 pages, The Japan Society of Applied Physics.

Zhongyang Li et al., "Effects of polishing parameters on surface quality in sapphire double-sided CMP", Ceramics International, 2020, 9 pages, vol. 46, No. 9, Elsevier Ltd.

* cited by examiner

LE: SEM1, EBL, MQW, SLT, SEM2, SEM3

QDL: 230, 240, 250

PRP

DR3

DR1

DR2

BS

DISPLAY DEVICE

CROSS-REFERENCE TO RELATED APPLICATION

This application claims priority to and the benefit of Korean Patent Application No. 10-2021-0056014, filed on Apr. 29, 2021 in the Korean Intellectual Property Office, the entire content of which is incorporated by reference herein.

BACKGROUND

1. Field

One or more embodiments of the present disclosure relate to a display device.

2. Description of Related Art

As information society develops, demand for a display device for displaying an image is increasing in various forms. The display device may include a planarized panel display device, such as a liquid crystal display device, a field emission display device, or a light-emitting display device. The light-emitting display device may include an organic light-emitting display device including an organic light-emitting diode element as a light-emitting element, an inorganic light-emitting display device including an inorganic semiconductor element as a light-emitting element, or an ultra-small light-emitting diode or a micro light-emitting diode element as a light-emitting element.

Recently, a head mounted display (HMD) including the light emitting display device is being developed. The head mounted display is a spectacle-type monitor device for virtual reality (VR) or augmented reality (AR) that a user wears in a form of glasses or a helmet, and which has a focal point at a position closer to the user's eyes.

The above information disclosed in this Background section is for enhancement of understanding of the background of the present disclosure, and therefore, it may contain information that does not constitute prior art.

SUMMARY

A high-resolution ultra-small light-emitting diode display panel including an ultra-small light-emitting diode element may be applied to a head mounted display. Because the ultra-small light-emitting diode element emits a single color of light, the ultra-small light-emitting diode display panel may include a wavelength conversion layer to convert a wavelength of light emitted from the ultra-small light-emitting diode element to display various colors.

One or more embodiments of the present disclosure are directed to an ultra-high resolution display device including ultra-high resolution light-emitting areas.

One or more embodiments of the present disclosure are directed to a display device capable of optimizing or improving an optical path to maximize or improve optical efficiency.

Aspects and features of the present disclosure are not limited to the above. Other aspects and features of the present disclosure may be understood based on following description, and may be more clearly understood based on various embodiments according to the present disclosure. Further, it will be understood that the aspects and features of the present disclosure may be realized according to the claims, their equivalents, and combinations thereof.

According to one or more embodiments of the present disclosure, a display device includes: a first substrate; a plurality of light-emitting elements on the first substrate; a second substrate opposite to the first substrate, and including one face facing the first substrate, and an opposite face to the one face; a plurality of grooves at the opposite face of the second substrate; a plurality of wavelength conversion layers, each of the wavelength conversion layers being located in a corresponding groove of the plurality of grooves to convert a wavelength of light emitted from a corresponding light-emitting element of the plurality of light-emitting elements; and a plurality of color filters on the wavelength conversion layers, respectively.

In an embodiment, the plurality of grooves may include a first groove, a second groove, and a third groove spaced apart from each other, and the wavelength conversion layers may fill the first groove, the second groove, and the third groove, respectively.

In an embodiment, the plurality of light-emitting elements may be configured to emit first light; the plurality of color filters may include: a first color filter configured to transmit the first light; a second color filter configured to transmit second light having a wavelength band different from a wavelength band of the first light; and a third color filter configured to transmit third light having a wavelength band different from the wavelength band of each of the first light and the second light; and the first color filter may be located on the first groove, the second color filter may be located on the second groove, and the third color filter may be located on the third groove.

In an embodiment, each of the wavelength conversion layers may be configured to convert a portion of the first light into fourth light, and mix the first light and the fourth light to generate and output fifth light.

In an embodiment, the first color filter may be configured to convert the fifth light to the first light; the second color filter may be configured to convert the fifth light to the second light; and the third color filter may be configured to convert the fifth light to the third light.

In an embodiment, the wavelength conversion layers may include: a light-transmissive pattern configured to transmit the first light therethrough; a first wavelength conversion pattern configured to convert the first light into the second light; and a second wavelength conversion pattern configured to convert the first light into the third light.

In an embodiment, the light-transmissive pattern may overlap with the first color filter and the first groove, the first wavelength conversion pattern may overlap with the second color filter and the second groove, and the second wavelength conversion pattern may overlap with the third color filter and the third groove.

In an embodiment, each of the plurality of grooves may have a depth in a range of 1 micrometer ($\mu$m) to 10 $\mu$m.

In an embodiment, each of the plurality of light-emitting elements may include: a first semiconductor layer; an active layer on the first semiconductor layer; a second semiconductor layer on the active layer; and a third semiconductor layer on the second semiconductor layer.

In an embodiment, each of the second semiconductor layer and the third semiconductor layer may be a common layer at the plurality of light-emitting elements.

In an embodiment, a thickness of the second semiconductor layer in an overlapping area at which the second semiconductor layer overlaps with the first semiconductor layer may be greater than a thickness of the second semiconductor layer in a non-overlapping area at which the second semiconductor layer does not overlap with the first semiconductor layer.

In an embodiment, the device may further include: a first insulating layer on side faces of each of the first semiconductor layer, the active layer, and the second semiconductor layer; and a first reflective layer on side faces of the first insulating layer.

In an embodiment, the device may further include a second reflective layer on side faces of each of the plurality of grooves, and the second reflective layer may include a plurality of portions, each of the portions surrounding a corresponding wavelength conversion layer of the wavelength conversion layers.

In an embodiment, the first substrate may include: a plurality of pixel circuits, each including at least one transistor; pixel electrodes on and connected to the plurality of pixel circuits, respectively; a circuit insulating layer between the plurality of pixel circuits and the pixel electrodes; and contact electrodes on the pixel electrodes, respectively.

In an embodiment, the device may further include a plurality of connecting electrodes, each of the connecting electrodes being located between the first semiconductor layer of a corresponding light-emitting element of the light-emitting elements and a corresponding contact electrode of the contact electrodes, and each of the contact electrodes may be in contact with a corresponding connecting electrode of the plurality of connecting electrodes.

In an embodiment, the device may further include a first protective layer between the second substrate and the color filters, and one face of the first protective layer may be in contact with the wavelength conversion layers and the second substrate, and an opposite face of the first protective layer may be in contact with the color filters.

In an embodiment, at least one of the plurality of color filters and at least one of the plurality of wavelength conversion layers may be received in at least one of the plurality of grooves.

In an embodiment, the device may further include: a second reflective layer on side faces of each of the plurality of grooves, and the second reflective layer may contact each of the wavelength conversion layers and the at least one of the plurality of color filters.

In an embodiment, the device may further include: an organic layer on the second substrate; and a plurality of openings defined in the organic layer, and exposing the plurality of grooves, respectively. The plurality of color filters may be received in the plurality of openings, respectively.

In an embodiment, the plurality of grooves may include a first groove, a second groove, and a third groove spaced from each other. The plurality of openings may include: a first opening overlapping with the first groove; a second opening overlapping with the second groove; and a third opening overlapping with the third groove. The plurality of color filters may include: a first color filter received in the first opening; a second color filter received in the second opening; and a third color filter received in the third opening.

According to one or more embodiments of the present disclosure, a display device includes: a first substrate; a plurality of light-emitting elements on the first substrate; a second substrate opposite to the first substrate, and including one face facing the first substrate, and an opposite face to the one face; a plurality of grooves at the opposite face of the second substrate; a plurality of wavelength conversion layers, each of the wavelength conversion layers being located in a corresponding groove of the plurality of grooves to convert a wavelength of light emitted from a corresponding light-emitting element of the plurality of light-emitting elements; and a plurality of color filters on the wavelength conversion layers, respectively. A protrusion is on a bottom face of each of the plurality of grooves, the protrusion protruding toward the plurality of color filters.

In an embodiment, the protrusion may have a micro-lens shape or a prism shape.

In an embodiment, a height of each protrusion may be smaller than a depth of each groove.

In an embodiment, the protrusion may occupy 50% to 90% of an area of the bottom face.

According to one or more embodiments of the present disclosure, a display device includes: a first substrate; a plurality of light-emitting elements on the first substrate; a second substrate opposite to the first substrate, and including one face facing the first substrate, and an opposite face to the one face; a plurality of grooves at the opposite face of the second substrate; a planarization layer received in each of the plurality of grooves; a plurality of wavelength conversion layers on the planarization layer and received in the plurality of grooves, respectively, each of the wavelength conversion layers is configured to convert a wavelength of light emitted from a corresponding light-emitting element of the plurality of light-emitting elements; and a plurality of color filters on the wavelength conversion layers, respectively. Each of the plurality of grooves has a bottom face and a side face, and a fine convex-concave pattern is on at least the side face of each of the grooves.

In an embodiment, the planarization layer may be located between the bottom face of each groove and the wavelength conversion layers.

In an embodiment, a thickness of the planarization layer may be smaller than a depth of the grooves, and may be in a range of 5% to 30% of the depth of the grooves.

In an embodiment, a thickness of the planarization layer may be smaller than a thickness of the wavelength conversion layers.

According to one or more embodiments, the display device may include a base substrate including sapphire or silicon. Thus, a plurality of grooves having a high aspect ratio may be formed (e.g., may be easily formed) using high aspect ratio etching. Accordingly, the ultra-high resolution light-emitting areas may be formed. Thus, the ultra-high resolution display device having the ultra-high resolution light-emitting areas may be manufactured.

According to one or more embodiments, the display device may include the wavelength conversion layers including the light-transmissive pattern, the first wavelength conversion pattern, and the second wavelength conversion pattern, respectively, thereby improving light emission efficiency of each of blue light, green light, and red light.

According to one or more embodiments, the display device may include the first protective layer between the color filter and the wavelength conversion layer, thereby preventing or substantially preventing the color filter from being damaged in a subsequent process.

According to one or more embodiments, the groove having a large depth may be formed in the display device. Thus, the color filter and the wavelength conversion layer may be disposed in the groove. Accordingly, alignment between the color filter and the wavelength conversion layer may be accurate or improved, and a thickness of the wavelength conversion layer may be increased, thereby improving wavelength conversion efficiency.

According to one or more embodiments, the display device may include the protrusion formed on the bottom face of the groove to induce diffusion and condensing of incident light, thereby improving the wavelength conversion efficiency of the wavelength conversion layer.

According to one or more embodiments, the fine convex-concave pattern may be formed in the display device on the side face and the bottom face of the groove, and the planarization layer may be formed on the bottom face. Thus, straightness of the light incident from the bottom face may be maintained or substantially maintained, and the diffusion of light from the side face may be induced, thereby improving the wavelength conversion efficiency of the wavelength conversion layer.

However, the aspects and features of the present disclosure are not limited to the above, and other aspects and features will be clearly understood by those skilled in the art from following description, the figures, and the claims and their equivalents.

BRIEF DESCRIPTION OF DRAWINGS

The above and other aspects and features of the present disclosure will be more clearly understood from the following detailed description of the illustrative, non-limiting example embodiments with reference to the accompanying drawings, in which:

FIG. 4 is a cross-sectional view showing an example of the display panel taken along the line Q1-Q1' in FIG. 2;

DETAILED DESCRIPTION

Figure 1:
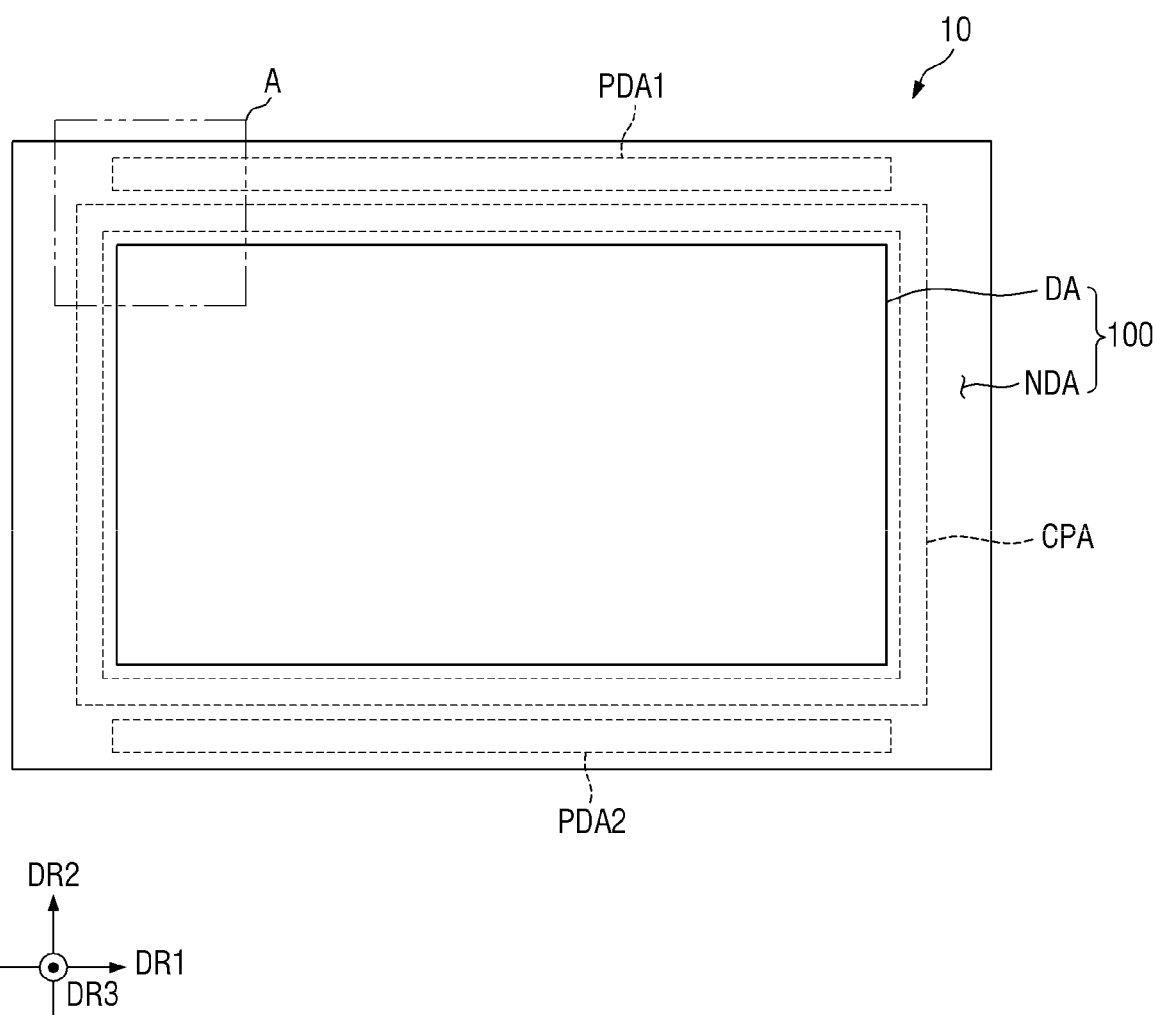
FIG. 1 is a layout diagram showing a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

Each of the features of the various embodiments of the present disclosure may be used singularly or may be combined with each other, in part or in whole, and various suitable interlocking and driving may be possible. Each embodiment may be implemented independently of one another, or may be implemented together in an association.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction DR1, the second direction DR2, and the third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
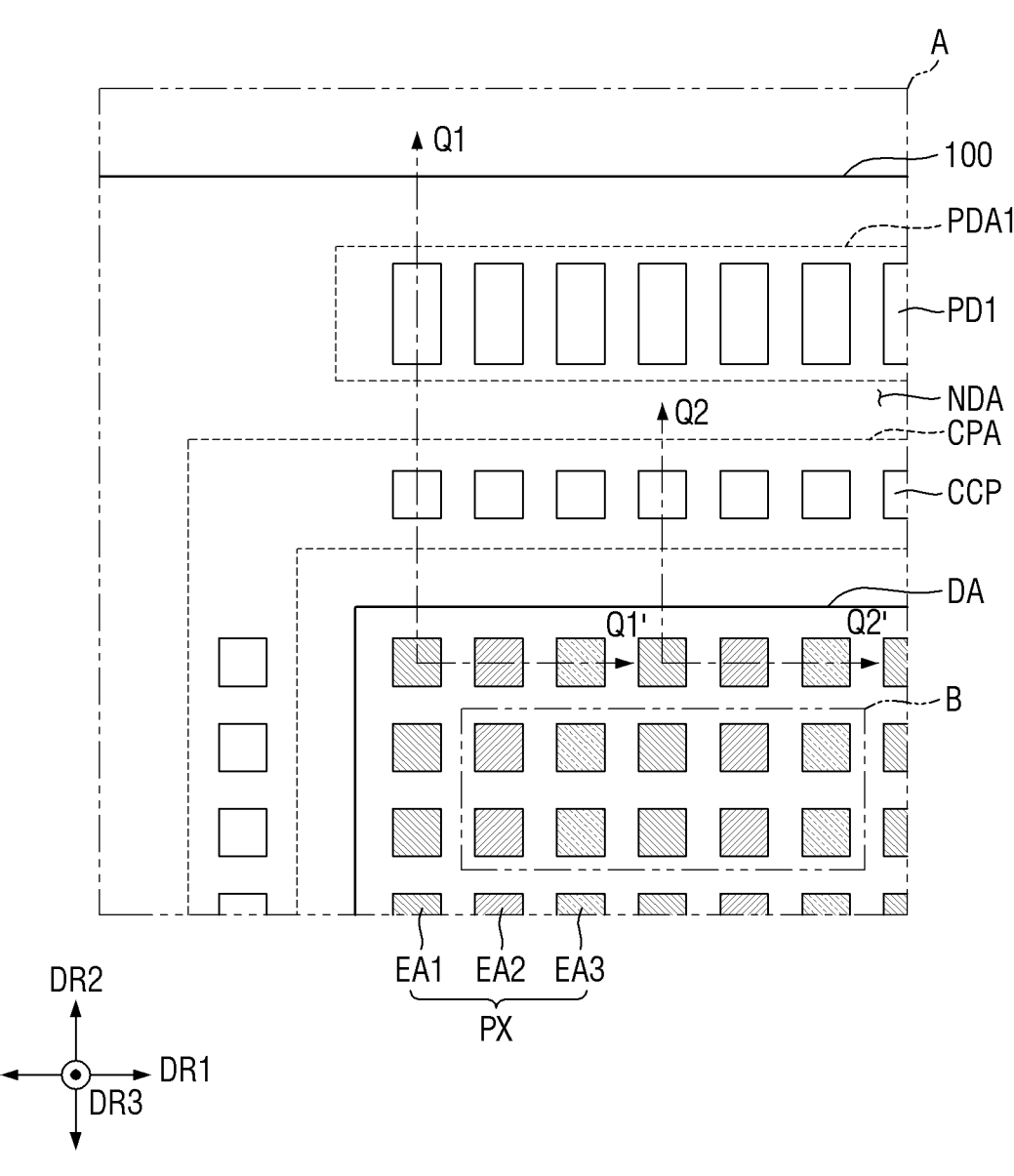
FIG. 2 is an enlarged layout diagram showing the area A of FIG. 1 in more detail.
Figure 3:
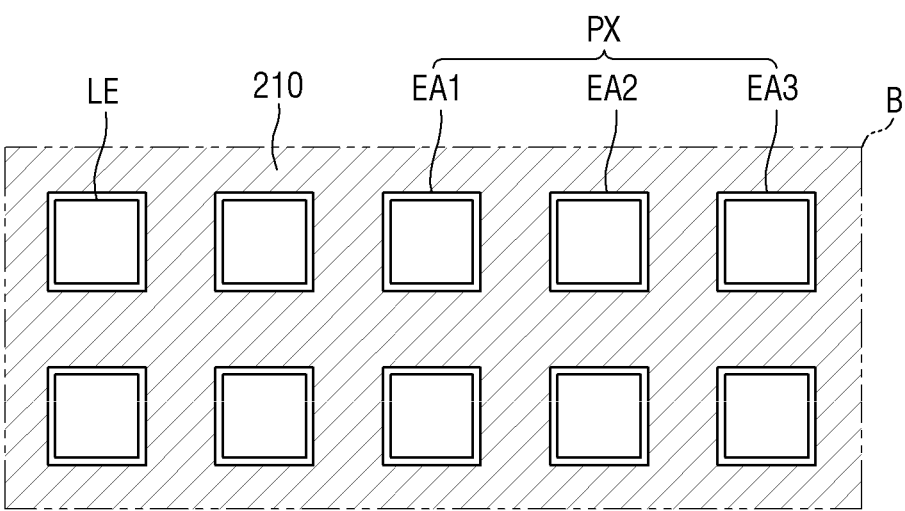
FIG. 3 is a layout diagram showing pixels of a display panel according to an embodiment and is a layout diagram showing the area B of FIG. 2.
Figure 3:
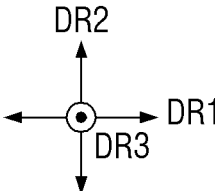

FIG. 1 is a layout diagram showing a display device according to an embodiment. FIG. 2 is an enlarged layout diagram showing the area A of FIG. 1 in more detail. FIG. 3 is a layout diagram showing pixels of a display panel according to an embodiment and is a layout diagram showing the area B of FIG. 2.

Referring to FIG. 1 to FIG. 3, an example in which a display device according to an embodiment is embodied as an ultra-small light-emitting diode display device (or a micro light-emitting diode display device) including an ultra-small light-emitting diode (or a micro light-emitting diode) as a light-emitting element will be described in more detail. However, the present disclosure is not limited thereto.

Referring to FIG. 1 to FIG. 3, an example in which a display device according to an embodiment has a LEDoS (Light Emitting Diode on Silicon) structure in which light-emitting diode elements are disposed on a semiconductor circuit board formed using a semiconductor process will be described in more detail. However, the present disclosure is not limited thereto.

In FIG. 1 to FIG. 3, a first direction DR1 indicates a longitudinal direction or a horizontal direction of a display panel 100, a second direction DR2 indicates a transverse direction or a vertical direction of the display panel 100, and a third direction DR3 indicates a thickness direction of the display panel 100. In this case, the terms "left", "right", "upper", and "lower" indicate directions of the display panel 100 in a plan view (e.g., a view from a direction that is perpendicular to or substantially perpendicular to a relevant surface (e.g., a top surface)). For example, "right" indicates one side in the first direction DR1, "left" indicates an opposite side in the first direction DR1, "upper" indicates one side in the second direction DR2, and "lower" indicates an opposite side in the second direction DR2. Further, "top" refers to one side in the third direction DR3, and "bottom" refers to an opposite side in the third direction DR3.

Referring to FIG. 1 to FIG. 3, a display device 10 according to an embodiment includes the display panel 100. The display panel 100 includes a display area DA and a non-display area NDA.

The display panel 100 may have a rectangular planar shape having a long side extending in the first direction DR1 and a short side extending in the second direction DR2. However, the planar shape of the display panel 100 is not limited thereto, and may have any suitable polygonal shape other than the rectangular shape, a circular shape, an oval shape, or an irregular planar shape.

The display area DA may be an area in which an image is displayed, and the non-display area NDA may be an area in which an image is not displayed. A planar shape of the display area DA may correspond to the planar shape of the display panel 100. FIG. 1 illustrates that the planar shape of the display area DA is a rectangle. The display area DA may be disposed at (e.g., in or on) an inner area of the display panel 100. The non-display area NDA may be disposed around the display area DA. The non-display area NDA may be disposed to surround (e.g., a periphery of) the display area DA.

The display area DA of the display panel 100 may include a plurality of pixels PX. A pixel PX may be defined as a minimum light-emitting unit in which white light is displayed.

Each of the plurality of pixels PX may include a plurality of light-emitting areas EA1, EA2, and EA3. In an embodiment, as shown in FIGS. 2 and 3, each of the plurality of pixels PX may include three light-emitting areas EA1, EA2, and EA3. However, the present disclosure is not limited thereto. For example, each of the plurality of pixels PX may include four or more light-emitting areas.

Each of the plurality of light-emitting areas EA1, EA2, and EA3 may include a light-emitting element LE for emitting first light. The light-emitting element LE has been illustrated to have a rectangular planar shape. However, the present disclosure is not limited thereto. For example, the light-emitting element LE may have any suitable polygonal planar shape other than the rectangular planar shape, a circular planar shape, an oval planar shape, or an irregular planar shape.

Each of first light-emitting areas EA1 refers to an area for emitting the first light. Each of the first light-emitting areas EA1 may emit the first light emitted from the light-emitting element LE as is. The first light may be light of a blue wavelength band. The blue wavelength band may be approximately in a range of 370 nm to 460 nm. However, the present disclosure is not limited thereto.

Each of second light-emitting areas EA2 refers to an area for emitting second light. Each of the second light-emitting areas EA2 may convert the first light emitted from the light-emitting element LE into the second light, and may output the second light. The second light may be light of a green wavelength band. The green wavelength band may be approximately in a range of 480 nm to 560 nm. However, the present disclosure is not limited thereto.

Each of third light-emitting areas EA3 refers to an area for emitting third light. Each of the third light-emitting areas EA3 may convert the first light emitted from the light-emitting element LE into the third light, and may output the third light. The third light may be light of a red wavelength band. The red wavelength band may be approximately in a range of 600 nm to 750 nm. However, the present disclosure is not limited thereto.

The first light-emitting areas EA1, the second light-emitting areas EA2, and the third light-emitting areas EA3 may be alternately arranged with each other along the first direction DR1. For example, the first light-emitting area EA1, the second light-emitting area EA2, and the third light-emitting area EA3 may be arranged in this same order along the first direction DR1.

The first light-emitting areas EA1 may be arranged along the second direction DR2. The second light-emitting areas EA2 may be arranged along the second direction DR2. The third light-emitting areas EA3 may be arranged along the second direction DR2.

Each of the plurality of light-emitting areas EA1, EA2, and EA3 may be defined in a corresponding manner by each of a plurality of grooves GR formed in a base substrate 210. Each of the plurality of grooves GR may surround (e.g., around a periphery of) a corresponding light-emitting element LE in a plan view. Each of the plurality of grooves GR may be spaced apart from each light-emitting element LE. Each of the plurality of grooves GR may have a dot shape.

Although FIG. 2 and FIG. 3 illustrate that each of the plurality of light-emitting areas EA1, EA2, and EA3 defined in a corresponding manner by each of the plurality of grooves GR has a rectangular planar shape, the present disclosure is not limited thereto. For example, each of the plurality of light-emitting areas EA1, EA2, and EA3 defined in a corresponding manner by each of the plurality of grooves GR may have any suitable polygonal planar shape other than the rectangular planar shape, a circular shape, an oval shape, or an irregular planar shape.

The non-display area NDA may include a first pad area PDA1 and a second pad area PDA2.

The first pad area PDA1 may be disposed at (e.g., in or on) the non-display area NDA. The first pad area PDA1 may be disposed at (e.g., in or on) an upper area of the display panel 100. The first pad area PDA1 may include first pads PD1 connected to an external circuit board (e.g., CB of FIG. 4).

The second pad area PDA2 may be disposed at (e.g., in or on) the non-display area NDA. The second pad area PDA2 may be disposed at (e.g., in or on) a lower area of the display panel 100. The second pad area PDA2 may include second pads to be connected to the external circuit board (e.g., CB of FIG. 4). However, the present disclosure is not limited thereto, and the second pad area PDA2 may be omitted as needed or desired.

The non-display area NDA may further include a common electrode connective area CPA surrounding (e.g., around a periphery of) the display area DA.

The common electrode connective area CPA may be disposed at (e.g., in or on) the non-display area NDA. The common electrode connective area CPA may be disposed between the first pad area PDA1 and the display area DA, and between the second pad area PDA2 and the display area DA. Further, the common electrode connective area CPA may be disposed on one side and the opposite side in the first direction DR1 of the display area DA, and disposed on one side and the opposite side in the second direction DR2 of the display area DA. The common electrode connective area CPA may include a plurality of connecting electrodes CCP to be connected to the semiconductor circuit board.

Although FIG. 1 illustrates that the common electrode connective area CPA surrounds (e.g., around a periphery of) an entirety of the display area DA, the present disclosure is not limited thereto. For example, the common electrode connective area CPA may be disposed on only one side, two sides, or at least three sides of the display area DA.

Figure 4:
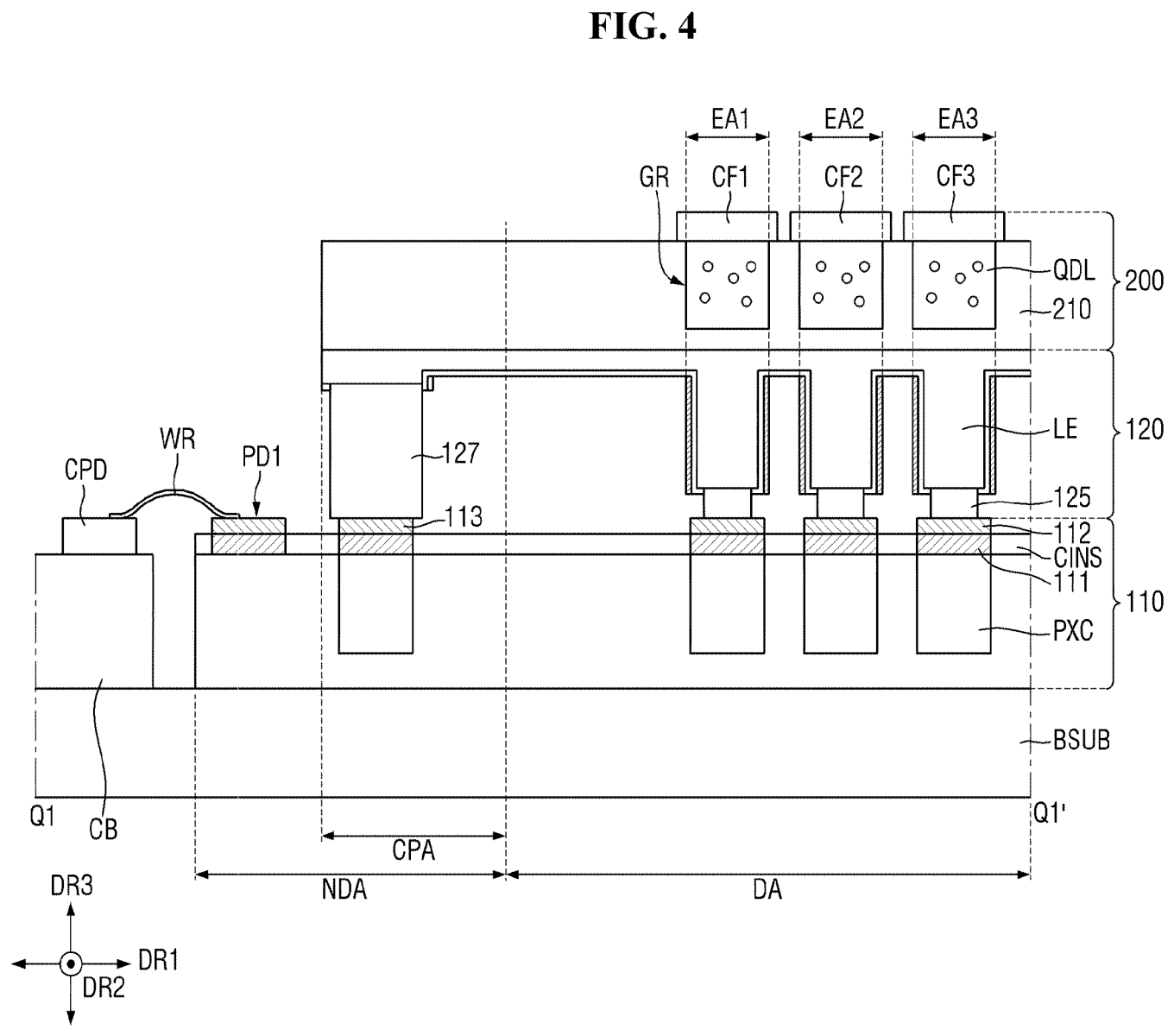
Figure 5:
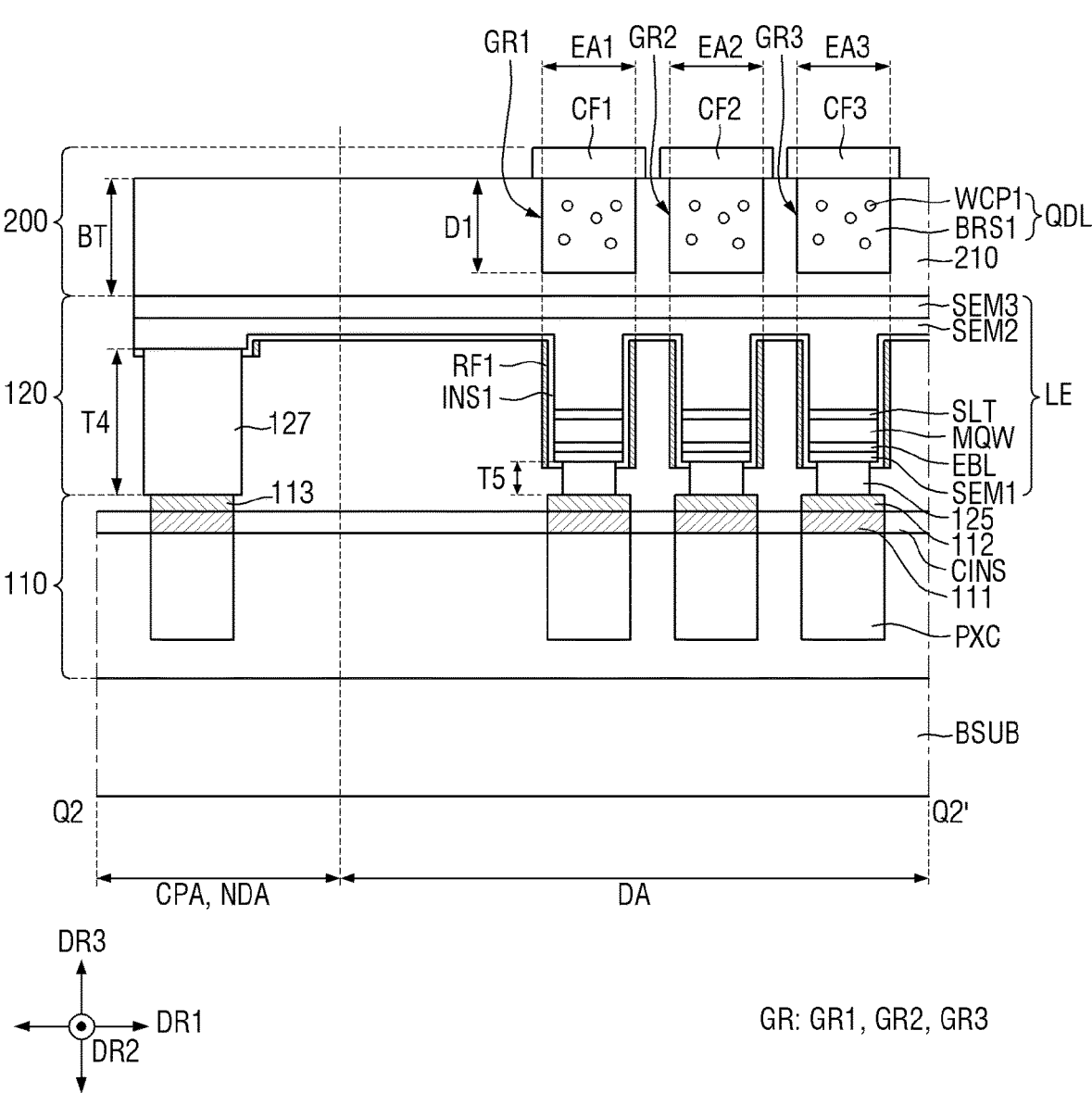
FIG. 5 is a cross-sectional view showing an example of the display panel taken along the line Q2-Q2' in FIG. 2.
Figure 6:
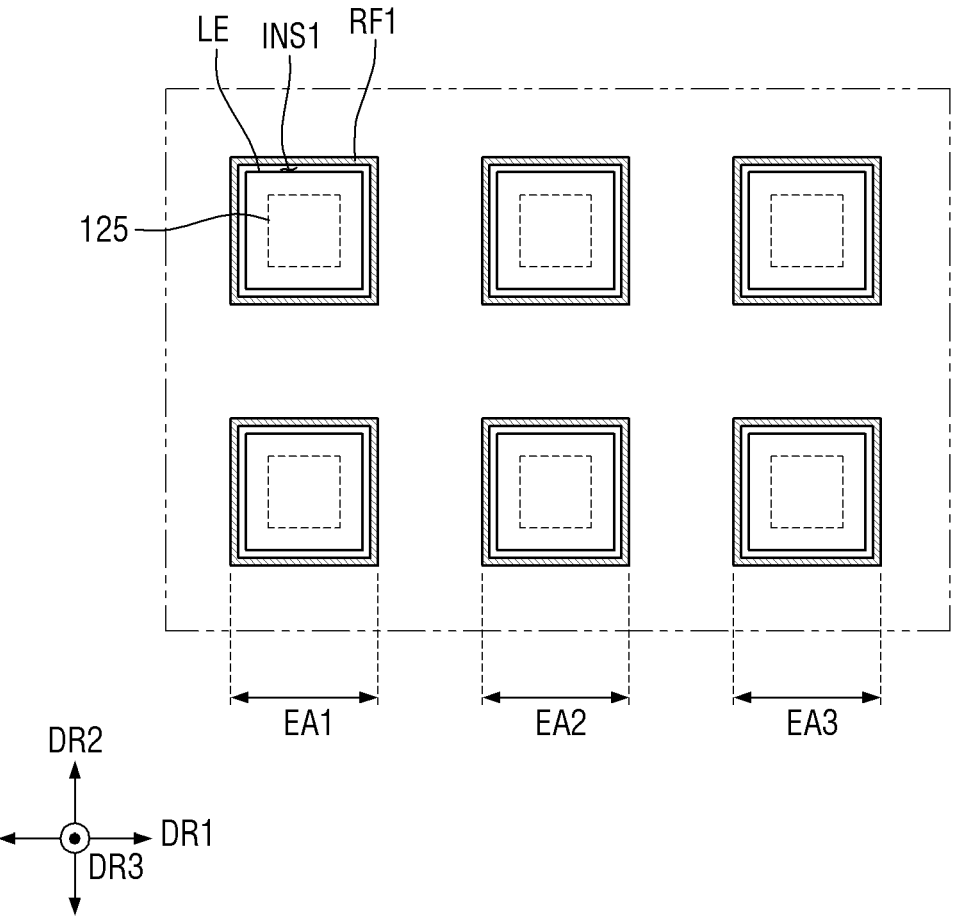
FIG. 6 is a plan view showing an example of a light-emitting element layer of a display panel according to an embodiment.
Figure 7:
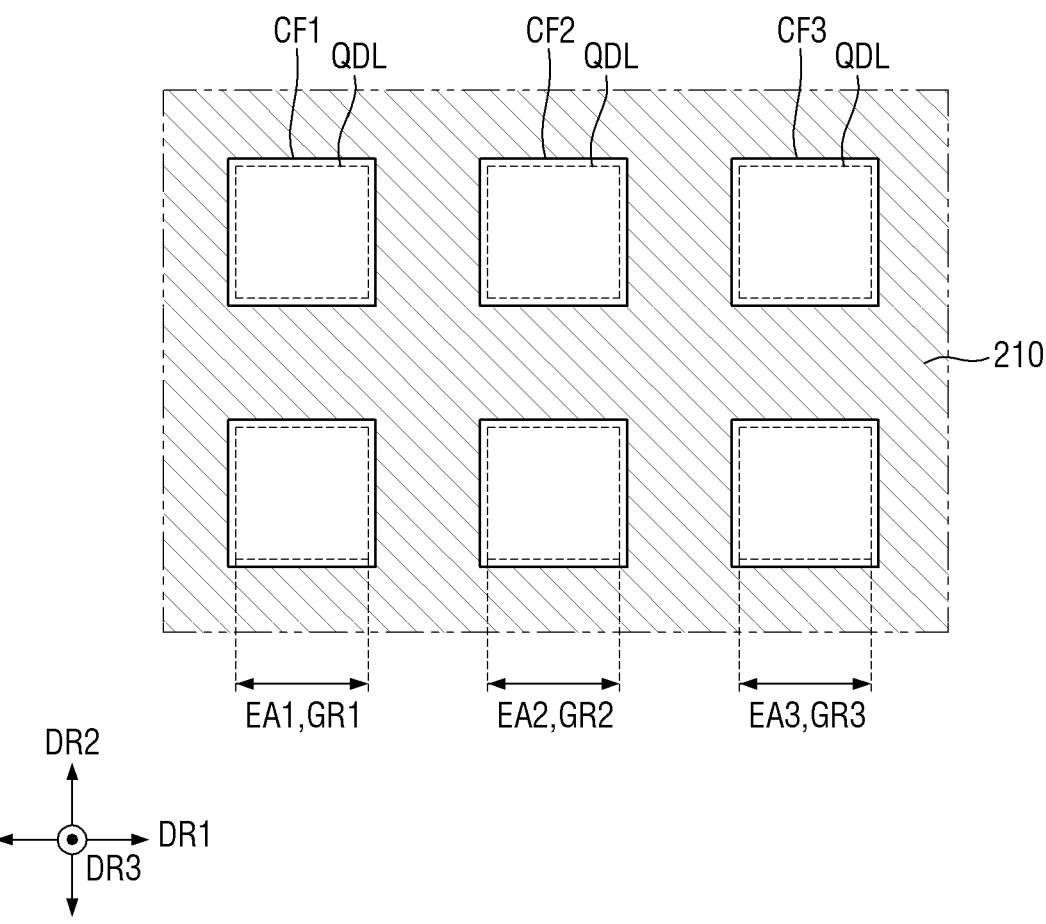
FIG. 7 is a plan view showing an example of a wavelength conversion substrate of a display panel according to an embodiment.
Figure 8:
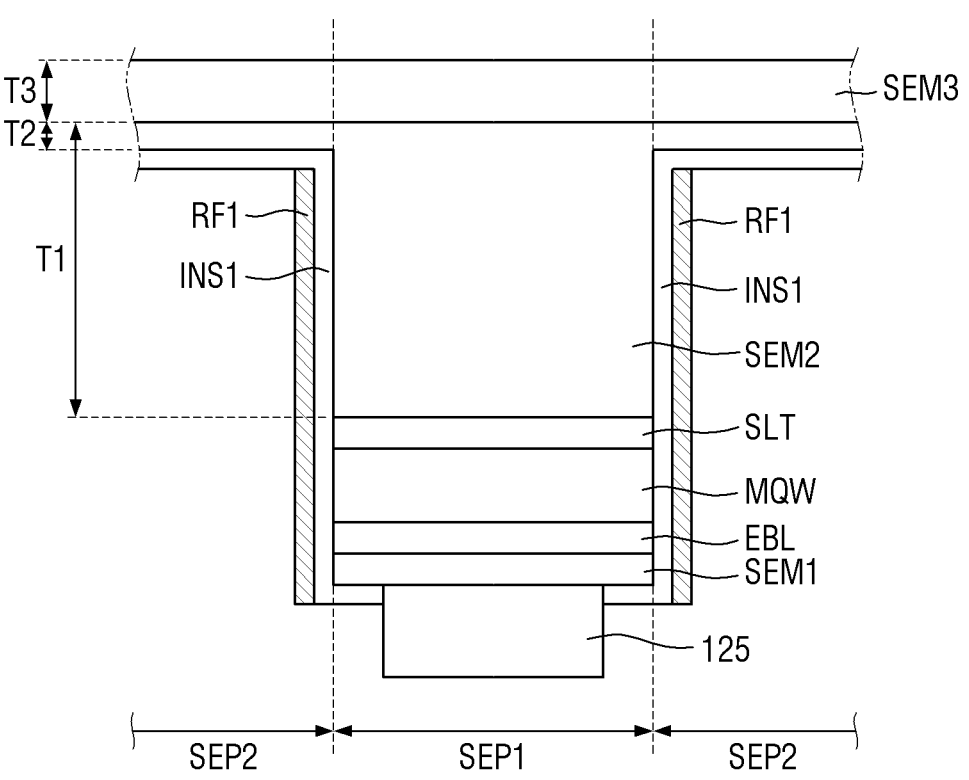
FIG. 8 is a cross-sectional view showing an example of a light-emitting element of a display panel according to an embodiment.
Figure 8:
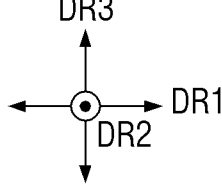

FIG. 4 is a cross-sectional view showing an example of a display panel taken along the line Q1-Q1' in FIG. 2. FIG. 5 is a cross-sectional view showing an example of a display panel taken along the line Q2-Q2' in FIG. 2. FIG. 6 is a plan view showing an example of a light-emitting element layer of a display panel according to an embodiment. FIG. 7 is a plan view showing an example of a wavelength conversion substrate of a display panel according to an embodiment. FIG. 8 is a cross-sectional view showing an example of a light-emitting element of a display panel according to an embodiment.

Referring to FIG. 4 to FIG. 8, the display panel 100 according to an embodiment may include a semiconductor circuit board 110, a light-emitting element layer 120, and a wavelength conversion substrate 200.

The semiconductor circuit board 110 may include a plurality of pixel circuits PXC, pixel electrodes 111, contact electrodes 112, the first pads PD1, a common contact electrode 113, and a circuit insulating layer CINS.

The semiconductor circuit board 110 may be embodied as a silicon wafer substrate formed using a semiconductor process, and may be referred to as a first substrate.

The plurality of pixel circuits PXC of the semiconductor circuit board 110 may be formed using a semiconductor process.

The plurality of pixel circuits PXC may be disposed at (e.g., in or on) the display area DA and the non-display area NDA. Each of the plurality of pixel circuits PXC may be connected to a corresponding pixel electrode 111. In other words, the plurality of pixel circuits PXC and the plurality of pixel electrodes 111 may be connected to each other in a one-to-one correspondence manner. Each of the plurality of pixel circuits PXC may overlap with a corresponding light-emitting element LE in the third direction DR3.

Each of the plurality of pixel circuits PXC may include at least one transistor formed using a semiconductor process. Each of the plurality of pixel circuits PXC may further include at least one capacitor formed using a semiconductor process. Each of the plurality of pixel circuits PXC may include, for example, a CMOS circuit. Each of the plurality of pixel circuits PXC may apply a pixel voltage or an anode voltage to a corresponding pixel electrode 111.

The circuit insulating layer CINS may be disposed on the plurality of pixel circuits PXC.

The circuit insulating layer CINS may protect the plurality of pixel circuits PXC, and may planarize or substantially planarize steps of the plurality of pixel circuits PXC. The circuit insulating layer CINS may expose each of the pixel electrodes 111, so that each of the pixel electrodes 111 may be connected to the light-emitting element layer 120. The circuit insulating layer CINS may include an inorganic insulating material, for example, such as silicon oxide (SiO$_x$), silicon nitride (SiN$_x$), silicon oxynitride (SiO$_x$N$_y$), aluminum oxide (Al$_x$O$_y$), aluminum nitride (AlN), and/or the like.

Each of the plurality of pixel electrodes 111 may be disposed on a corresponding pixel circuit PXC. Each of the pixel electrodes 111 may be exposed toward a corresponding pixel circuit PXC. Each of the pixel electrodes 111 may be integrally formed with a corresponding pixel circuit PXC. Each of the pixel electrodes 111 may receive the pixel voltage or the anode voltage from a corresponding pixel circuit PXC. Each of the pixel electrodes 111 may include a metal material, for example, such as aluminum (Al).

Each of the contact electrodes 112 may be disposed on a corresponding pixel electrode 111. Each of the contact electrodes 112 may include a metal material for bonding a corresponding pixel electrode 111 and a corresponding light-emitting element LE to each other. For example, each of the contact electrodes 112 may include at least one of gold (Au), copper (Cu), aluminum (Al), and tin (Sn). As another example, each of the contact electrodes 112 may include a first layer including one of gold (Au), copper (Cu), aluminum (Al), and tin (Sn), and a second layer including another of gold (Au), copper (Cu), aluminum (Al), and tin (Sn).

The common contact electrode 113 may be disposed at (e.g., in or on) the common electrode connective area CPA of the non-display area NDA. The common contact electrode 113 may surround (e.g., around a periphery of) the display area DA. The common contact electrode 113 may be connected to one of the first pads PD1 of the first pad area PDA1 via a circuit formed at (e.g., in or on) the non-display area NDA, and may receive a common voltage therefrom. The common contact electrode 113 may include (e.g., may be made of) the same material as that of the contact electrode

12

112. In other words, the common contact electrode 113 and the contact electrode 112 may be formed using the same process.

Each of the first pads PD1 may be connected to a corresponding pad electrode CPD of the circuit board CB via a conductive connective member, for example, such as a corresponding wire WR. In other words, the first pads PD1, the wires WR, and the pad electrodes CPDs of the circuit board CB may be connected to each other in an one-to-one manner. The semiconductor circuit board 110 and the circuit board CB may be disposed on a support substrate BSUB. However, the present disclosure is not limited thereto, and the support substrate BSUB may be omitted as needed or desired.

The circuit board CB may be embodied as a flexible film, for example, such as a flexible printed circuit board (FPCB), a rigid printed circuit board (RPCB), a flexible printed circuit (FPC), or a chip on film (COF).

In an example, the second pads of the second pad area PDA2 may have the same or substantially the same structure as those of the first pads PD1 described in conjunction with FIGS. 4 and 5. Accordingly, redundant description thereof may not be repeated.

The light-emitting element layer 120 may include light-emitting elements LE, a first insulating layer INS1, a connecting electrode 125, a common connecting electrode 127, and a first reflective layer RF1.

The light-emitting element layer 120 may include the light-emitting elements LE corresponding to the first light-emitting area EA1, the second light-emitting area EA2, and the third light-emitting area EA3, respectively, defined in a corresponding manner to each of the plurality of grooves GR defined in the base substrate 210. Each light-emitting element LE may be disposed at (e.g., in or on) a corresponding one of the first light-emitting area EA1, the second light-emitting area EA2, and the third light-emitting area EA3.

Each light-emitting element LE may be disposed on a corresponding contact electrode 112 at (e.g., in or on) a corresponding one of the first light-emitting area EA1, the second light-emitting area EA2, and the third light-emitting area EA3. The light-emitting element LE may be embodied as a vertical light-emitting diode element extending in the third direction DR3. In other words, a length in the third direction DR3 of the light-emitting element LE may be larger than a length (e.g., a width) in a horizontal direction thereof. The length (e.g., the width) in the horizontal direction indicates a length (e.g., a width) in the first direction DR1, or a length (e.g., a width) in the second direction DR2. For example, the length in the third direction DR3 of the light-emitting element LE may be approximately in a range of 1 to 5 μm.

The light-emitting element LE may be embodied as a micro light-emitting diode element. The light-emitting element LE may include the connecting electrode 125, a first semiconductor layer SEM1, an electron blocking layer EBL, an active layer MQW, a superlattice layer SLT, a second semiconductor layer SEM2, and a third semiconductor layer SEM3, which are arranged (e.g., stacked) along the third direction DR3 as shown in FIG. 8. The connecting electrode 125, the first semiconductor layer SEM1, the electron blocking layer EBL, the active layer MQW, the superlattice layer SLT, the second semiconductor layer SEM2, and the third semiconductor layer SEM3 may be sequentially stacked along the third direction DR3.

As shown in FIG. 8, the light-emitting element LE may have a cylindrical shape, a disk-shape, or a rod-shape, in which a height (e.g., in the third direction DR3) is larger than a width (e.g., in the horizontal direction DR1 or DR2) thereof. However, the present disclosure is not limited thereto. For example, the light-emitting element LE may have various suitable shapes including a shape of a rod, a wire, a tube, and/or the like, a shape of a cube, a cuboid, a polygonal prism, for example, such as a hexagonal prism, or a shape extending in one direction and having a partially inclined outer face.

Each connecting electrode 125 may be disposed on a corresponding contact electrode 112. Each connecting electrode 125 may adhere to a corresponding contact electrode 112, and thus, may serve to apply a light emission signal to a corresponding light-emitting element LE. The connecting electrode 125 may be embodied as an ohmic connecting electrode. However, the present disclosure is not limited thereto. For example, the connecting electrode 125 may be embodied as a Schottky connecting electrode. The light-emitting element LE may include at least one connecting electrode 125. FIG. 8 shows that the light-emitting element LE includes one connecting electrode 125. However, the present disclosure is not limited thereto. For example, in some embodiments, the light-emitting element LE may include a larger number of connecting electrodes 125, or the connecting electrode 125 may be omitted as needed or desired. The light-emitting element LE will be described in more detail below, and such description may be applied equally or substantially equally to a case where the number of connecting electrodes 125 varies, or a case where the light-emitting element LE further includes another suitable component.

In the display device 10 according to an embodiment, the connecting electrode 125 may reduce a resistance between the light-emitting element LE and the contact electrode 112 when the light-emitting element LE is electrically connected to the contact electrode 112. The connecting electrode 125 may include a conductive metal. For example, the connecting electrode 125 may include at least one of gold (Au), copper (Cu), tin (Sn), titanium (Ti), aluminum (Al), and silver (Ag). For example, the connecting electrode 125 may include 9:1 alloy, 8:2 alloy, or 7:3 alloy of gold and tin, or an alloy (e.g., SAC305) of copper, silver and tin.

The first semiconductor layer SEM1 may be disposed on the connecting electrode 125. The first semiconductor layer SEM1 may be a p-type semiconductor, and may include a semiconductor material of a chemical formula $Al_xGa_yIn_{1-x-y}N$ ($0\leq x\leq 1$, $0\leq y\leq 1$, $0\leq x+y1$). For example, the first semiconductor layer SEM1 may include (e.g., may be made of) at least one of AlGaInN, GaN, AlGaN, InGaN, AlN, or InN, which may be doped with p-type dopants. The first semiconductor layer SEM1 may be doped with a p-type dopant. The p-type dopant may include (e.g., may be) Mg, Zn, Ca, Ba, or the like. For example, the first semiconductor layer SEM1 may include (e.g., may be made of) p-GaN doped with a p-type Mg. A thickness of the first semiconductor layer SEM1 may be in a range of 30 nm to 200 nm, but the present disclosure is not limited thereto.

The electron blocking layer EBL may be disposed on the first semiconductor layer SEM1. The electron blocking layer EBL may function to inhibit or prevent excessive electrons from flowing into the active layer MQW. For example, the electron blocking layer EBL may include (e.g., may be made of) p-AlGaN doped with a p-type Mg. A thickness of the electron blocking layer EBL may be in a range of 10 nm to 50 nm, but the present disclosure is not limited thereto. In some embodiments, the electron blocking layer EBL may be omitted as needed or desired.

The active layer MQW may be disposed on the electron blocking layer EBL. The active layer MQW may emit light via combinations between electrons and holes using an electric signal applied through the first semiconductor layer SEM1 and the second semiconductor layer SEM2. The active layer MQW may emit the first light having a central wavelength band in a range of 450 nm to 495 nm, or in other words, light in a blue wavelength band.

The active layer MQW may include a material having a single or multi-quantum well structure. When the active layer MQW includes a material having a multi-quantum well structure, a plurality of well layers and a plurality of barrier layers may be alternately stacked one on top of another. In this connection structure, the well layer may include (e.g., may be made of) InGaN, and the barrier layer may include (e.g., may be made of) GaN or AlGaN. However, the present disclosure is not limited thereto. A thickness of the well layer may be approximately in a range of 1 nm to 4 nm, and a thickness of the barrier layer may be in a range of 3 nm to 10 nm.

As another example, the active layer MQW may have a structure in which a semiconductor material having large bandgap energy and a semiconductor material having small bandgap energy are alternately stacked one on top of another. The active layer MQW may include groups III to V semiconductor materials depending on a wavelength band of light emitting therefrom. The light emitted from the active layer MQW is not limited to the first light (e.g., having the blue wavelength band). In some embodiments, the light emitted from the active layer MQ may be the second light (e.g., having the green wavelength band) or the third light (e.g., having the red wavelength band).

The superlattice layer SLT may be disposed on the active layer MQW. The superlattice layer SLT may function to relieve stress between the second semiconductor layer SEM2 and the active layer MQW. For example, the superlattice layer SLT may include (e.g., may be made of) InGaN or GaN. A thickness of the superlattice layer SLT may be approximately in a range of 50 nm to 200 nm. However, the present disclosure is not limited thereto, and the superlattice layer SLT may be omitted as needed or desired.

The second semiconductor layer SEM2 may be disposed on the superlattice layer SLT. The second semiconductor layer SEM2 may be embodied as an n-type semiconductor. The second semiconductor layer SEM2 may include a semiconductor material having a chemical formula $Al_xGa_yIn_{1-x-y}N$ ($0\leq x\leq 1$, $0\leq y\leq 1$, $0\leq x+y\leq 1$). For example, the second semiconductor layer SEM2 may include (e.g., may be made of) at least one of AlGaInN, GaN, AlGaN, InGaN, AlN, or InN, which may be doped with n-type dopants. The second semiconductor layer SEM2 may be doped with an n-type dopant. The n-type dopant may include (e.g., may be) Si, Ge, Se, Sn, or the like. For example, the second semiconductor layer SEM2 may include (e.g., may be made of) n-GaN doped with an n-type Si. A thickness of the second semiconductor layer SEM2 may be in a range of 2 μm to 4 μm, but the present disclosure is not limited thereto.

As shown in FIG. 5, the second semiconductor layer SEM2 may act as a common layer commonly included in the plurality of light-emitting elements LE. The second semiconductor layer SEM2 may be patterned, such that a vertical portion of the second semiconductor layer SEM2 extending in the third direction DR3 is included in each light-emitting element LE, while a horizontal portion of the second semiconductor layer SEM2 extending (e.g., continuously extending) in the first direction DR1 is common to the plurality of light-emitting elements LE. The second semiconductor layer SEM2 may allow a common voltage applied through the common contact electrode 113 to be commonly applied to the plurality of light-emitting elements LE.

The third semiconductor layer SEM3, which will be described in more detail below, may act as a common layer, similar to that of the second semiconductor layer SEM2. However, the third semiconductor layer SEM3 may not have conductivity, and thus, a signal may be applied through the conductive second semiconductor layer SEM2. Each of the second semiconductor layer SEM2 and the third semiconductor layer SEM3 may extend from the display area DA to the non-display area NDA. A thickness T1 of an area (e.g., an overlapping area) of the second semiconductor layer SEM2 overlapping with the first semiconductor layer SEM1 of the light-emitting element LE may be greater than a thickness T2 of an area (e.g., a non-overlapping area) of the second semiconductor layer SEM2 that does not overlap with the first semiconductor layer SEM1 (e.g., see FIG. 8).

The third semiconductor layer SEM3 may be disposed on the second semiconductor layer SEM2. The third semiconductor layer SEM3 may include an undoped semiconductor. The third semiconductor layer SEM3 may include a material that is the same or substantially the same as that of the second semiconductor SEM2, but the material may be undoped with the n-type or the p-type dopant. In an embodiment, the third semiconductor layer SEM3 may include at least one of InAlGaN, GaN, AlGaN, InGaN, AlN, or InN, which may be undoped. However, the present disclosure is not limited thereto.

The third semiconductor layer SEM3 may act as a common layer commonly included in the plurality of light-emitting elements LE. The third semiconductor layer SEM3 may extend (e.g., may continuously extend) in the first direction DR1, and may be commonly included in the plurality of light-emitting elements LE. The third semiconductor layer SEM3 may serve as a base layer of the plurality of light-emitting elements LE. In a manufacturing process of the light-emitting element layer 120 as described in more detail below, the constituent layers of the light-emitting element LE may be manufactured on the third semiconductor layer SEM3. Thus, the third semiconductor layer SEM3 may act as the base layer. A thickness T3 of the third semiconductor layer SEM3 may be smaller than the thickness T1 of a first semiconductor area SEP1 of the second semiconductor layer SEM2, and may be greater than the thickness T2 of a second semiconductor area SEP2 of the second semiconductor layer SEM2.

In an example, the common connecting electrode 127 may be disposed at (e.g., in or on) the common electrode connective area CPA of the non-display area NDA. The common connecting electrode 127 may be disposed on one face (e.g., on one surface) of the second semiconductor layer SEM2. The common connecting electrode 127 may serve to transmit a common voltage signal from the common contact electrode 113 to the light-emitting elements LE. The common connecting electrode 127 may include (e.g., may be made of) the same material as that of the connecting electrodes 125. In order for the common connecting electrode 127 to be connected to the common contact electrode 113, a thickness T4 in the third direction DR3 of the common connecting electrode 127 may be large. The thickness T4 of the common connecting electrode 127 may be greater than a thickness T5 of each of the connecting electrodes 125.

Each of the above-described light-emitting elements LE may receive the pixel voltage or the anode voltage of the pixel electrode 111 through a corresponding connecting electrode 125, and may receive the common voltage through the second semiconductor layer SEM2. The light-emitting element LE may emit light having a desired luminance level (e.g., a predefined luminance level) according to a voltage difference between the pixel voltage and the common voltage.

The first insulating layer INS1 may be disposed on a side face (e.g., a side surface) of the common connecting electrode 127, a side face (e.g., a side surface) and a bottom face (e.g., a bottom surface) of the second semiconductor layer SEM2, a side face (e.g., a side surface) of each of the light-emitting elements LE, and a side face (e.g., a side surface) of the connecting electrode 125. The first insulating layer INS1 may insulate the common connecting electrode 127, the second semiconductor layer SEM2, the light-emitting elements LE, and the connecting electrode 125 from other layers.

As shown in FIG. 6, the first insulating layer INS1 may be disposed to surround (e.g., around a periphery of) each of the light-emitting elements LE. The first insulating layer INS1 may include an inorganic insulating material, for example, such as silicon oxide ($SiO_x$), silicon nitride ($SiN_x$), silicon oxynitride ($SiO_xN_y$), aluminum oxide ($Al_xO_y$), aluminum nitride (AlN), or the like. A thickness of the first insulating layer INS1 may be approximately 0.1 μm. However, the present disclosure is not limited thereto.

The first reflective layer RF1 may reflect light beams that are emitted from the light-emitting element LE and traveling in a lateral direction instead of toward a top of the display panel. The first reflective layer RF1 may be disposed at (e.g., in or on) the display area DA and the non-display area NDA. The first reflective layer RF1 may overlap with each of the first light-emitting area EA1, the second light-emitting area EA2, and the third light-emitting area EA3 at (e.g., in or on) the display area DA.

The first reflective layer RF1 (e.g., portions thereof) may be disposed on the side faces (e.g., the side surfaces) of the common connecting electrode 127, the side faces (e.g., the side surfaces) of the connecting electrodes 125, and the side faces (e.g., the side surfaces) of each of the light-emitting elements LE. The first reflective layer RF1 may be disposed directly on the first insulating layer INS1. In this connection structure, the first reflective layer RF1 may be disposed directly on the side face (e.g., the side surface) of the first insulating layer INS1. The first reflective layer RF1 may be spaced apart from the common connecting electrode 127, the connecting electrode 125, and the light-emitting elements LE.

As shown in FIG. 6, each first reflective layer RF1 (e.g., each portion of the first reflective layer RF1) may be disposed to surround (e.g., around a periphery of) a corresponding one of the light-emitting elements LE at (e.g., in or on) the display area DA. Each of the light-emitting elements LE may be surrounded (e.g., around a periphery thereof) by the first insulating layer INS1, while the first insulating layer INS1 may be surrounded (e.g., around a periphery thereof) by the first reflective layer RF1 (e.g., a portion of the first reflective layer RF1). The first reflective layers (e.g., the portions of the first reflective layer) RF1 surrounding the light-emitting elements LE, respectively, may be spaced apart from each other. In this connection structure, each first reflective layer (e.g., each first reflective layer portion) RF1 of interest surrounding (e.g., around a periphery of) a corresponding light-emitting element LE of interest may be spaced apart from an adjacent first reflective layer (e.g., an adjacent portion of the first reflective layer) RF1 surrounding (e.g., around a periphery of) an adjacent light-emitting element LE. In other words, the first reflective layers (e.g., the portions of the first reflective layer) RF1 may be arranged to be spaced apart from each other in the first direction DR1 and the second direction DR2. Although a planar shape of each of the first reflective layer RF1 and the first insulating layer INS1 is shown as a rectangular closed loop shape in the figures, the present disclosure is not limited thereto. The planar shape of each of the first reflective layer RF1 and the first insulating layer INS1 may have various suitable shapes depending on a planar shape of the light-emitting element LE.

The first reflective layer RF1 may include a highly reflective metal material, for example, such as aluminum (Al). A thickness of the first reflective layer RF1 may be approximately 0.1 μm. However, the present disclosure is not limited thereto.

In an example, the wavelength conversion substrate 200 may be disposed on the light-emitting element layer 120. The wavelength conversion substrate 200 may include the base substrate 210, the plurality of grooves GR, a wavelength conversion layer QDL, and color filters CF1, CF2, and CF3.

The base substrate 210 may act as a second substrate facing the semiconductor circuit board 110 as the first substrate. The base substrate 210 may act as a topmost layer of the wavelength conversion substrate 200, and may support other components of the wavelength conversion substrate 200. The base substrate 210 may face toward the semiconductor circuit board 110. The base substrate 210 may include a transparent substrate, for example, such as a sapphire substrate ($Al_2O_3$), a glass substrate, or the like. However, the present disclosure is not limited thereto. The base substrate 210 may include a conductive substrate including (e.g., made of) GaN, SiC, ZnO, Si, GaP, or GaAs. Hereinafter, an example in which the base substrate 210 is embodied as the sapphire substrate ($Al_2O_3$) or the silicon substrate (Si) will be described in more detail. However, the present disclosure is not limited thereto. A thickness of the base substrate 210 is not particularly limited. However, in one example, a thickness of the base substrate 210 may be in a range of 400 μm to 1500 μm.

The plurality of grooves GR (e.g., GR1, GR2, and GR3) may be defined in one face (e.g., one surface) of the base substrate 210. As shown in FIGS. 5 and 7, the plurality of grooves GR may define and distinguish the first light-emitting area EA1, the second light-emitting area EA2, and the third light-emitting area EA3 from each other. The plurality of grooves GR may be arranged and spaced apart from each other, and may be formed in a dot-shaped pattern over an entirety or substantially an entirety of the display area DA. Further, the plurality of grooves GR may overlap with the display area DA, and may not overlap with the non-display area NDA.

The plurality of grooves GR may serve to define the light-emitting areas EA1, EA2, and EA3, and may provide a space in which the wavelength conversion layer QDL, which will be described in more detail below, is disposed. Thus, a depth D1 of each of the plurality of grooves GR may have a suitable value (e.g., a predefined value). For example, the depth D1 of each of the plurality of grooves GR may be in a range of 1 μm to 10 μm.

Further, the depth D1 of each of the plurality of grooves GR may be smaller than a thickness BT of the base substrate 210. The depth D1 of each of the plurality of grooves GR may be in a range of 50% to 90% of the thickness BT of the base substrate 210. In this connection structure, when the depth D1 of each of the plurality of grooves GR is 50% or greater of the thickness BT of the base substrate 210, an amount of the wavelength conversion layer QDL disposed in each of the plurality of grooves GR may be increased, so that the wavelength conversion efficiency may be improved. Further, when the depth D1 of each of the plurality of grooves GR is 90% or smaller of the thickness BT of the base substrate 210, the base substrate 210 may be prevented or substantially prevented from being damaged due to a reduction in a supporting force of the base substrate 210. The plurality of grooves GR may have the same or substantially the same depth D1 as each other. However, the present disclosure is not limited thereto. For example, in some embodiments, the plurality of grooves GR may have different depths from each other, or at least one of the plurality of grooves GR may have a different depth from those of the others.

The plurality of grooves GR may include a first groove GR1 overlapping with (or defining) the first light-emitting area EA1, a second groove GR2 overlapping with (or defining) the second light-emitting area EA2, and a third groove GR3 overlapping with (or defining) the third light-emitting area EA3. In this connection structure, the plurality of grooves GR may correspond to the plurality of light-emitting areas EA1, EA2, and EA3, respectively. In other words, the first groove GR1 may correspond to the first light-emitting area EA1, the second groove GR2 may correspond to the second light-emitting area EA2, and the third groove GR3 may correspond to the third light-emitting area EA3.

As described above, the plurality of grooves GR may be defined in the base substrate 210. The base substrate 210 may include, for example, sapphire or silicon. The base substrate 210 including sapphire or silicon may be etched using a deep reactive ion etching (DRIE) method, such that the grooves GR have a high aspect ratio. Thus, the plurality of grooves GR having the high aspect ratio may be formed (e.g., may be easily formed). Accordingly, the plurality of grooves GR may realize ultra-high resolution light-emitting areas EA1, EA2, and EA3. Thus, an ultra-high resolution display device 10 may be manufactured.

The wavelength conversion layer QDL may be disposed in each of the plurality of grooves GR. The wavelength conversion layer QDL may convert or shift a peak wavelength of incident light thereto to a desired peak wavelength (e.g., a predetermined or specific peak wavelength) that is different from that of the incident light, and may output light having the desired peak wavelength (e.g., the predetermined or specific peak wavelength). The wavelength conversion layer QDL may convert a portion of the first light having the blue color emitted from the light-emitting element LE into a fourth light having a yellow color. The wavelength conversion layer QDL may mix the first light and the fourth light with each other, and may emit fifth light having a white color. The fifth light may be converted to the first light through the first color filter CF1. The fifth light may be converted to the second light through the second color filter CF2. The fifth light may be converted to the third light through the third color filter CF3.

The wavelength conversion layer QDL (e.g., portions of the wavelength conversion layer QDL) may be disposed in each of the plurality of grooves GR. The wavelength conversion layers QDL (e.g., portions of the wavelength conversion layer QDL) may be arranged and spaced apart from each other. In other words, each of the wavelength conversion layers QDL (e.g., each portion of the wavelength conversion layer QDL) may be formed in a dot-shaped island pattern. For example, the wavelength conversion layer QDL (e.g., portions thereof) may be disposed in each of the first groove GR1, the second groove GR2, and the third groove GR3, and may correspond thereto in an one-to-one manner. Further, each wavelength conversion layer QDL (e.g., each portion thereof) may overlap with a corresponding one of the first light-emitting area EA1, the second light-emitting area EA2, and the third light-emitting area EA3. In an embodiment, each of the wavelength conversion layers QDL (e.g., each portion thereof) may overlap with an entirety or substantially an entirety of a corresponding one of the first light-emitting area EA1, the second light-emitting area EA2, and the third light-emitting area EA3.

The wavelength conversion layer QDL may include a first base resin BRS1, and first wavelength conversion particles WCP1. The first base resin BRS1 may include a light-transmissive organic material. For example, the first base resin BRS1 may include an epoxy-based resin, an acrylic-based resin, a cardo-based resin, or an imide-based resin.

The first wavelength conversion particles WCP1 may convert the first light incident thereto emitted from the light-emitting element LE to the fourth light. For example, the first wavelength conversion particles WCP1 may convert light having the blue wavelength band into light having the yellow wavelength band. The first wavelength conversion particles WCP1 may include a quantum dot (QD), a quantum rod, a fluorescent material, or a phosphorescent material. For example, a quantum dot may refer to a particulate material that emits light of a predetermined or specific color as electrons transition from a conduction band to a valence band.

The quantum dot may include (e.g., may be made of) a semiconductor nanocrystal material. The quantum dot may have a predetermined or specific bandgap based on a composition and a size thereof, to absorb light and then emit light having a unique wavelength. Examples of the semiconductor nanocrystal material of the quantum dot may include a group IV compound nanocrystal, a group II-VI compound nanocrystal, a group III-V compound nanocrystal, a group IV-VI compound nanocrystal, or suitable combinations thereof.

A group II-VI compound may be selected from a group consisting of a binary compound selected from a group consisting of CdSe, CdTe, ZnS, ZnSe, ZnTe, ZnO, HgS, HgSe, HgTe, MgSe, MgS, and mixtures thereof; a ternary compound selected from a group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures of thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures of thereof.

The group III-V compound may be selected from a group consisting of a binary compound selected from a group consisting of GaN, GaP, GaAs, GaSb, AlN, AlP, AlAs, AlSb, InN, InP, InAs, InSb, and mixtures thereof; a ternary compound selected from a group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and mixtures thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected from a group consisting of a binary compound selected from a group consisting of SnS, SnSe, SnTe, PbS, PbSe, PbTe, and mixtures thereof; a ternary compound selected from a group consisting of SnSeS, SnSeTe, SnSTe, PbSeS, PbSeTe, PbSTe, SnPbS, SnPbSe, SnPbTe, and mixtures thereof; and a quaternary compound selected from a group consisting of SnPbSSe, SnPbSeTe, SnPbSTe, and mixtures thereof. The IV group element may be selected from a group consisting of Si, Ge, and mixtures thereof. The IV group compound may be a binary compound selected from a group consisting of SiC, SiGe, and mixtures thereof.

In this connection structure, the binary compound, the ternary compound, or the quaternary compound may be contained at a uniform or substantially uniform concentration and in the particle. As another example, the binary compound, the ternary compound, and/or the quaternary compound may be contained at the same or substantially the same concentration and in the particle. As another example, the binary compound, the ternary compound, or the quaternary compound may be contained at a concentration gradient manner and in the particle. As another example, the binary compound, the ternary compound, and/or the quaternary compound may be contained at the same or substantially the same concentration and in the same particle. Further, the first wavelength conversion particle may have a core/shell structure in which one quantum dot surrounds (e.g., around a periphery of) another quantum dot. An interface between the core and the shell may have a concentration gradient in which a concentration of an element present in the shell decreases as it goes toward a center.

In an embodiment, the quantum dot may have a core-shell structure including a core including the aforementioned nanocrystal, and a shell surrounding (e.g., around a periphery of) the core. The shell of the quantum dot may serve as a protective layer to prevent or substantially prevent chemical denaturation of the core to maintain or substantially maintain semiconductor characteristics thereof, and/or as a charging layer to impart electrophoresis ability to the quantum dot. The shell may be composed of a single layer or multiple layers. Examples of the shell of the quantum dot may include an oxide of a metal or a non-metal, a semiconductor compound, or a combination thereof.

For example, the oxide of the metal or the non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound, such as $MgAl_2O_4$, $CoFe_2O_4$, $NiFe_2O_4$, and/or $CoMn_2O_4$. However, the present disclosure is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like. However, the present disclosure is not limited thereto.

The wavelength conversion layer QDL may further include a scattering material to scatter the light emitted from the light-emitting element LE in random directions. The scattering material may have a refractive index different from that of the first base resin BRS1, such that an optical interface may be formed between the scattering material and the first base resin BRS1. For example, the scattering material may be embodied as light scattering particles. However, the scattering material is not particularly limited, as long as the scattering material is capable of scattering at least a portion of the light transmitting therethrough. For example, the scattering material may be embodied as metal oxide particles or organic particles. The metal oxide particles may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particles may include (e.g., may be made of) an acrylic-based resin or an urethane-based resin. The scattering material may scatter the incident light in a random direction regardless of an incidence direction of the incident light thereto, while not converting or not substantially converting the wavelength of the incident light.

As the thickness of the wavelength conversion layer QDL is increased in the third direction DR3, a content (e.g., an amount) of the first wavelength conversion particles WCP1 included in the wavelength conversion layer QDL may be increased. Thus, the optical conversion efficiency of the wavelength conversion layer QDL may be improved. Therefore, the thickness of the wavelength conversion layer QDL may be determined (e.g., may be controlled) in consideration of the optical conversion efficiency (e.g., the desired optical conversion efficiency) of the wavelength conversion layer QDL.

The wavelength conversion layer QDL of the wavelength conversion substrate 200 according to one or more embodiments described above may convert a portion of the first light emitted from the light-emitting element LE into the fourth light. The wavelength conversion layer QDL may mix the first light and the fourth light with each other, and may emit the fifth light having the white color. The first color filter CF1, which will be described in more detail below, may transmit therethrough the first light (e.g., only the first light) from the fifth light emitted from the wavelength conversion layer QDL. The second color filter CF2, which will be described in more detail below, may transmit therethrough the second light (e.g., only the second light) from the fifth light emitted from the wavelength conversion layer QDL. The third color filter CF3, which will be described in more detail below, may transmit therethrough the third light (e.g., only the third light) from the fifth light emitted from the wavelength conversion layer QDL. Thus, the light emitted from the wavelength conversion substrate 200 may be composed of the blue light beam as the first light, the red light beam as the second light, and the green light beam as the third light. According, a full color display may be realized.

The plurality of color filters CF1, CF2, and CF3 may be disposed on the base substrate 210. The plurality of color filters CF1, CF2, and CF3 may be disposed on the base substrate 210, and may overlap with the plurality of grooves GR and the plurality of the wavelength conversion layers QDL, respectively. The plurality of color filters CF1, CF2, and CF3 may include the first color filter CF1, the second color filter CF2, and the third color filter CF3.

The first color filter CF1 may overlap with the first light-emitting area EA1. Further, the first color filter CF1 may be disposed on the first groove GR1 of the base substrate 210, and may overlap with the first groove GR1. The first color filter CF1 may transmit the first light emitted from the light-emitting element LE therethrough, and may absorb or block the second light and the third light. For example, the first color filter CF1 may transmit light of the blue wavelength band therethrough, and may absorb or block light beams of other wavelength bands such as the green and red wavelength bands.

The second color filter CF2 may overlap with the second light-emitting area EA2. Further, the second color filter CF2 may be disposed on the second groove GR2 of the base substrate 210, and may overlap with the second groove GR2. The second color filter CF2 may transmit the second light therethrough, and may absorb or block the first light and the third light. For example, the second color filter CF2 transmits light of the green wavelength band therethrough, and may absorb or block light beams of other wavelength bands such as the blue and red wavelength bands.

The third color filter CF3 may overlap with the third light-emitting area EA3. Further, the third color filter CF3 may be disposed on the third groove GR3 of the base substrate 210, and may overlap with the third groove GR3. The third color filter CF3 may transmit the third light therethrough, and may absorb or block the first light and the second light. For example, the third color filter CF3 transmits light of the red wavelength band therethrough, and may absorb or block light beams of other wavelength bands such as the blue and green wavelength bands.

A planar area of each of the plurality of color filters CF1, CF2, and CF3 may be larger than a planar area of a corresponding one of the plurality of light-emitting areas EA1, EA2, and EA3, and may be larger than a planar area of a corresponding one of the plurality of grooves GR1, GR2, and GR3. For example, the planar area of the first color filter CF1 may be larger than each of the planar area of the first light-emitting area EA1 and the planar area of the first groove GR1. The planar area of the second color filter CF2 may be larger than each of the planar area of the second light-emitting area EA2 and the planar area of the second groove GR2. The planar area of the third color filter CF3 may be larger than each of the planar area of the third light-emitting area EA3 and the planar area of the third groove GR3. However, the present disclosure is not limited thereto. For example, in some embodiments, the planar area of each of the plurality of color filters CF1, CF2, and CF3 may be equal to or substantially equal to the planar area of the corresponding one of the plurality of light-emitting areas EA1, EA2 and EA3 and the corresponding one of the plurality of grooves GR1, GR2, and GR3.

As described above, in the display device 10 according to one or more embodiments, the plurality of grooves GR may be defined in the base substrate 210, and thus, the ultra-high resolution light-emitting areas EA1, EA2, and EA3 may be formed. Accordingly, the ultra-high resolution display device 10 having the ultra-high resolution light-emitting areas EA1, EA2, and EA3 may be implemented.

Hereinafter, a display device 10 according to one or more other embodiments will be described with reference to the other figures.

Figure 9:
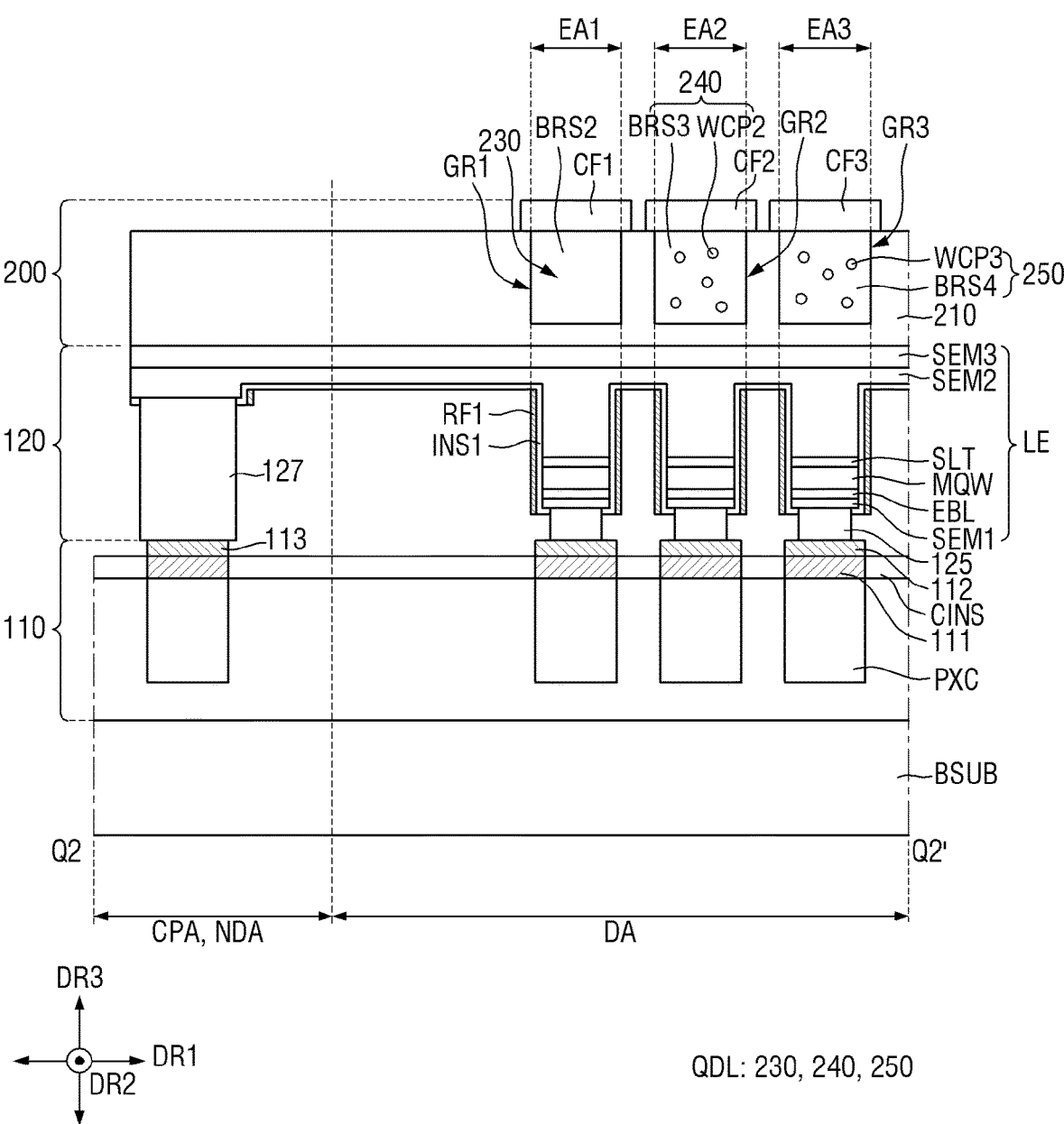
FIG. 9 is a cross-sectional view showing a display panel according to another embodiment.

FIG. 9 is a cross-sectional view showing a display panel according to another embodiment.

Referring to FIG. 9, a configuration of the wavelength conversion layer QDL of the display device 10 may be modified. The embodiment shown in FIG. 9 may be different from the one or more embodiments described above with reference to FIGS. 4 to 8, in that the wavelength conversion layer QDL of the embodiment of FIG. 9 may include a light-transmissive pattern 230, a first wavelength conversion pattern 240, and a second wavelength conversion pattern 250. Hereinafter, redundant description of the same or substantially the same components between the embodiment of FIG. 9 and the embodiments of FIGS. 4 to 8 may be simplified or may not be repeated, and the differences therebetween may be mainly described in more detail.

The wavelength conversion layer QDL may include the light-transmissive pattern 230, the first wavelength conversion pattern 240 and the second wavelength conversion pattern 250.

The light-transmissive pattern 230 may be disposed in the first groove GR1, and may overlap with each of the first light-emitting area EA1 and the first color filter CF1. The light-transmissive pattern 230 may transmit therethrough light incident thereto. The first light emitted from the light-emitting element LE disposed in the first light-emitting area EA1 may be blue light. The first light as the blue light may pass through the light-transmissive pattern 230, and may be output out of the first light-emitting area EA1.

In an embodiment, the light-transmissive pattern 230 may include a second base resin BRS2. The second base resin BRS2 may include (e.g., may be made of) a material having high light transmittance. In an embodiment, the second base resin BRS2 may include (e.g., may be made of) an organic material. The second base resin BRS2 may include the same or substantially the same material as that of the above-described first base resin BRS1. For example, the second base resin BRS2 may include an organic material, such as an epoxy-based resin, an acrylic-based resin, a cardo-based resin, or an imide-based resin.

The first wavelength conversion pattern 240 may be disposed in the second groove GR2, and may overlap with each of the second light-emitting area EA2 and the second color filter CF2. The first wavelength conversion pattern 240 may convert or shift a peak wavelength of incident light thereto to a desired peak wavelength (e.g., a predetermined or specific peak wavelength) that is different from that of the incident light, and may output light having the desired peak wavelength (e.g., the predetermined or specific peak wavelength). In an embodiment, the first wavelength conversion pattern 240 may convert the first light emitted from the light-emitting element LE in the second light-emitting area EA2 in to the second light as green light having a peak wavelength in a range of about 510 nm to 550 nm, and may emit the green light.

The first wavelength conversion pattern 240 may include a third base resin BRS3, and second wavelength conversion particles WCP2 dispersed in the third base resin BRS3.

The third base resin BRS3 may include (e.g., may be made of) a material having high light transmittance. In an embodiment, the third base resin BRS3 may include (e.g., may be made of) an organic material. The third base resin BRS3 may include (e.g., may be made of) the same or substantially the same material as that of the first base resin BRS1 or the second base resin BRS2, or may include at least one of the materials described above as examples of the suitable constituent material of the first base resin BRS1 or the second base resin BRS2.

The second wavelength conversion particles WCP2 may convert or shift a peak wavelength of incident light thereto to a desired peak wavelength (e.g., a predetermined or specific peak wavelength) that is different from that of the incident light. In an embodiment, the second wavelength conversion particles WCP2 may convert the first color light as the blue light emitted from the light-emitting element LE into the green light having a peak wavelength in a range of about 510 nm to 550 nm, and may emit the green light.

An example of the second wavelength conversion particles WCP2 may include a quantum dot, a quantum rod, or phosphor. The second wavelength conversion particles WCP2 may be the same or substantially the same as (or similar to) the first wavelength conversion particles WCP1 discussed above, and thus, redundant description thereof may not be repeated.

A portion of the first light as the blue light emitted from the light-emitting element LE may not be converted to the second light as the green light by the second wavelength conversion particle WCP2, and may pass through the first wavelength conversion pattern 240. However, the portion of the first light that has not been converted to the green light may be blocked by the second color filter CF2. On the other hand, a portion of the first light emitted from the light-emitting element LE that has been converted by the first wavelength conversion pattern 240 into the green light may pass through the second color filter CF2, and may be emitted to the outside.

The second wavelength conversion pattern 250 may be disposed in the third groove GR3, and may overlap with each of the third light-emitting area EA3 and the third color filter CF3. The second wavelength conversion pattern 250 may convert or shift a peak wavelength of light incident thereto into a desired peak wavelength (e.g., a predetermined or specific peak wavelength) that is different from that of the incident light, and may emit light having the desired peak wavelength (e.g., the predetermined or specific peak wavelength). In an embodiment, the second wavelength conversion pattern 250 may convert the first light emitted from the light-emitting element LE in the third light-emitting area EA3 into the third light as red light having a peak wavelength in a range of about 610 nm to about 650 nm, and may emit the third light.

The second wavelength conversion pattern 250 may include a fourth base resin BRS4, and third wavelength conversion particles WCP3 dispersed in the fourth base resin BRS4. The fourth base resin BRS4 may include (e.g., may be made of) a material having high light transmittance. In an embodiment, the fourth base resin BRS4 may include (e.g., may be made of) an organic material. The fourth base resin BRS4 may include (e.g., may be made of) the same or substantially the same material as that of the above-described first base resin BRS1, second base resin BRS2, and/or third base resin BRS3, or may include at least one of the materials described above as examples of the suitable constituent material of the first base resin BRS1 or the second base resin BRS2.

The third wavelength conversion particles WCP3 may convert or shift a peak wavelength of incident light thereto to a desired peak wavelength (e.g., a predetermined or specific peak wavelength) that is different from that of the incident light. In an embodiment, the third wavelength conversion particles WCP3 may convert the first color light as the blue light emitted from the light-emitting element LE into the red light having a peak wavelength in a range of about 610 nm to 650 nm, and may emit the red light.

An example of the third wavelength conversion particle WCP3 may include a quantum dot, a quantum rod, or phosphor. The third wavelength conversion particles WCP3 may be the same or substantially the same as (or similar to) the first wavelength conversion particles WCP1 described above, and thus, redundant description thereof may not be repeated.

A portion of the first light as the blue light emitted from the light-emitting element LE may not be converted to the third light as the red light by the third wavelength conversion particle WCP3, and may pass through the second wavelength conversion pattern 250. However, the portion of the first light that has not been converted to the red light may be blocked by the third color filter CF3 disposed on the second wavelength conversion pattern 250. On the other hand, a portion of the first light emitted from the light-emitting element LE that has been converted by the second wavelength conversion pattern 250 into the red light may pass through the third color filter CF3, and may be emitted to the outside.

Each of the first wavelength conversion pattern 240 and the second wavelength conversion pattern 250 may further include the scattering material as described above. However, the present disclosure is not limited thereto.

The display device 10 according to one or more embodiments described above may include the wavelength conversion layer QDL including the light-transmissive pattern 230, the first wavelength conversion pattern 240, and the second wavelength conversion pattern 250, thereby improving light emission efficiency of each of the blue, green, and red light beams.

Figure 10:
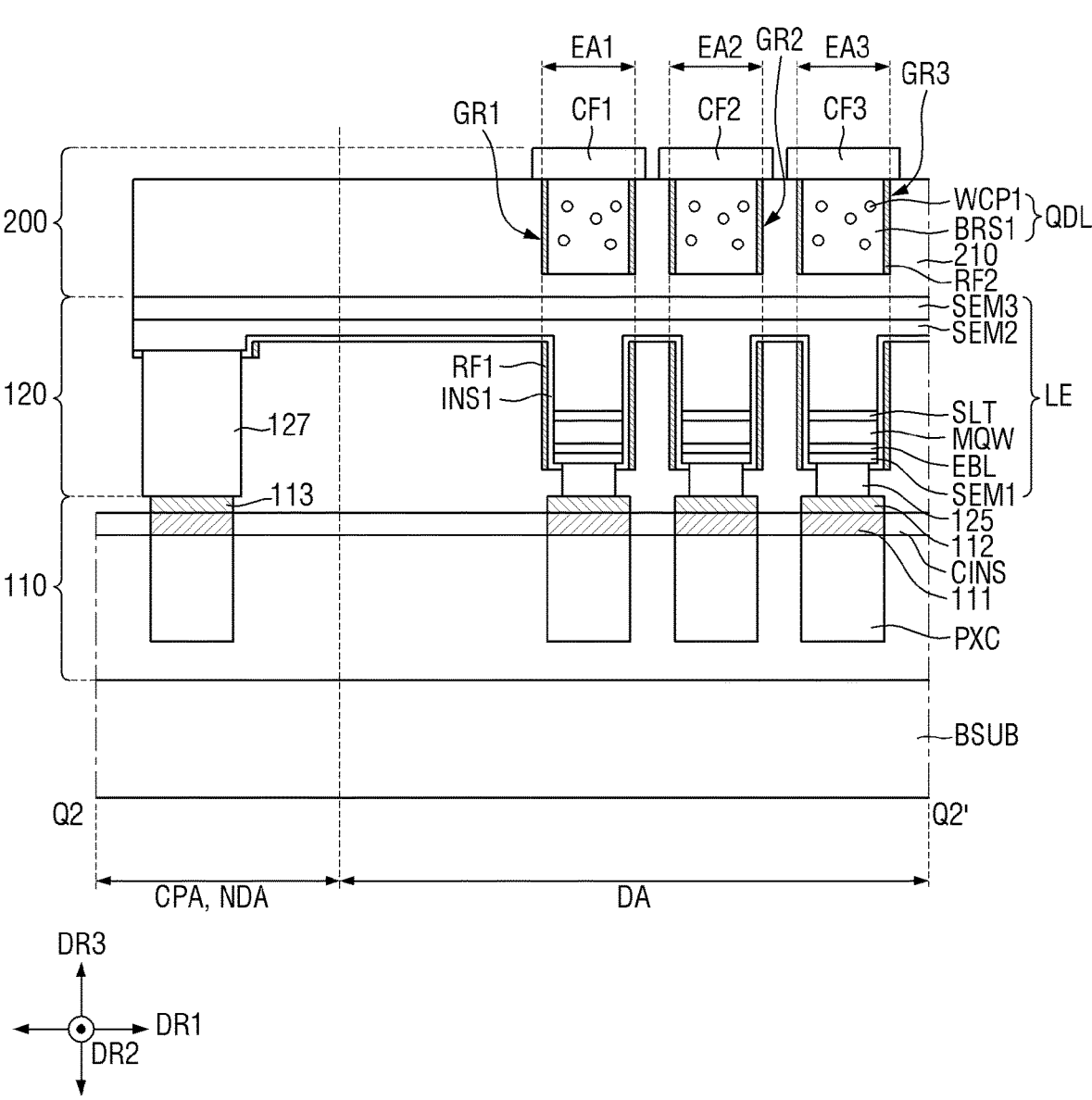
FIG. 10 is a cross-sectional view showing a display panel according to another embodiment.

FIG. 10 is a cross-sectional view showing a display panel according to another embodiment.

Referring to FIG. 10, a display panel 100 may be different from those of one or more embodiments described above with reference to FIG. 4 to FIG. 9, in that the display panel 100 of the embodiment of FIG. 10 may further include a second reflective layer RF2 on a side face (e.g., on a side surface) of each of the plurality of grooves GR. Hereinafter, redundant description of the same or substantially the same components between the embodiment of FIG. 10 and the embodiments of FIGS. 4 to 9 may be simplified or may not be repeated, and the differences therebetween may be mainly described in more detail.

The second reflective layer RF2 may be disposed on and along the plurality of grooves GR. The second reflective layer RF2 may be disposed on the side face (e.g., the side surface) of each of the plurality of grooves GR. The second reflective layer RF2 may reflect light beams that are emitted from the light-emitting element LE and traveling in a lateral direction instead of toward a top of the display panel. The second reflective layer RF2 may be disposed at (e.g., in or on) the display area DA, and may overlap with each of the first light-emitting area EA1, the second light-emitting area EA2, and the third light-emitting area EA3. However, the present disclosure is not limited thereto. For example, in some embodiments, the second reflective layer RF2 may not overlap with each of the light-emitting areas EA1, EA2, and EA3 when a planar area of each of the plurality of grooves GR is larger than a planar area of a corresponding one of the light-emitting areas EA1, EA2, and EA3 overlapping therewith.

The second reflective layer RF2 may surround (e.g., around a portion of) each of the wavelength conversion layers QDL at (e.g., in or on) the display area DA, so that a converted portion of light from the wavelength conversion layer QDL may be emitted toward a top of the display panel. Each second reflective layer RF2 (e.g., each portion thereof) surrounding (e.g., around a periphery of) a corresponding wavelength conversion layer QDL of interest may be spaced apart from another adjacent second reflective layer RF2 (e.g., an adjacent portion thereof) surrounding (e.g., around a periphery of) another wavelength conversion layer QDL adjacent to the wavelength conversion layer QDL of interest. In other words, the second reflective layers RF2 (e.g., the portions thereof) may be arranged and spaced apart from each other in the first direction DR1 and the second direction DR2. For example, a planar shape of the second reflective layer RF2 may be a rectangular closed-loop shape. However, the present disclosure is not limited thereto. The planar shape of the second reflective layer RF2 may have various suitable shapes based on the planar shape of each of the plurality of grooves GR.

The second reflective layer RF2 may include the same or substantially the same material as that of the first reflective layer RF1 as described above. For example, the second reflective layer RF2 may include a highly reflective metal material, such as aluminum (Al). A thickness of the second reflective layer RF2 may be approximately 0.1 μm. However, the present disclosure is not limited thereto.

In an embodiment, the display device may include each second reflective layer RF2 (e.g., each portion thereof) disposed on the side faces (e.g., the side surfaces) of the plurality of grooves GR, and surrounding (e.g., around a periphery of) the wavelength conversion layers QDL, thereby preventing or substantially preventing the converted portion of the light from the wavelength conversion layer QDL from invading into adjacent light-emitting areas. Accordingly, color mixing due to crosstalk of light may be prevented or reduced.

Figure 11:
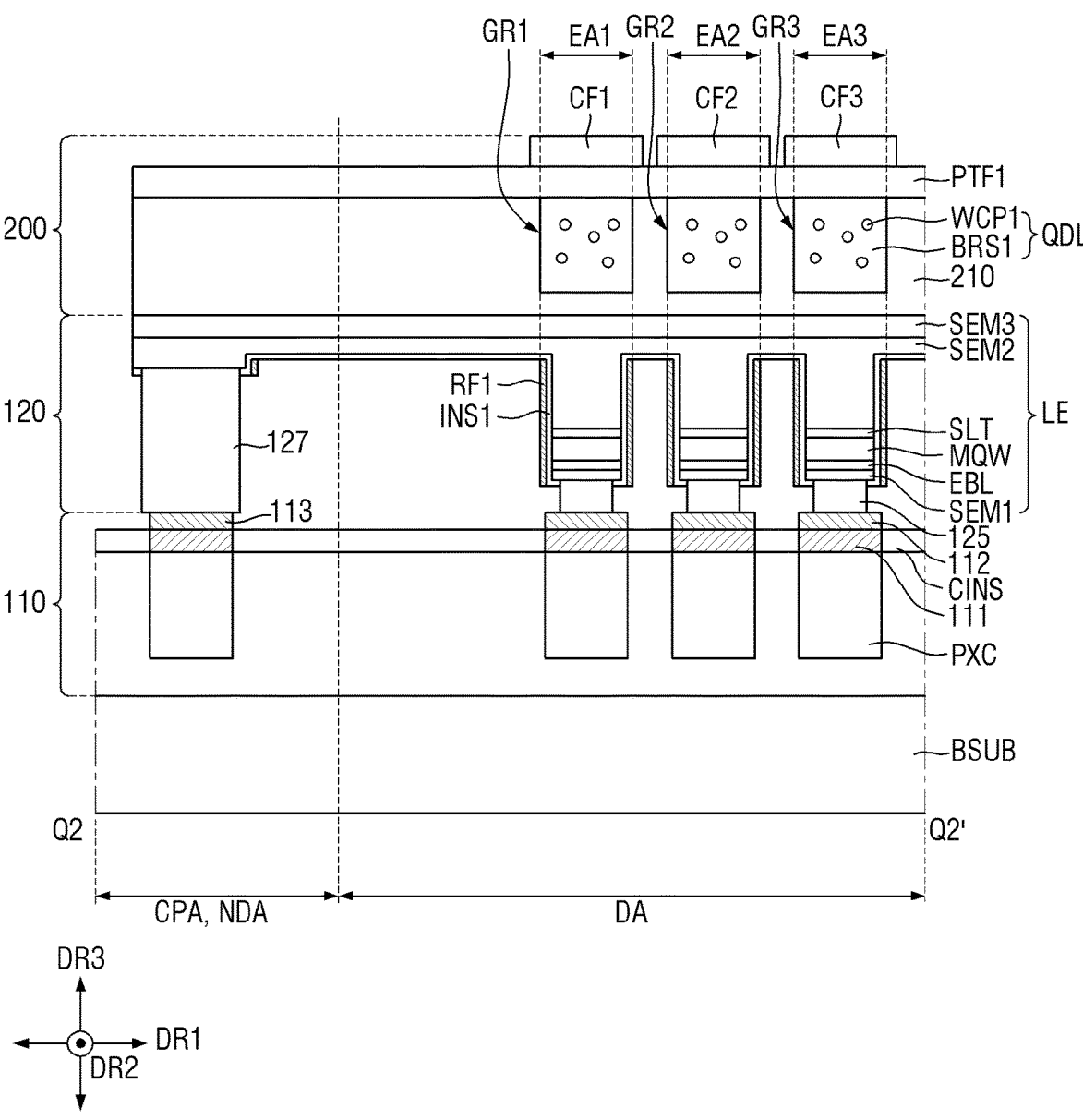
FIG. 11 is a cross-sectional view showing a display panel according to another embodiment.

FIG. 11 is a cross-sectional view showing a display panel according to another embodiment.

Referring to FIG. 11, a display panel 100 may be different from those of the one or more embodiments described above with reference to FIG. 4 to FIG. 10, in that the display panel 100 of the embodiment of FIG. 11 may further include a first protective layer PTF1 between the wavelength conversion layer QDL and the plurality of color filters CF1, CF2, and CF3. Hereinafter, redundant description of the same or substantially the same components between the embodiment of FIG. 11 and the embodiments of FIGS. 4 to 10 may be simplified or may not be repeated, and the differences therebetween may be mainly described in more detail.

The first protective layer PTF1 may be disposed over an entirety or substantially an entirety of the display area DA and an entirety or substantially an entirety of the non-display area NDA. The first protective layer PTF1 may be disposed between the wavelength conversion layer QDL and the plurality of color filters CF1, CF2, and CF3. The first protective layer PTF1 may protect the plurality of color filters CF1, CF2, and CF3 from an etchant or the like in a subsequent process.

One face (e.g., one surface), for example, a top face (e.g., a top surface), of the first protective layer PTF1 may contact a bottom face (e.g., a bottom surface) of each of the plurality of color filters CF1, CF2, and CF3. An opposite face (e.g., an opposite surface), for example, a bottom face (e.g., a bottom surface), of the first protective layer PTF1 may contact a top face (e.g., a top surface) of the base substrate 210 and a top face (e.g., a top surface) of the wavelength conversion layer QDL.

The first protective layer PTF1 may include an inorganic insulating material to protect the plurality of color filters CF1, CF2, and CF3. For example, the first protective layer PTF1 may include silicon oxide ($SiO_x$), silicon nitride ($SiN_x$), silicon oxynitride ($SiO_xN_y$), aluminum oxide ($Al_xO_y$), aluminum nitride (AlN), and/or the like. However, the present disclosure is not limited thereto. The first protective layer PTF1 may have a suitable thickness (e.g., a predetermined thickness), which may be in a range of 0.01 μm to 1 μm. However, the present disclosure is not limited thereto.

In an embodiment, the display device may include the first protective layer PTF1 disposed between the wavelength conversion layer QDL and the plurality of color filters CF1, CF2, and CF3, thereby preventing or substantially preventing the plurality of color filters CF1, CF2, and CF3 from being damaged in the subsequent process.

Figure 12:
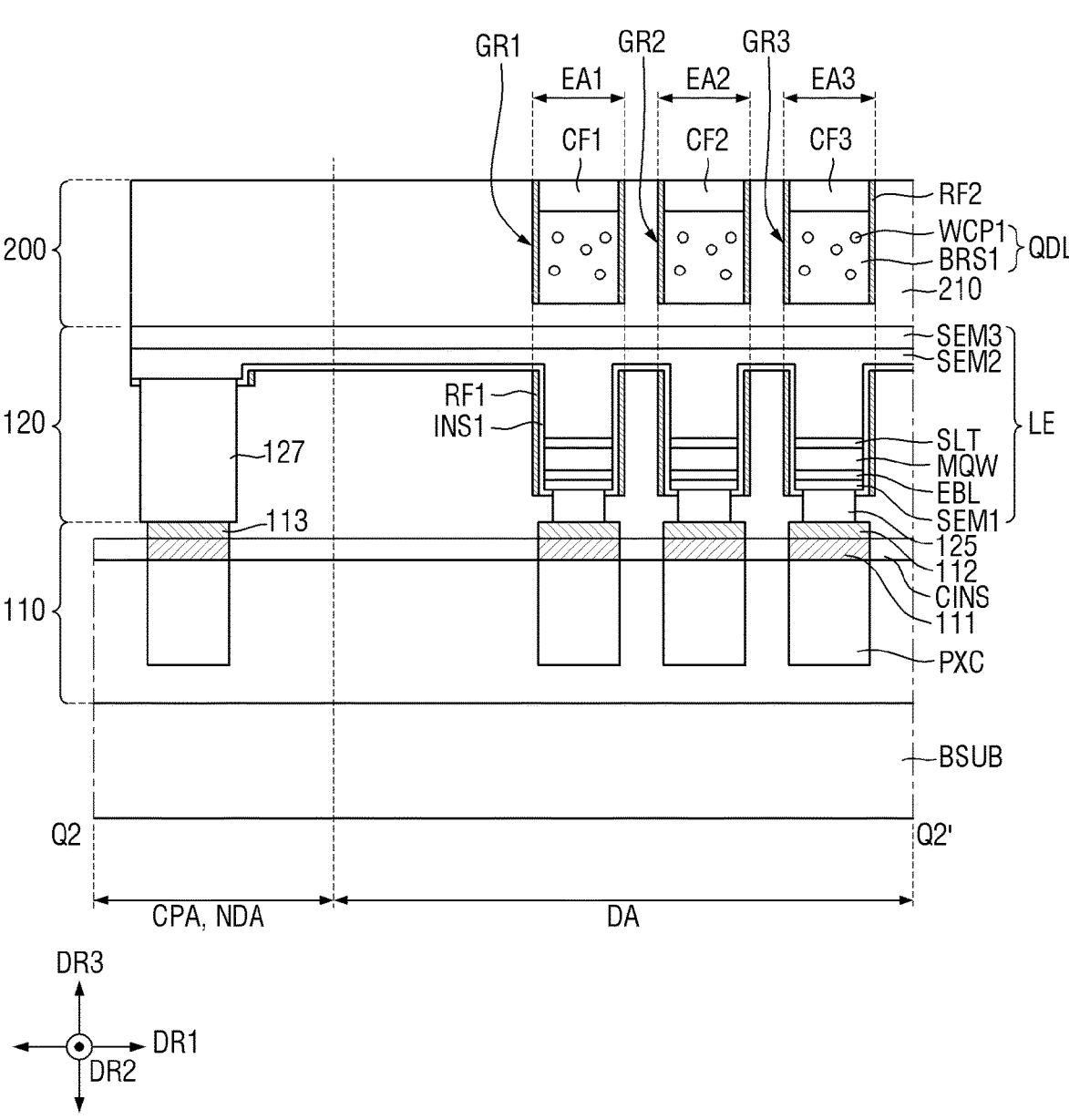
FIG. 12 is a cross-sectional view showing a display panel according to another embodiment.

FIG. 12 is a cross-sectional view showing a display panel according to another embodiment.

Referring to FIG. 12, a display panel 100 may be different from those of the embodiments described above with reference to FIG. 4 to FIG. 11, in that in the embodiment of FIG. 12, each of the color filters CF1, CF2, and CF3 is located (e.g., is received) in a corresponding one of the plurality of grooves GR of the base substrate 210. Hereinafter, redundant description of the same or substantially the same components between the embodiment of FIG. 12 and the embodiments of FIGS. 4 to 11 may be simplified or may not be repeated, and the differences therebetween may be mainly described in more detail.

The plurality of grooves GR may have a depth that is greater than those of the grooves of the one or more embodiments described above. Accordingly, each of the plurality of color filters CF1, CF2, and CF3 and each of the wavelength conversion layers QDL may be received in corresponding ones of the plurality of grooves GR of the base substrate 210.

In more detail, the first color filter CF1, the second reflective layer RF2 (e.g., a portion thereof), and the wavelength conversion layer QDL (e.g., a portion thereof) may be received in the first groove GR1 disposed in the first light-emitting area EA1. The first color filter CF1 may be in contact with a top face (e.g., a top surface) of the wavelength conversion layer QDL and the side faces (e.g., side surfaces) of the second reflective layer RF2. The first color filter CF1 may fill the first groove GR1, such that the top face (e.g., the top surface) of the base substrate 210 and the top face (e.g., the top surface) of the first color filter CF1 may be coplanar with each other.

The second color filter CF2, the second reflective layer RF2 (e.g., a portion thereof), and the wavelength conversion layer QDL (e.g., a portion thereof) may be received in the second groove GR2 disposed in the second light-emitting area EA2. The second color filter CF2 may be in contact with a top face (e.g., a top surface) of the wavelength conversion layer QDL and side faces (e.g., side surfaces) of the second reflective layer RF2. The second color filter CF2 may fill the second groove GR2, such that the top face (e.g., the top surface) of the base substrate 210 and a top face (e.g., a top surface) of the second color filter CF2 may be coplanar with each other.

The third color filter CF3, the second reflective layer RF2 (e.g., a portion thereof), and the wavelength conversion layer QDL (e.g., a portion thereof) may be received in the third groove GR3 disposed in the third light-emitting area EA3. The third color filter CF3 may be in contact with a top face (e.g., a top surface) of the wavelength conversion layer QDL and side faces (e.g., side surfaces) of the second reflective layer RF2. The third color filter CF3 may fill the third groove GR3, such that the top face (e.g., the top surface) of the base substrate 210 and a top face (e.g., a top surface) of the third color filter CF3 may be coplanar with each other. However, the present disclosure is not limited thereto. For example, in some embodiments, each of the color filters CF1, CF2, and CF3 may protrude upwardly beyond the top face (e.g., the top surface) of the base substrate 210. As another example, a vertical level of the top face (e.g., the top surface) of each of the color filters CF1, CF2, and CF3 may be lower than a vertical level of the top face (e.g., the top surface) of the base substrate 210.

In an embodiment, the depth of each of the plurality of grooves GR of the base substrate 210 may be increased, such that each of the plurality of color filters CF1, CF2, and CF3 and each wavelength conversion layer QDL may be received in the plurality of grooves GR. Thus, each of the plurality of color filters CF1, CF2, and CF3 and each wavelength conversion layer QDL may be easily aligned, and the manufacturing process thereof may be easily achieved.

Figure 13:
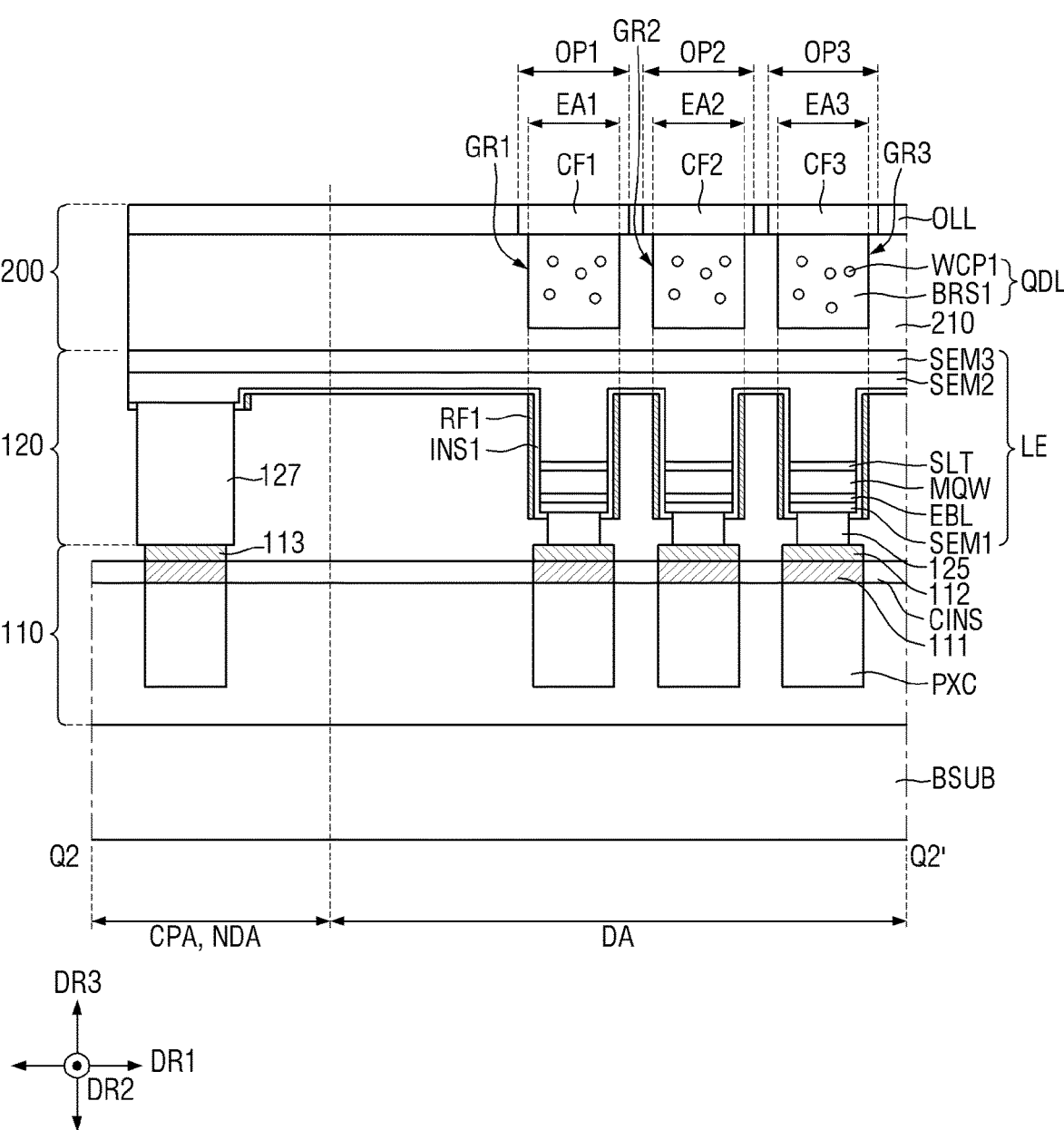
FIG. 13 is a cross-sectional view showing a display panel according to another embodiment.

FIG. 13 is a cross-sectional view showing a display panel according to another embodiment.

Referring to FIG. 13, a display panel 100 may be different from those of the embodiments described above with reference to FIG. 4 to FIG. 12, in that the display panel 100 of the embodiment of FIG. 13 may further include an organic layer OLL having a plurality of openings OP1, OP2, and OP3 defined therein, and each of the color filters CF1, CF2, and CF3 are received in a corresponding one of the plurality of openings OP1, OP2, and OP3. Hereinafter, redundant description of the same or substantially the same components between the embodiment of FIG. 13 and the embodiments of FIGS. 4 to 12 may be simplified or may not be repeated, and the differences therebetween may be mainly described in more detail.

The wavelength conversion substrate 200 may further include the organic layer OLL.

The organic layer OLL may be disposed on the base substrate 210, and may cover the plurality of grooves GR and the wavelength conversion layer QDL. The organic layer OLL may extend in each of the first direction DR1 and the second direction DR2, and may be formed in a grid-shaped pattern over an entirety or substantially an entirety of the display area DA. Further, the organic layer OLL may extend from the display area DA to the non-display area NDA, and may be disposed over an entirety or substantially an entirety of the non-display area NDA.

The organic layer OLL may include the plurality of openings OP1, OP2, and OP3 defined therein, exposing the base substrate 210 and the wavelength conversion layer QDL in the display area DA. The plurality of openings OP1, OP2, and OP3 may include a first opening OP1 overlapping with the first light-emitting area EA1, a second opening OP2 overlapping with the second light-emitting area EA2, and a third opening OP3 overlapping with the third light-emitting area EA3. In this connection structure, the plurality of openings OP1, OP2, and OP3 may correspond to the plurality of light-emitting areas EA1, EA2, and EA3, respectively. In other words, the first opening OP1 may correspond to the first light-emitting area EA1, the second opening OP2 may correspond to the second light-emitting area EA2, and the third opening OP3 may correspond to the third light-emitting area EA3. On the other hand, the organic layer OLL may not have a plurality of openings at (e.g., in or on) the non-display area NDA, and may be implemented in a form of a flat or substantially flat film at (e.g., in or on) the non-display area NDA.

The organic layer OLL may serve to provide a space in which each of the color filters CF1, CF2, and CF3 is received. Thus, the organic layer OLL may have a suitable thickness (e.g., a predefined thickness). For example, a thickness of the organic layer OLL may be in a range of 1 μm to 10 μm. The organic layer OLL may include an organic insulating material, so that the thickness thereof may be secured. In an example, the organic layer OLL may include an epoxy-based resin, an acrylic-based resin, a cardo-based resin, or an imide-based resin.

Each of the plurality of color filters CF1, CF2, and CF3 may be received in a corresponding one of the plurality of openings OP1, OP2, and OP3 of the organic layer OLL. The first color filter CF1 may be disposed in the first opening OP1 to fill the first opening OP1. The second color filter CF2 may be disposed in the second opening OP2 to fill the second opening OP2. The third color filter CF3 may be disposed in the third opening OP3 to fill the third opening OP3.

Top faces (e.g., top surfaces) of the plurality of color filters CF1, CF2, and CF3 may be coplanar with a top face (e.g., a top surface) of the organic layer OLL. The first color filter CF1 may fill the first opening OP1, such that the top face (e.g., the top surface) of the first color filter CF1 may be coplanar with the top face (e.g., the top surface) of the organic layer OLL. The second color filter CF2 may fill the second opening OP2, such that the top face (e.g., the top surface) of the second color filter CF2 may be coplanar with the top face (e.g., the top surface) of the organic layer OLL and the top face (e.g., the top surface) of the first color filter CF1. The third color filter CF3 may fill the third opening OP3, such that the top face (e.g., the top surface) of the third color filter CF3 may be coplanar with the top face (e.g., the top surface) of the organic layer OLL, the top face (e.g., the top surface) of the first color filter CF1, and the top face (e.g., the top surface) of the second color filter CF2. However, the present disclosure is not limited thereto. For example, in some embodiments, a vertical level of the top face (e.g., the top surface) of at least one color filter may be higher than that of the top face (e.g., the top surface) of one or more other color filters, or may be higher than the top face (e.g., the top surface) of the organic layer OLL.

In an embodiment, the display device may include the organic layer OLL that provides a space where each of the color filters CF1, CF2, and CF3 may be disposed. Thus, the color filters CF1, CF2, and CF3 may be easily manufactured using, for example, an inkjet process.

Figure 14:
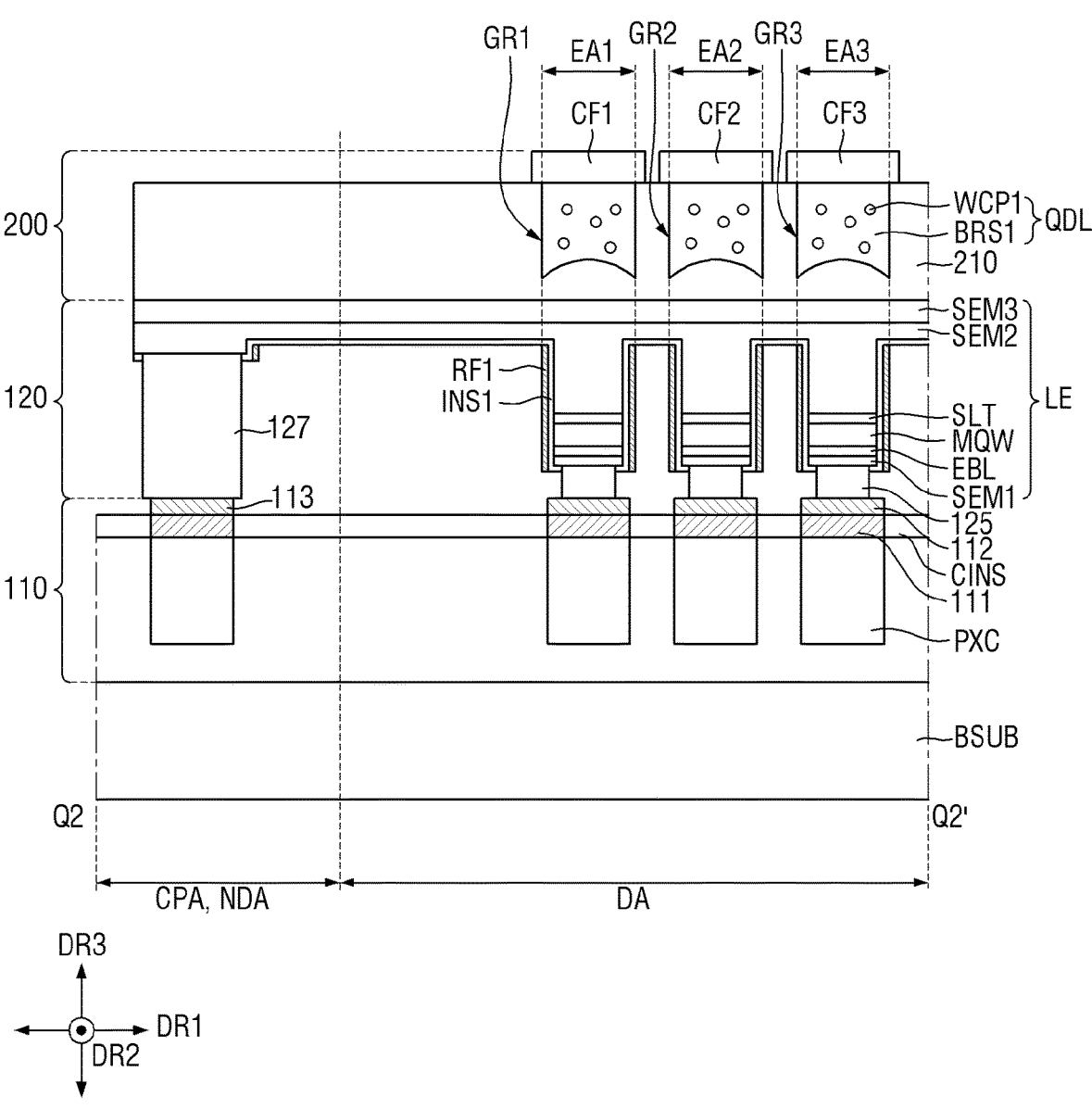
FIG. 14 is a cross-sectional view showing a display panel according to another embodiment.
Figure 15:
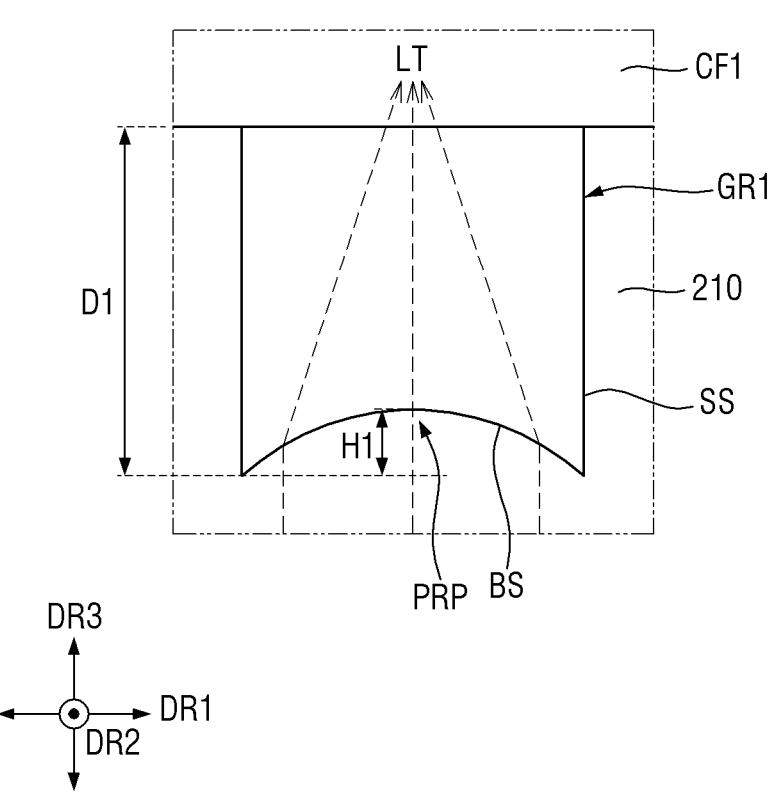
FIG. 15 is an enlarged view of a first groove shown in FIG. 14.
Figure 16:
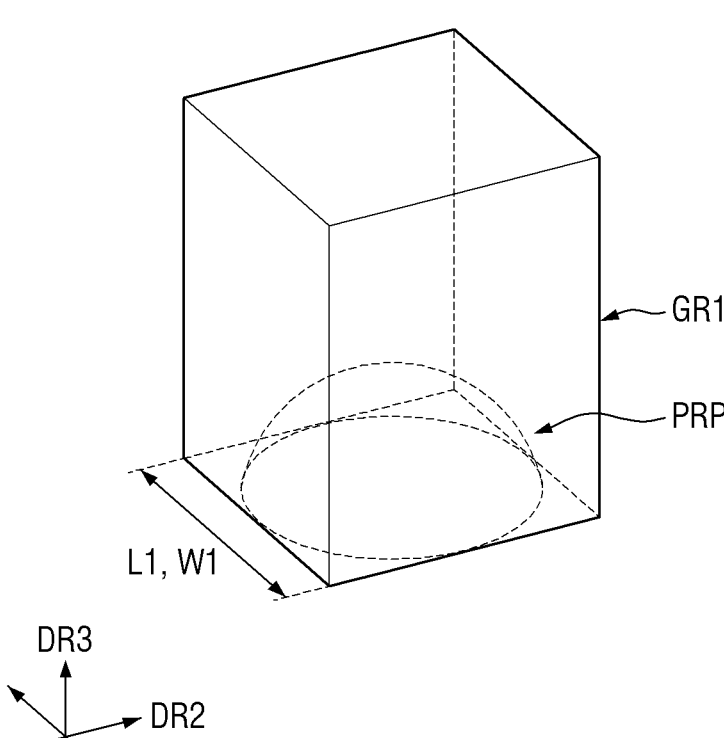
FIG. 16 is a perspective view showing a first groove.
Figure 17:
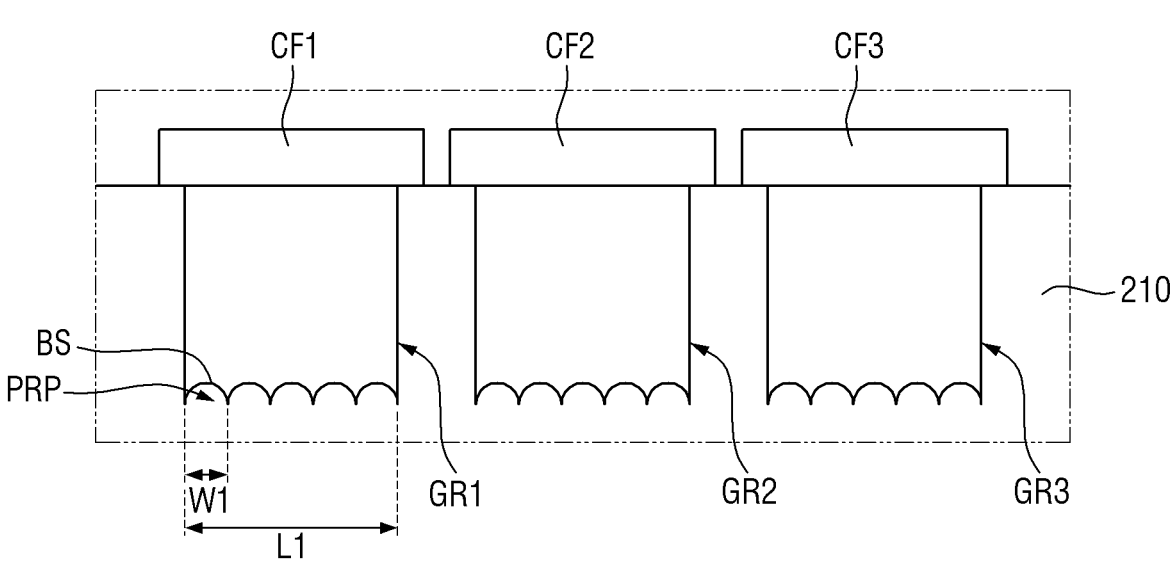
FIGS. 17-19 are cross-sectional views schematically showing various shapes of a first groove, a second groove, and a third groove.
Figure 17:
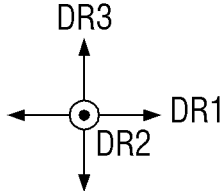
Figure 18:
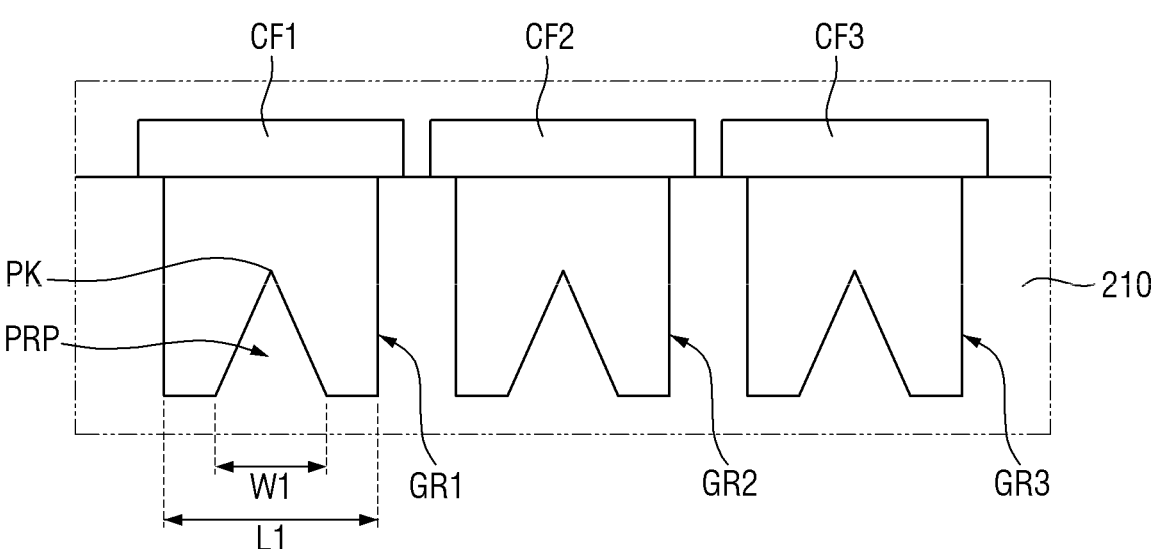
Figure 19:
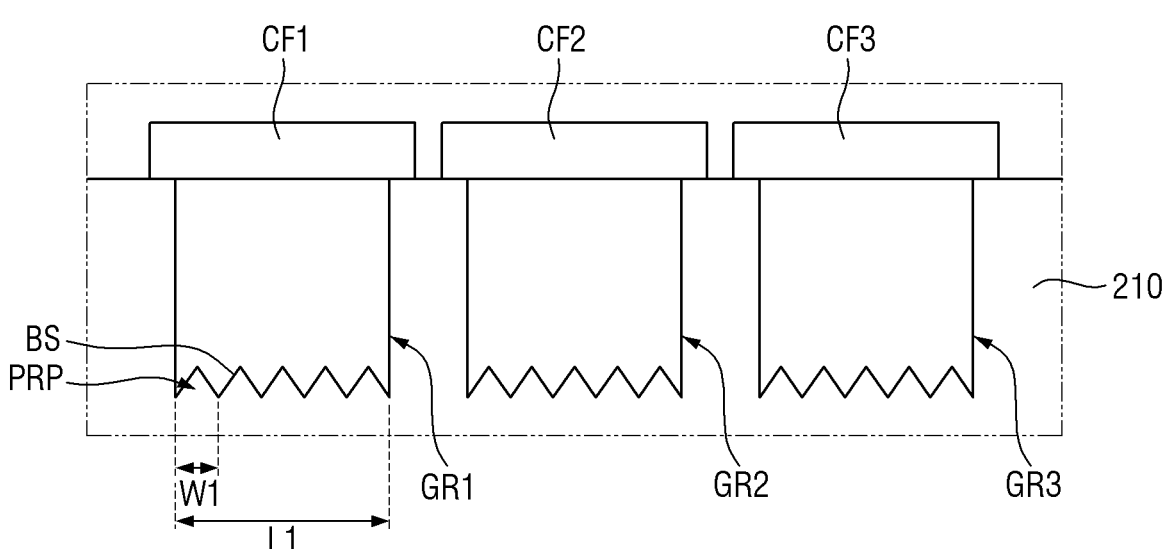
Figure 20:
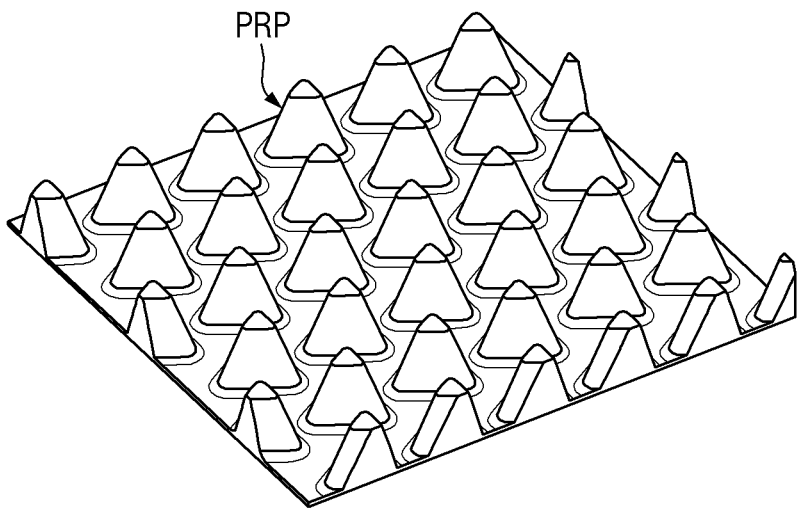
FIGS. 20-22 are perspective views schematically showing various shapes of the first groove, the second groove, and the third groove.
Figure 21:
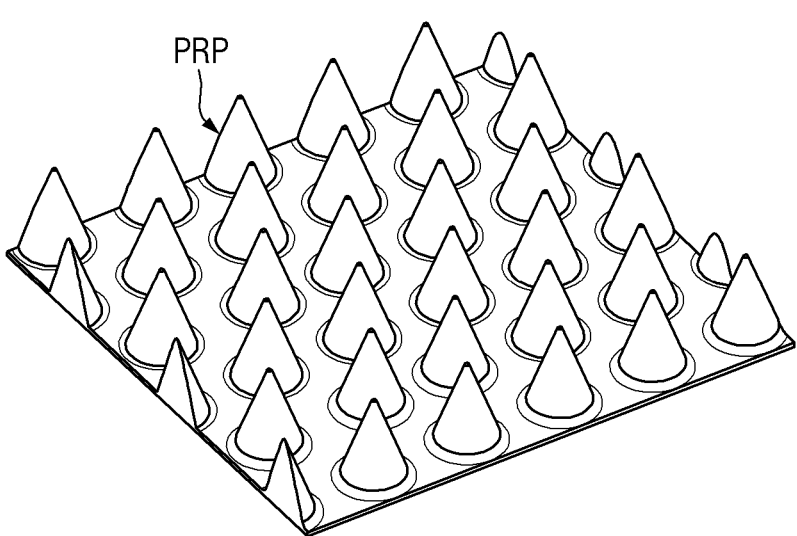
Figure 22:
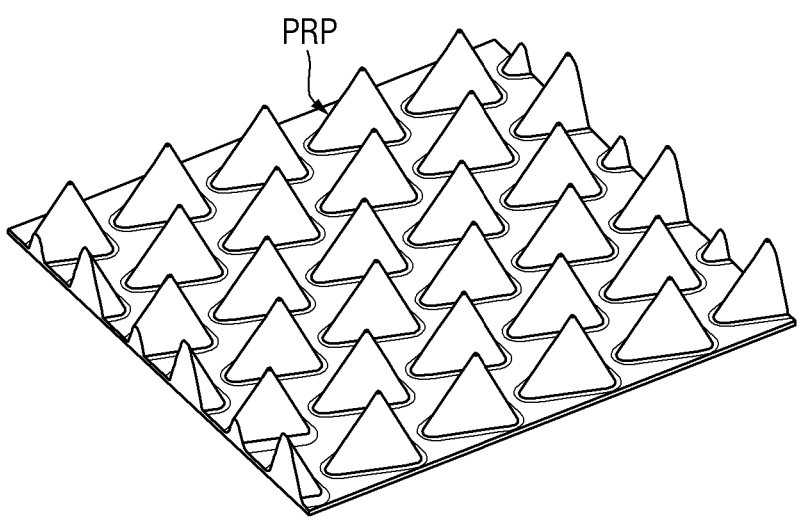

FIG. 14 is a cross-sectional view showing a display panel according to another embodiment. FIG. 15 is an enlarged view of a first groove shown in FIG. 14. FIG. 16 is a perspective view showing the first groove. FIG. 17 to FIG. 19 are cross-sectional views schematically showing various shapes of the first groove, a second groove, and a third groove. FIG. 20 to FIG. 22 are perspective views schematically showing various shapes of the first groove, the second groove, and the third groove.

Referring to FIG. 14 to FIG. 22, a display panel 100 may be different from those of the embodiments described above with reference to FIG. 4 to FIG. 13, in that a bottom face BS of each of the plurality of grooves GR may include at least one protrusion PRP. Hereinafter, redundant description of the same or substantially the same components between the embodiments of FIGS. 14 to 22 and the embodiments of FIGS. 4 to 13 may be simplified or may not be repeated, and the differences therebetween may be mainly described in more detail.

Referring to FIG. 14 and FIG. 16, each of the plurality of grooves GR defined in the base substrate 210 may include a side face (e.g., a side surface) SS and a bottom face (e.g., a bottom surface) BS. The side face SS may extend in the third direction DR3. However, the present disclosure is not limited thereto. The side face SS may be oblique or may be curved. The bottom face BS may extend in a direction crossing (e.g., intersecting) the extending direction of the side face SS, for example, such as in the first direction DR1. However, the present disclosure is not limited thereto. The bottom face BS may be oblique or may be curved.

The bottom face BS of each of the plurality of grooves GR may include at least one protrusion PRP. The at least one protrusion PRP may have a structure protruding upwardly in the third direction DR3. The protrusion PRP may have an embossed or convex hemispherical face relative to the bottom face BS. For example, the protrusion PRP may have a micro-lens shape. Refraction and condensing properties of the micro-lens may vary depending on a pitch of the micro-lens and compactness of micro-lenses. As shown in the figures, the bottom face of each of the plurality of grooves GR may have one micro-lens-shaped protrusion PRP. The grooves GR and the protrusions PRP may correspond to each other in an one-to-one manner. For example, one protrusion PRP may be present in the first groove GR1. Further, a length L1 (or a width) of the groove GR in the first direction DR1 and a width W1 of the protrusion PRP in the first direction DR1 may be equal to or substantially equal to each other. A height H1 of the protrusion PRP may be smaller than the depth D1 of the groove GR. For example, the height H1 of the protrusion PRP may be in a range of 10% to 50% or greater of the depth D1 of the groove GR. Further, the protrusion PRP may occupy 50% to 90% or greater of an area of the bottom face BS of the groove GR. However, the present disclosure is not limited thereto.

The light emitted from the light-emitting element LE may be incident through the bottom face BS of the groove GR of the base substrate 210 into the wavelength conversion layer QDL. The wavelength conversion layer QDL may change a wavelength of the incident light. Then, light having the changed wavelength may be output to the outside through the corresponding color filters CF1, CF2, and CF3. In more detail, a portion of the light incident on the bottom face BS of the groove GR may be refracted due to the protrusion PRP. In other words, the portion of the light incident on the bottom face BS of the groove GR may be condensed in the third direction DR3, while another portion of the incident light may be diffused. Therefore, by providing the protrusion PRP in the groove GR, the portion of the incident light may be condensed, such that light efficiency may be improved. Further, another portion of the incident light may be diffused to increase an amount of the light reaching the wavelength conversion layer QDL, such that the wavelength conversion efficiency may be improved.

Referring to FIG. 17, in another embodiment, a plurality of micro-lens-shaped protrusions PRP may be disposed on the bottom face (e.g., the bottom surface)_BS of each of the plurality of grooves GR. The grooves GR and the protrusions PRP may correspond in an one-to-many manner. For example, a plurality of protrusions PRP may be disposed on the bottom face BS of the first groove GR1, a plurality of protrusions PRP may be disposed on the bottom face BS of the second groove GR2, and a plurality of protrusions PRP may be disposed on the bottom face BS of the third groove GR3. Further, a width W1 of each of the protrusions PRP in the first direction DR1 may be smaller than a length L1 (or a width) of each groove GR in the first direction DR1. Further, the plurality of protrusions PRP may occupy 50% to 90% or greater of an area of the bottom face BS of the groove GR. However, the present disclosure is not limited thereto.

Referring to FIG. 18, in another embodiment, the protrusion PRP may have a triangular cross-sectional shape. For example, the protrusion PRP may be formed in a prism shape. The protrusion PRP may have a peak PK, which may extend in the third direction DR3. The protrusion PRP may have a triangular cross sectional shape, and may extend in the third direction DR3. A width W1, a height H1, and an area of the protrusion PRP may be the same or substantially the same as those described above, and thus, redundant description thereof may not be repeated.

Referring to FIG. 19, in another embodiment, a plurality of prism-shaped protrusions PRP may be disposed on a bottom face (e.g., a bottom surface) BS of each of the plurality of grooves GR. The grooves GR and the protrusions PRP may correspond in an one-to-many manner. For example, a plurality of protrusions PRP may be disposed on the bottom face BS of the first groove GR1, a plurality of protrusions PRP may be disposed on the bottom face BS of the second groove GR2, and a plurality of protrusions PRP may be disposed on the bottom face BS of the third groove GR3. Further, a width W1 of each protrusion PRP in the first direction DR1 may be smaller than a length L1 (or a width)

of each groove GR in the first direction DR1. Further, the plurality of protrusions PRP may occupy 50% to 90% or greater of an area of the bottom face BS of a corresponding groove GR. However, the present disclosure is not limited thereto.

The present disclosure is not limited to the shapes of the protrusion PRP described above, and the protrusion PRP may have various suitable shapes that may be different from those described above.

For convenience of illustration, FIG. 20 to FIG. 22 schematically show a plurality of protrusions PRP disposed on the bottom face BS of one groove GR. In some embodiments, each of or at least one of the first groove GR1, the second groove GR2, and the third groove GR3 may have the same or substantially the same structure as that of the one groove GR, and thus, redundant description thereof may not be repeated.

Referring to FIG. 20, a plurality of protrusions PRP may be arranged and spaced apart from each other. The plurality of protrusions PRP may be arranged regularly or irregularly. In some embodiments, the protrusions PRP may have a shape of a triangular cone having a rounded bottom face (e.g., a rounded bottom surface) while a top portion of the cone is cut away in a horizontal direction, for example, as shown in FIG. 20. Referring to FIG. 21, in some embodiments, each of a plurality of protrusions PRP may have a conical shape having a circular bottom face (e.g., a circular bottom surface). Referring to FIG. 22, in some embodiments, each of a plurality of protrusions PRP may have a triangular pyramid shape having a triangular bottom face (e.g., a triangular bottom surface).

Each of the plurality of protrusions PRP as described above may be shaped for condensing and diffusing the light that is incident from the light-emitting element LE to the bottom face BS of the groove GR. However, the present disclosure is not limited thereto. Each of the plurality of protrusions PRP may have various suitable structures as long as the structures thereof are capable of condensing and diffusing the incident light thereto.

Figure 23:
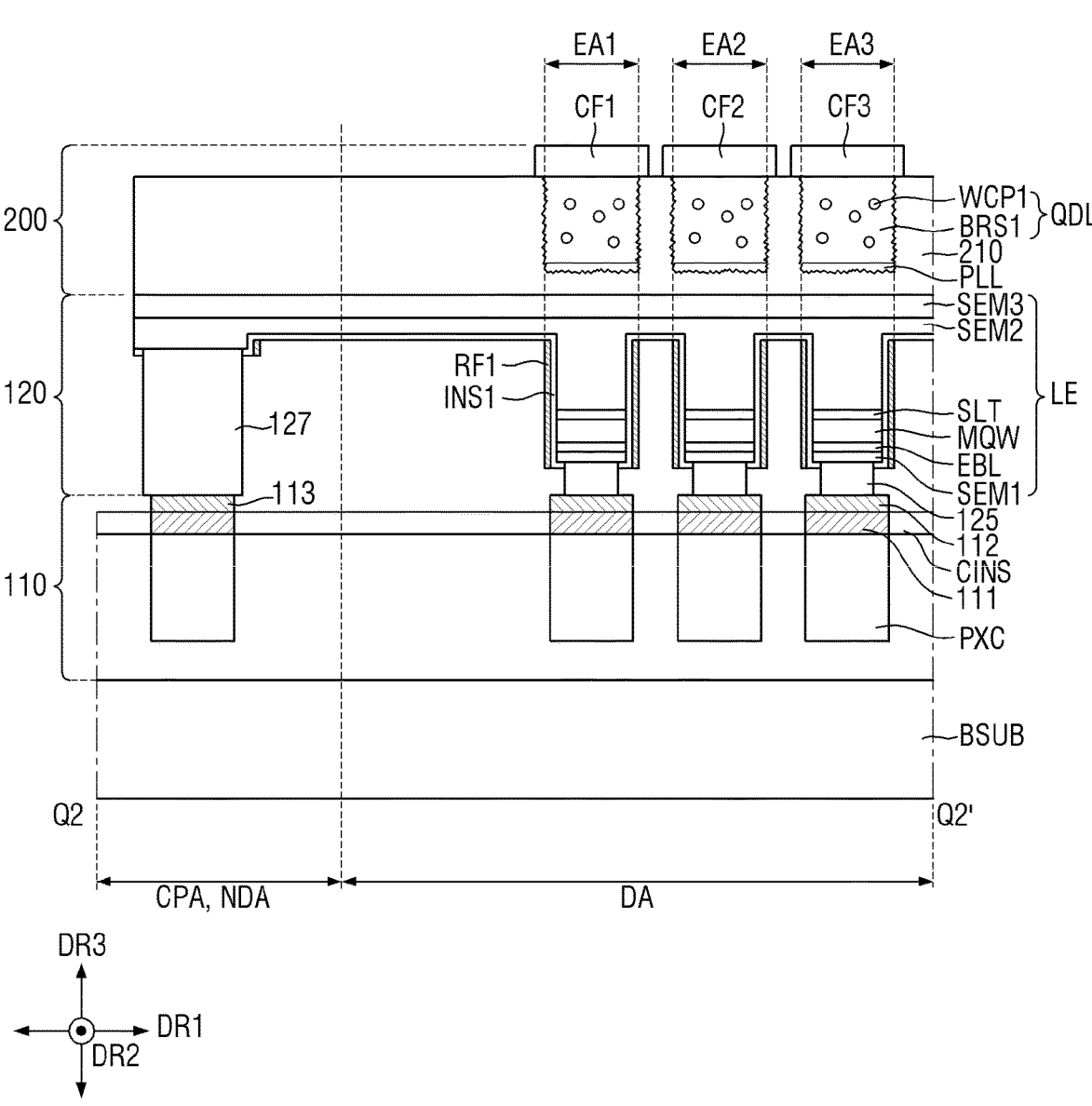
FIG. 23 is a cross-sectional view showing a display panel according to another embodiment.
Figure 24:
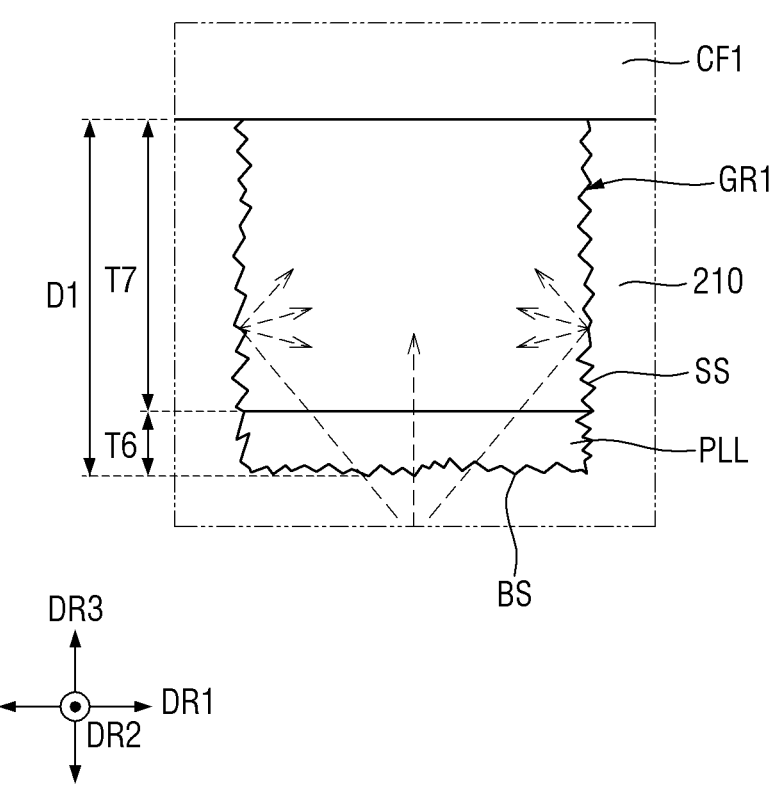
FIG. 24 is an enlarged view showing a first groove.
Figure 25:
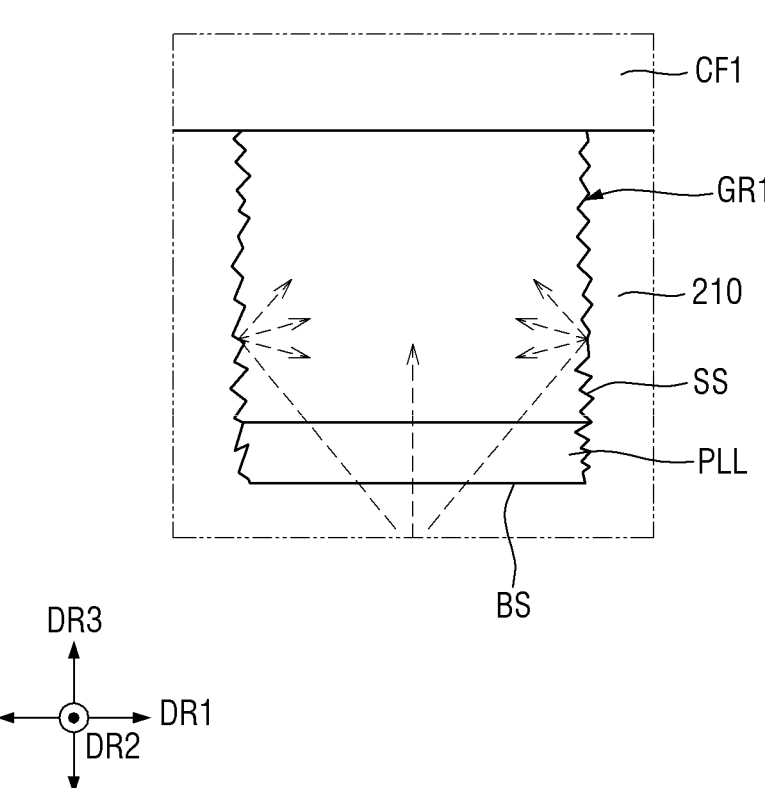
FIG. 25 is an enlarged view showing a first groove according to another embodiment.

FIG. 23 is a cross-sectional view showing a display panel according to another embodiment. FIG. 24 is an enlarged view showing a first groove. FIG. 25 is an enlarged view showing a first groove according to another embodiment.

Referring to FIG. 23 and FIG. 24, a display panel 100 may be different from those of the embodiments described above with reference to FIG. 4 to FIG. 22, in that a fine convex-concave pattern may be formed on a side face (e.g., a side surface) SS and a bottom face (e.g., a bottom surface) BS of each of the plurality of grooves GR, and a planarization layer PLL may be disposed in each of the plurality of grooves GR. Hereinafter, redundant description of the same or substantially the same components between the embodiments of FIGS. 23 to 25 and the embodiments of FIGS. 4 to 22 may be simplified or may not be repeated, and the differences therebetween may be mainly described in more detail.

The fine convex-concave pattern may be formed on the side face SS and the bottom face BS of each of the plurality of grooves GR. The wavelength conversion layer QDL (e.g., a corresponding portion thereof) may be received in each of the plurality of grooves GR. Thus, the wavelength conversion layer QDL may convert a wavelength of the light incident thereto from the light-emitting element LE using the wavelength conversion particles thereof. When the fine convex-concave pattern is formed on the side face SS and the bottom face BS of each of the plurality of grooves GR, the incident light may be reflected, refracted, and diffused on the fine convex-concave pattern of the side face SS, and then may be effectively incident onto the wavelength conversion particles. Accordingly, the wavelength conversion efficiency of the wavelength conversion layer QDL may be increased.

The side face SS and the bottom face BS of each of the plurality of grooves GR may be formed using dry etching. Using the dry etching, the fine convex-concave pattern may be formed on an entirety or substantially an entirety of the side face SS and an entirety or substantially an entirety of the bottom face BS of each of the plurality of grooves GR. However, the bottom face BS may act as an incident face (e.g., an incident surface) onto which light is upwardly incident. Thus, when the bottom face BS has the fine convex-concave pattern, an amount of light incident into the groove GR may be reduced.

In one or more embodiments, the planarization layer PLL may be disposed on the bottom face BS of each of the plurality of grooves GR. The planarization layer PLL may include (e.g., may be made of) a material having the same or substantially the same (or similar) refractive index as that of the base substrate 210, thereby preventing or substantially preventing the incident light from being reflected from the bottom face BS having the fine convex-concave pattern.

The planarization layer PLL may include a material having a refractive index that is equal to or substantially equal to (or similar to) that of the base substrate 210. The planarization layer PLL may include an inorganic insulating material or an organic insulating material. For example, the inorganic insulating material may include silicon oxide ($SiO_x$), silicon nitride ($SiN_x$), silicon oxynitride ($SiO_xN_y$), aluminum oxide ($Al_xO_y$), aluminum nitride (AlN), and/or the like. The organic insulating material may include an epoxy-based resin, an acrylic-based resin, a cardo-based resin, or an imide-based resin.

In one or more embodiments, when the planarization layer PLL includes (e.g., is made of) the organic insulating material, a top face (e.g., a top surface) of the planarization layer PLL may be planarized or substantially planarized to reduce the refraction of light thereon, such that an amount of the light incident into the groove may be increased.

A thickness T6 of the planarization layer PLL may be smaller than the depth D1 of the groove GR. In an embodiment, the thickness T6 of the planarization layer PLL may be in a range of 5% to 30% or greater of the depth D1 of the groove GR. In an embodiment, the thickness T6 of the planarization layer PLL may be 30% or smaller of the depth D1 of the groove GR, so that decrease in the wavelength conversion efficiency due to a decrease in an amount of the wavelength conversion layer QDL formed in the groove GR may be prevented or substantially prevented. Further, the thickness T6 of the planarization layer PLL may be smaller than a thickness T7 of the wavelength conversion layer QDL, so that the decrease in the wavelength conversion efficiency due to the decrease in the amount of the wavelength conversion layer QDL may be prevented or substantially prevented.

Referring to FIG. 25, in another embodiment, the bottom face BS of each of the plurality of grooves GR may have a flat or substantially flat shape instead of the fine convex-concave pattern shape. When the bottom face BS has the flat or substantially flat shape, light incident thereto from the underlying light-emitting element LE may be easily incident into each of the plurality of grooves GR, while not being diffused and reflected from the bottom face BS. Further, in some embodiments, the planarization layer PLL may be omitted.

In one or more embodiments, the side face SS and the bottom face BS of each groove GR may have the fine convex-concave pattern, or only the side face SS may have the fine convex-concave pattern, so that the wavelength conversion efficiency may be improved via refraction, reflection, and diffusion of the incident light thereon. Further, further forming the planarization layer PLL in the groove GR may allow an amount of the light incident into the groove to be increased to improve the wavelength conversion efficiency.

Hereinafter, a manufacturing process of the display device 10 according to an embodiment will be described with reference to the other figures.

Figure 26:
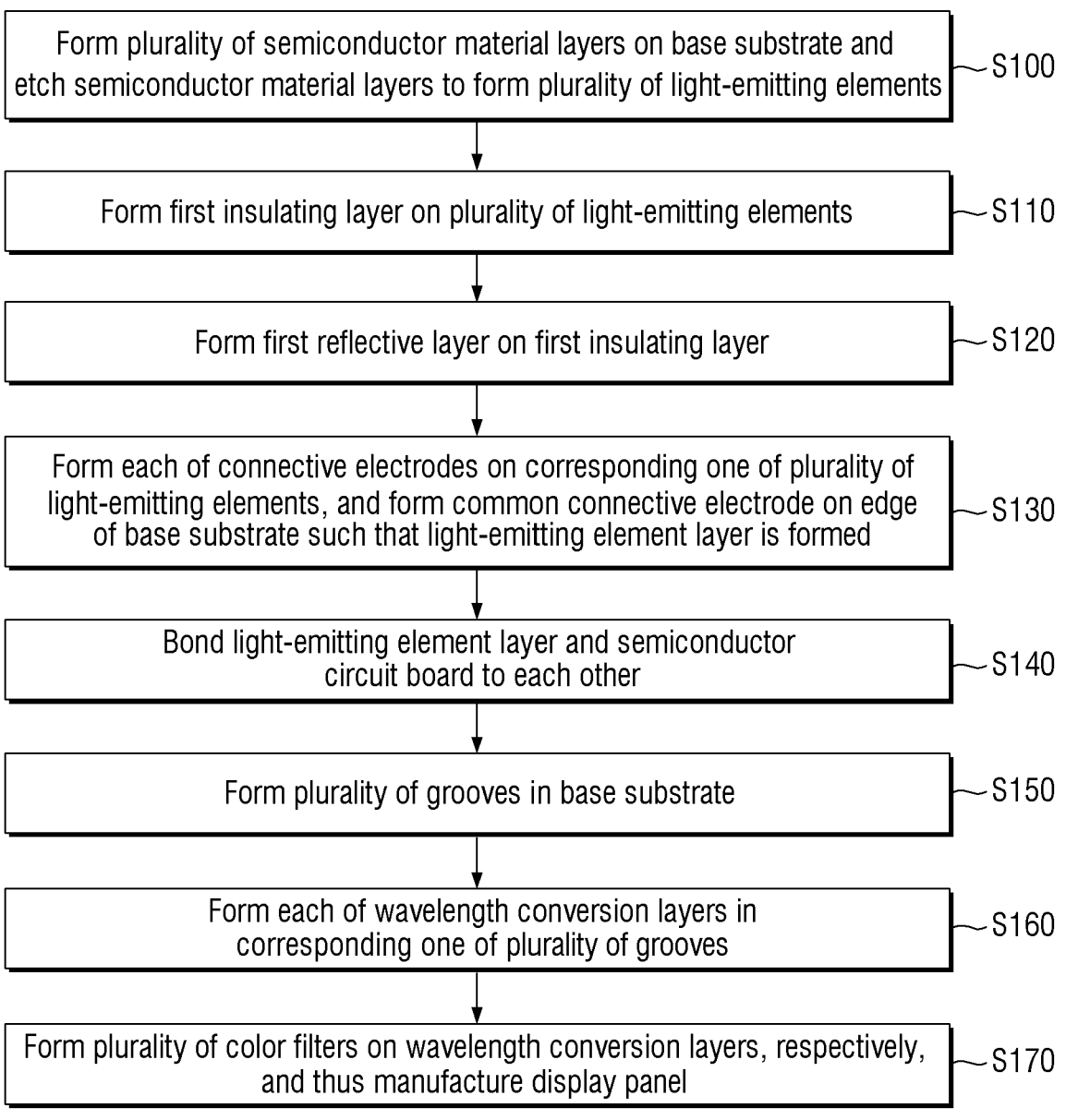
FIG. 26 is a flowchart showing a manufacturing method of a display panel according to an embodiment.

FIG. 26 is a flowchart showing a manufacturing method of a display panel according to an embodiment. FIG. 27 to FIG. 36 are cross-sectional views illustrating the manufacturing method of the display panel according to an embodiment.

FIG. 27 to FIG. 36 show cross-sectional views of intermediate structures according to a formation order of the layers of the display panel 100 of the display device 10, respectively. FIG. 27 to FIG. 36 mainly illustrate a manufacturing process of the light-emitting element layer 120 and the wavelength conversion substrate 200, and may correspond to the cross-sectional view of FIG. 5. Hereinafter, the manufacturing method of the display panel shown in FIG. 27 to FIG. 36 will be described in conjunction with FIG. 26.

Figure 27:
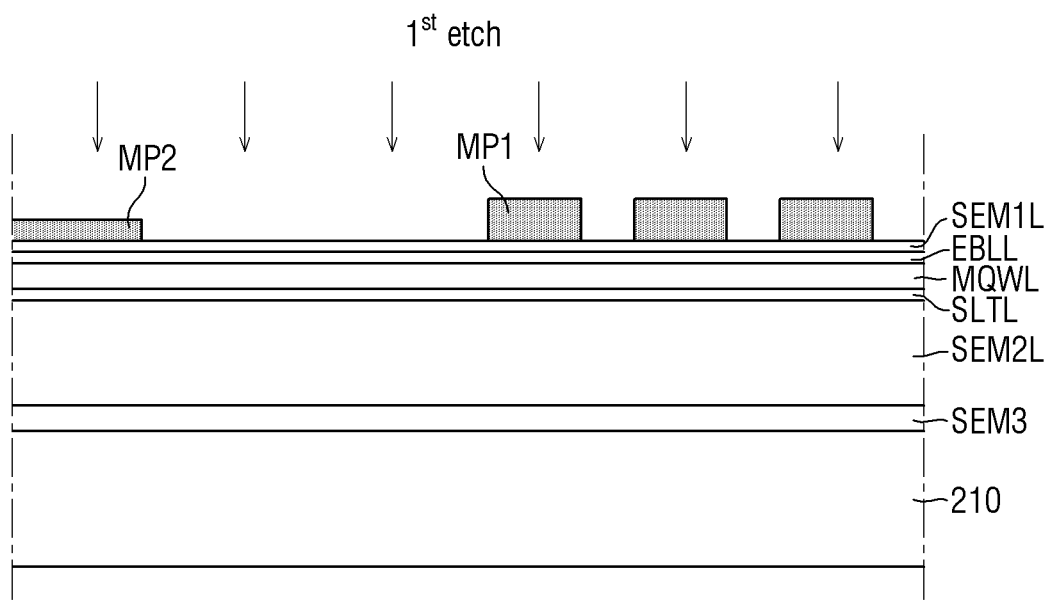
FIGS. 27-36 are cross-sectional views illustrating a manufacturing method of a display panel according to an embodiment.

Referring to FIGS. 26 and 27, a plurality of semiconductor material layers SEM3, SEM2L, SLTL, MQWL, EBLL, and SEM1L are formed on the base substrate 210 (S100 in FIG. 26).

For example, the base substrate 210 is provided. The base substrate 210 may be a sapphire substrate ($Al_2O_3$) or a silicon wafer including silicon. However, the present disclosure is not limited thereto. For convenience, a case where the base substrate 210 is embodied as the sapphire substrate will be described in more detail by way of an example.

The plurality of semiconductor material layers SEM3, SEM2L, SLTL, MQWL, EBLL, and SEM1L are formed on the base substrate 210. The plurality of semiconductor material layers SEM3, SEM2L, SLTL, MQWL, EBLL, and SEM1L may be grown using an epitaxial method, and may be formed by growing a seed crystal. In this connection structure, each of the semiconductor material layers SEM3, SEM2L, SLTL, MQWL, EBLL, and SEM1L may be formed by using electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like. For example, in an embodiment, the metal-organic chemical vapor deposition (MOCVD) may be employed. However, the present disclosure is not limited thereto.

A precursor material for forming the plurality of semiconductor material layers SEM3, SEM2L, SLTL, MQWL, EBLL, and SEM1L may not be particularly limited, and may be selected from a group of materials used for forming a target material as would be known to those skilled in the art. For example, the precursor material may be a metal precursor including an alkyl group, such as a methyl group or an ethyl group. As another example, the precursor material may be a compound, such as trimethyl gallium ($Ga(CH_3)_3$), trimethyl aluminum ($Al(CH_3)_3$), triethyl phosphate (($C_2H_5$)$_3PO_4$), or the like. However, the present disclosure is not limited thereto.

In more detail, the third semiconductor layer SEM3 is formed on the base substrate 210. Although one third semiconductor layer SEM3 is shown as being stacked, the present disclosure is not limited thereto. For example, in some embodiments, a plurality of third semiconductor layers SEM3 may be formed. The third semiconductor layer SEM3 may be disposed to reduce a difference between lattice constants of the second semiconductor material layer SEM2L and the base substrate 210. As an example, the third semiconductor layer SEM3 may include a semiconductor material that is undoped with an n-type dopant or p-type dopant. In an embodiment, the third semiconductor layer SEM3 may include (e.g., may be made of) at least one of InAlGaN, GaN, AlGaN, InGaN, AlN, and/or InN, which may be undoped. However, the present disclosure is not limited thereto.

Similarly, a second semiconductor material layer SEM2L, a superlattice material layer SLTL, an active material layer MQWL, an electron blocking material layer EBLL, and a first semiconductor material layer SEM1L are sequentially formed on the third semiconductor layer SEM3.

Subsequently, the plurality of semiconductor material layers SEM2L, SLTL, MQWL, EBLL, and SEM1L are etched to form the plurality of light-emitting elements LE.

In more detail, a plurality of first mask patterns MP1 and a second mask pattern MP2 are formed on the first semiconductor material layer SEM1L. Each of the first mask patterns MP1 and the second mask pattern MP2 may be embodied as a hard mask including an inorganic material, or a photoresist mask including an organic material. The first mask patterns MP1 may be thicker than the second mask pattern MP2, so that the plurality of semiconductor material layers SEM2L, SLTL, MQWL, EBLL, and SEM1L below the first mask patterns MP1 are not etched.

Using the plurality of first mask patterns MP1 and the second mask pattern MP2 as masks, a portion of each of the plurality of semiconductor material layers is etched (e.g., first etch).

Figure 28:
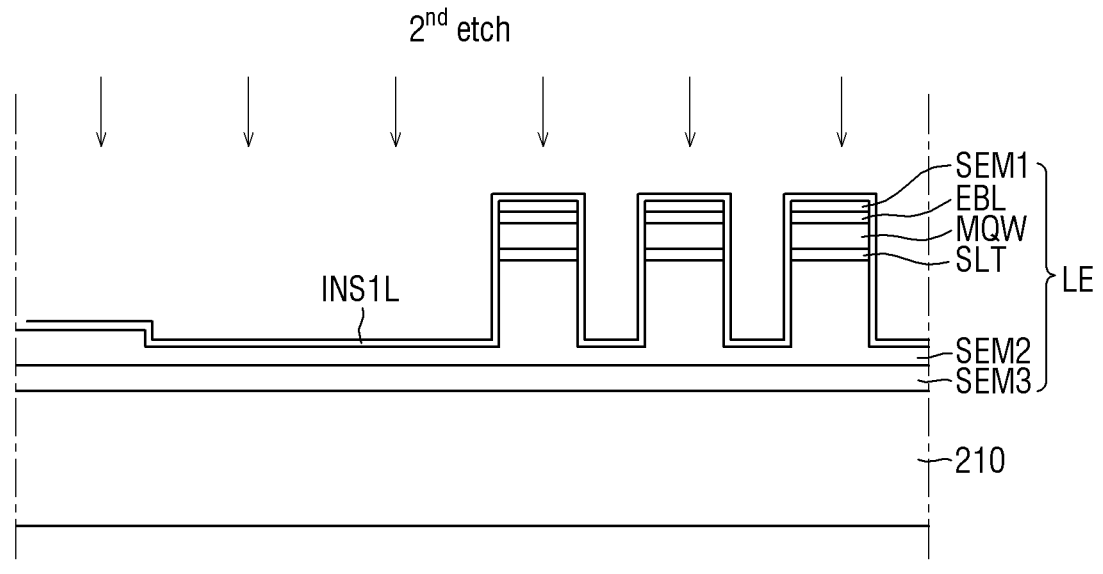

Referring to FIG. 28, the portion of each of the plurality of semiconductor material layers SEM2L, SLTL, MQWL, EBLL, and SEM1L on the base substrate 210 may be etched and removed, such that an unetched portion thereof may act as a plurality of light-emitting elements LE. The semiconductor material layers SEM2L, SLTL, MQWL, EBLL, and SEM1L may be etched using any suitable method known to those skilled in the art. For example, a process of etching the semiconductor material layers SEM2L, SLTL, MQWL, EBLL, and SEM1L may include dry etching, wet etching, reactive ion etching (RIE), deep reactive ion etching (DRIE), inductively coupled plasma reactive ion etching (ICP-RIE), and/or the like. The dry etching may realize anisotropic etching, and thus, may be suitable for vertical etching. When the suitable etching method is used, an etchant may be $Cl_2$ or $O_2$. However, the present disclosure is not limited thereto.

A portion of each of the plurality of semiconductor material layers SEM2L, SLTL, MQWL, EBLL, and SEM1L overlapping with the first mask pattern MP1 may not be etched, and may constitute each of the plurality of light-emitting elements LE. However, the second mask pattern MP2 may be etched. Thus, a portion of each of the superlattice material layer SLTL, the active material layer MQWL, the electron blocking material layer EBLL, and the first semiconductor material layer SEM1L overlapping with the second mask pattern MP2 may be etched and removed, while a portion of the second semiconductor material layer SEM2L overlapping with the second mask pattern MP2 may be partially removed, and a portion of the third semiconductor layer SEM3 overlapping with the second mask pattern MP2 may be unetched. A portion of each of the superlattice material layer SLTL, the active material layer MQWL, the electron blocking material layer EBLL, and the first semiconductor material layer SEM1L that does not overlap with each of the mask patterns MP1 and MP2 may be etched and removed, while a portion of the second semiconductor material layer SEM2L that does not overlap with each of the mask patterns MP1 and MP2 may be partially removed, and a portion of the third semiconductor layer SEM3 that does not overlap with each of the mask patterns MP1 and MP2 may be unetched. For example, a thickness of the second semiconductor material layer SEM2L at (e.g., in or on) an edge of the base substrate 210 may be relatively larger than that of the second semiconductor material layer SEM2L at (e.g., in or on) an area of the base substrate 210 adjacent to the edge. Thus, a position where the common connecting electrode 127 is disposed, which will be described in more detail below, may be defined.

As a result, the plurality of light-emitting elements LE may be formed, such that each of the plurality of light-emitting elements LE may include the third semiconductor layer SEM3, the second semiconductor layer SEM2, the superlattice layer SLT, the active layer MQW, the electron blocking layer EBL, and the first semiconductor layer SEM1. Further, each of the third semiconductor layer SEM3 and the second semiconductor layer SEM2 may be disposed over an entirety or substantially an entirety of the base substrate 210.

Next, the first insulating layer INS1 is formed on the base substrate 210 on which the plurality of light-emitting elements LE are disposed (S110 in FIG. 26).

Referring to FIG. 26 and FIG. 28, the first insulating material layer INS1L is formed on the base substrate 210. The first insulating material layer INS1L may cover (e.g., may completely cover) the plurality of light-emitting elements LE. The first insulating material layer INS1L may be formed on the base substrate 210 by coating an insulating material on the base substrate 210, or by immersing the base substrate 210 into an insulating material solution. As an example, the first insulating material layer INS1L may be formed using atomic layer deposition (ALD).

Figure 29:
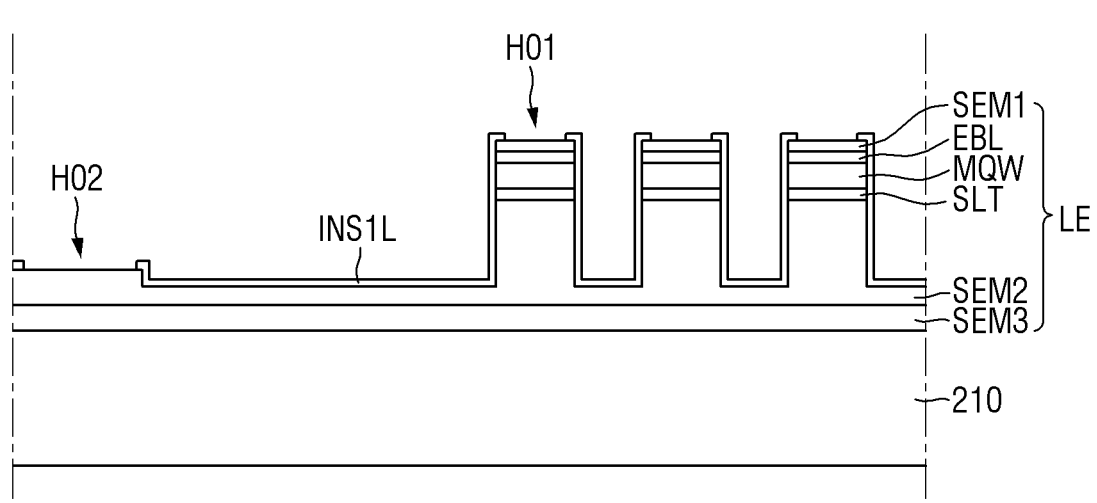

Then, referring to FIG. 29, the first insulating material layer INS1L may be partially etched and removed (e.g., second etch), so that a top face (e.g., a top surface) of each of the plurality of light-emitting elements LE and a top face (e.g., a top surface) of a portion of the second semiconductor layer SEM2 disposed on the edge of the base substrate 210 are exposed. Thus, a first hole HO1 corresponding to the exposed top face of each of the plurality of light-emitting elements LE and a second hole H02 corresponding to the exposed top face of the portion of the second semiconductor layer SEM2 disposed on the edge of the base substrate 210 may be defined in the first insulating layer INS1. Portions of the first insulating material layer INS1L may be removed to form the first insulating layer INS1 using the above-described etching method.

Figure 30:
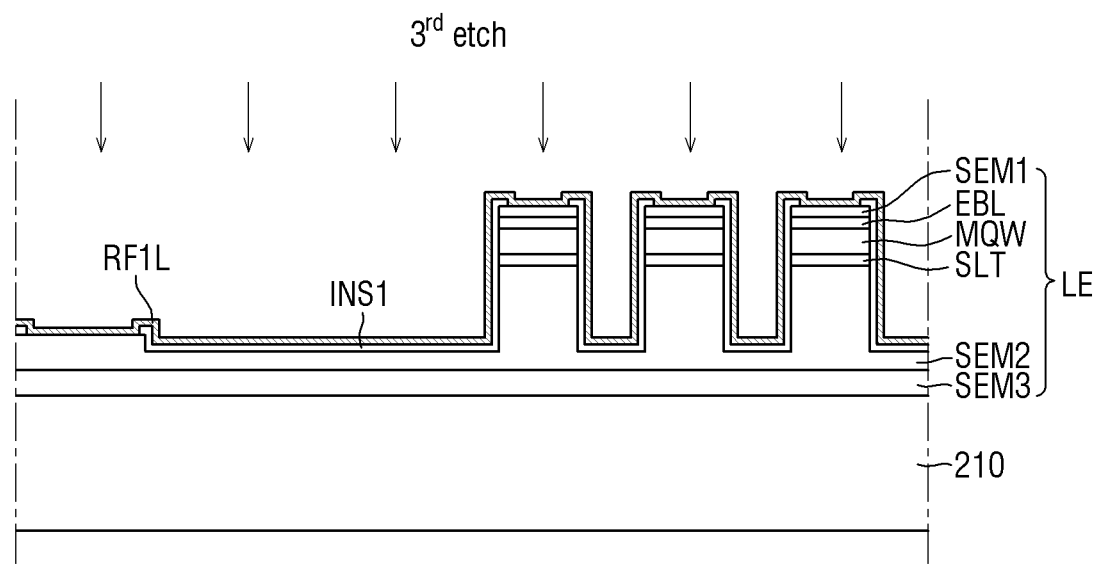

Next, referring to FIG. 26 and FIG. 30, the first reflective layer RF1 is formed on the first insulating layer INS1 (S120 in FIG. 26).

In more detail, a first reflective material layer RF1L is formed on the base substrate 210 on which the first insulating layer INS1 is formed. The first reflective material layer RF1L may include a highly reflective metal, for example, such as aluminum (Al). The first reflective material layer RF1L may be formed using a suitable metal deposition method, for example, such as sputtering as described above.

The first reflective material layer RF1L may be formed along an entirety or substantially an entirety of the first insulating layer INS1 and an entirety or substantially an entirety of the light-emitting elements LE.

Figure 31:
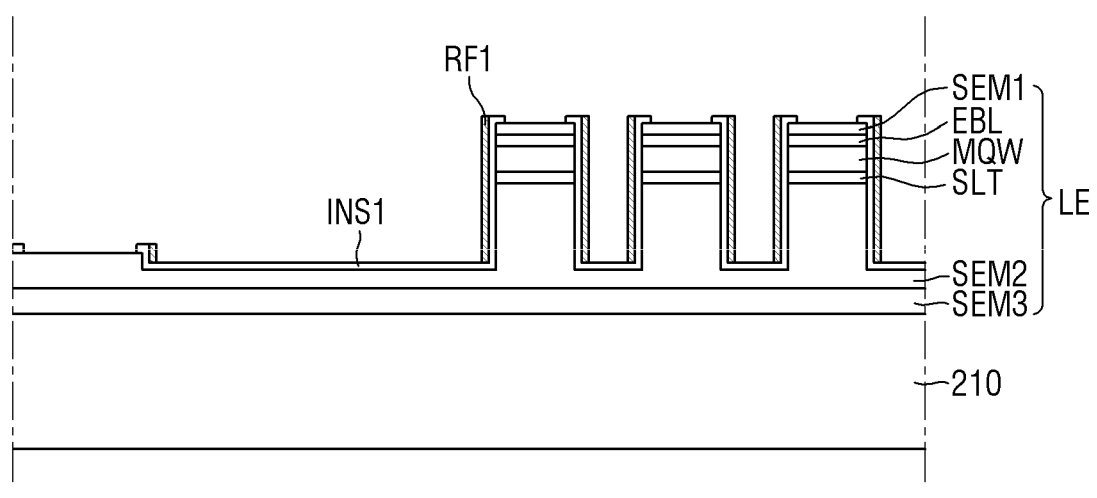

Next, referring to FIG. 30 and FIG. 31, the first reflective material layer RF1L is etched (e.g., third etch) to form the first reflective layer RF1. When a large voltage difference is generated in the etching process, and an etching gas (e.g., a predefined etching gas) is used in the etching process, a horizontal portion of the first reflective material layer RF1L extending in parallel or substantially in parallel with a plane of the base substrate 210 may be removed. On the other hand, a vertical portion of the first reflective material layer RF1L extending in a perpendicular or substantially perpendicular manner to the plane of the base substrate 210, for example, such as the vertical portions of the first reflective material layer RF1L extending along the side faces (e.g., the side surfaces) of the light-emitting elements LE, may not be removed.

Accordingly, the first reflective layer RF1 may be disposed on a side face (e.g., a side surface) of a portion of the first insulating layer INS1 disposed on the side face (e.g., the side surface) of each of the plurality of light-emitting elements LE. Further, the first reflective layer RF1 may also be disposed on a side face (e.g., a side surface) of a portion of the first insulating layer INS1 disposed on the side face (e.g., on the side surface) of a portion of the second semiconductor layer SEM2 disposed on the edge of the base substrate 210. In other words, the first reflective layer RF1 may be disposed on vertical faces (e.g., vertical surfaces) that are perpendicular to or substantially perpendicular to a top plane of the base substrate 210.

Figure 32:
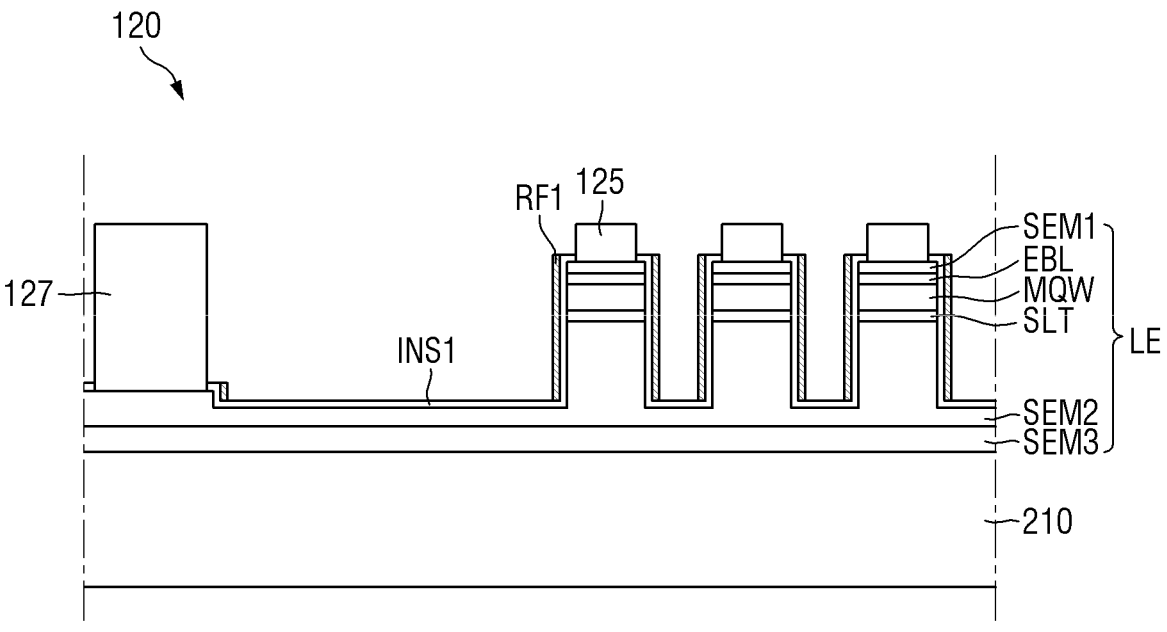

Next, referring to FIG. 26 and FIG. 32, each of the connecting electrodes 125 is formed on a corresponding one of the plurality of light-emitting elements LE. The common connecting electrode 127 is formed on an exposed portion of the second semiconductor layer SEM2 on the edge of the base substrate 210. Thus, the light-emitting element layer 120 is formed (S130 in FIG. 26).

In more detail, a common electrode material layer is formed on the base substrate 210, and is etched such that each of the connecting electrodes 125 is formed on a top face of the corresponding one of the plurality of light-emitting elements LE not covered with (e.g., exposed by) the first insulating layer INS1. The connecting electrodes 125 may be formed directly on the top face of the first semiconductor layer SEM1 of the light-emitting elements LE. The common connecting electrode 127 is formed on the exposed portion of the second semiconductor layer SEM2 that is disposed on the edge of the base substrate 210 and not covered with the first insulating layer INS1. The common connecting electrode 127 may be formed directly on a top face (e.g., a top surface) of the portion of the second semiconductor layer SEM2 that is disposed on the edge of the base substrate 210 and not covered with the first insulating layer INS1.

Each of the connecting electrodes 125 and the common connecting electrode 127 may include a transparent conductive material. Each of the connecting electrodes 125 and the common connecting electrode 127 may include a transparent conductive oxide (TCO), for example, such as ITO (Indium Tin Oxide) or IZO (Indium Zinc Oxide).

Next, the light-emitting element layer 120 is bonded (e.g., is attached or connected) to the semiconductor circuit board 110 (S140 in FIG. 26).

Figure 33:
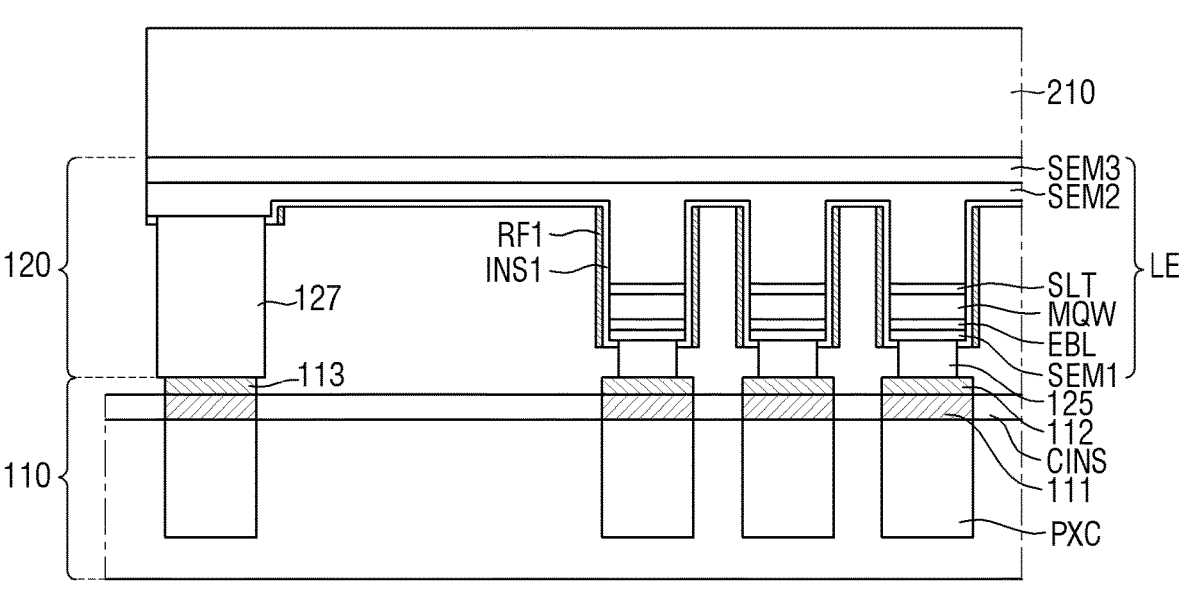
Figure 33:
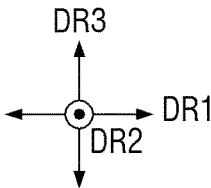

Referring to FIG. 33, the semiconductor circuit board 110 may be prepared. The semiconductor circuit board 110 may include the plurality of pixel circuits PXC, the circuit insulating layer CINS, the pixel electrodes 111, the contact electrodes 112, and the common contact electrode 113.

In more detail, the pixel electrodes 111 are formed on the semiconductor circuit board 110 on which the plurality of pixel circuits PXC are formed. The circuit insulating layer CINS is formed to planarize or substantially planarize the steps of the pixel electrodes 111. Then, a contact electrode material layer is deposited on the pixel electrodes 111, and is etched to form the contact electrodes 112 and the common contact electrode 113. The contact electrode material layer may include gold (Au), copper (Cu), aluminum (Al), or tin (Sn).

Next, the light-emitting element layer 120 and the semiconductor circuit board 110 are aligned with each other, and the semiconductor circuit board 110 and the light-emitting element layer 120 are bonded to (e.g., attached to or connected to) each other.

In more detail, the contact electrodes 112 of the semiconductor circuit board 110 and the connecting electrodes 125 of the light-emitting element layer 120 are brought into contact with each other, respectively. Further, the common contact electrode 113 of the semiconductor circuit board 110 and the common connecting electrode 127 of the light-emitting element layer 120 are brought into contact with each other. Then, the semiconductor circuit board 110 and the light-emitting element layer 120 are bonded to each other by melt-bonding the contact electrode 112 and the common contact electrode 113, the connecting electrode 125, and the common connecting electrode 127 with each other, respectively, at a suitable temperature (e.g., at a predefined temperature).

Next, the plurality of grooves GR1, GR2, and GR3 are formed in the base substrate 210 (S150 in FIG. 26).

Figure 34:
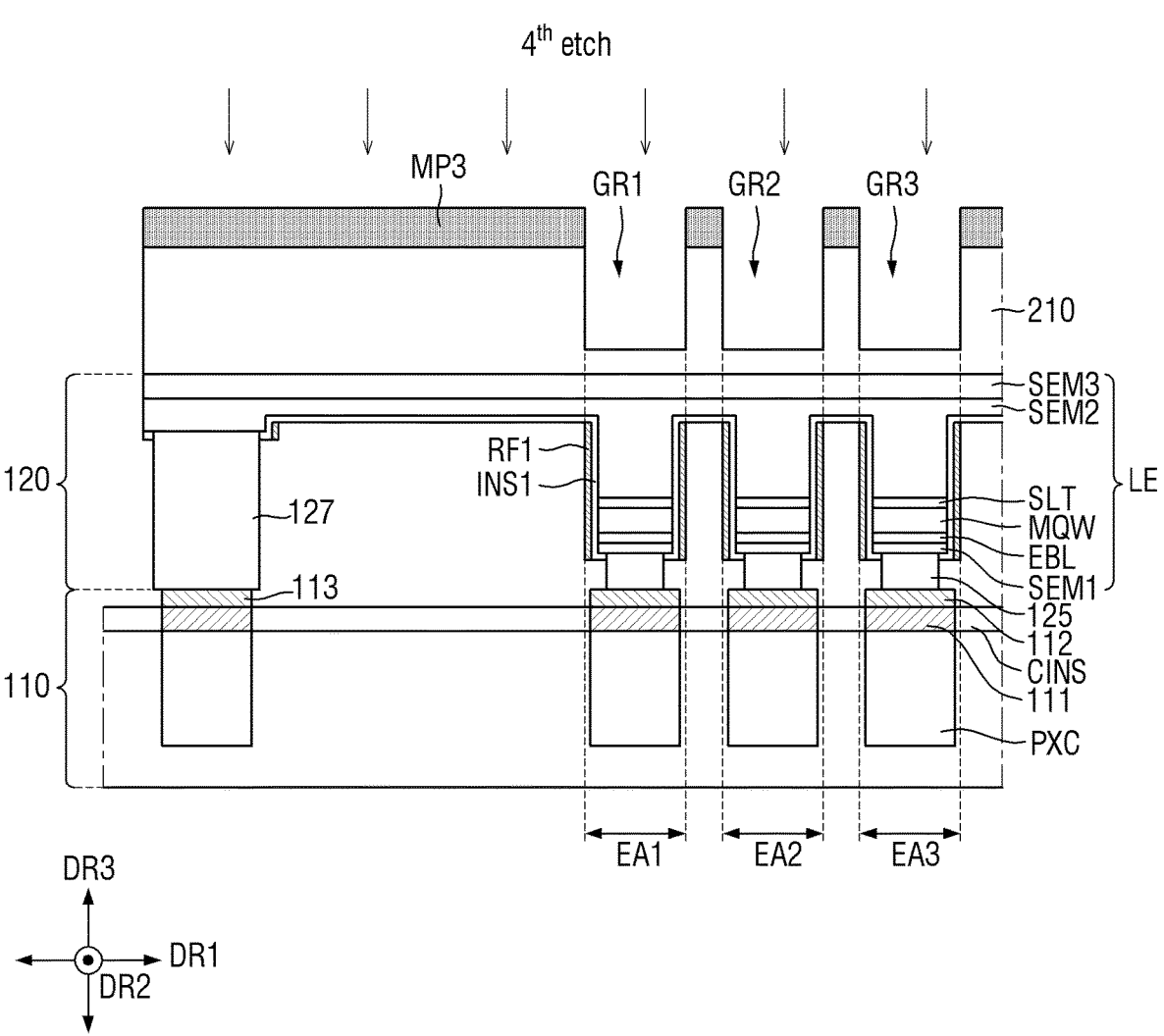

Referring to FIG. 34, a third mask pattern MP3 is formed on the base substrate 210. The third mask pattern MP3 may include the same or substantially the same material as that of the first mask pattern MP1 described above. The third mask pattern MP3 may act as a mask for forming the plurality of grooves GR1, GR2, and GR3 in the base substrate 210. Using the third mask pattern MP3 as a mask, the base substrate 210 is etched (e.g., fourth etch) to form the plurality of grooves GR1, GR2, and GR3. The etching process for forming the plurality of grooves GR1, GR2, and GR3 may be the same or substantially the same as (or similar to) the etching process of the semiconductor material layer described above.

The base substrate 210 may be etched using a deep reactive ion etching (DRIE) method, such that a groove of a high aspect ratio may be formed. Thus, the plurality of grooves GR1, GR2, and GR3 having a high aspect ratio may be formed using the deep reactive ion etching (DRIE). Accordingly, because the plurality of grooves GR1, GR2, and GR3 define the plurality of light-emitting areas EA1, EA2, and EA3, respectively, the ultra-high resolution display device 10 may be manufactured.

Next, each of the wavelength conversion layers QDL is formed in a corresponding one of the plurality of grooves GR1, GR2, and GR3 (S160 in FIG. 26).

Figure 35:
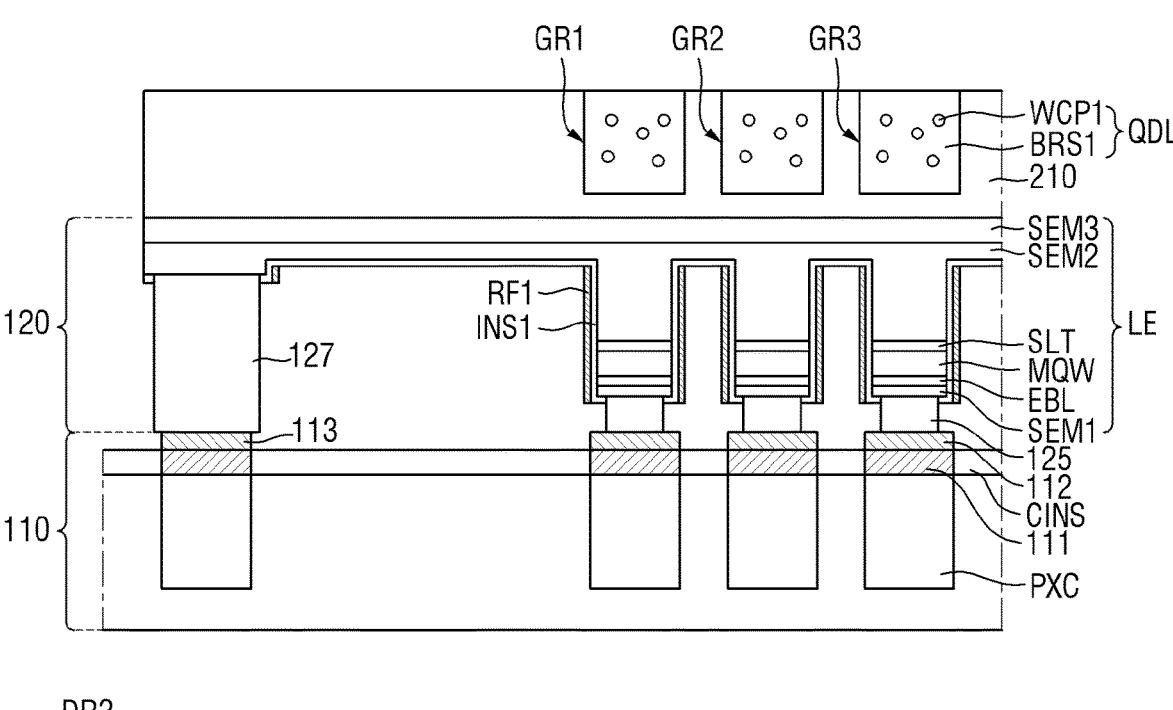

Referring to FIG. 35, each of the wavelength conversion layers QDL may fill a corresponding one of the plurality of grooves GR1, GR2, and GR3. The wavelength conversion layers QDL may be formed using a solution process, for example, such as inkjet printing, imprinting, and/or the like. However, the present disclosure is not limited thereto. Each of the wavelength conversion layers QDL may be received in a corresponding one of the plurality of grooves GR1, GR2, and GR3, and may overlap with a corresponding one of the plurality of light-emitting areas EA1, EA2, and EA3.

Next, the plurality of color filters CF1, CF2, and CF3 are formed on the wavelength conversion layers QDL, respectively (S170 in FIG. 26).

Figure 36:
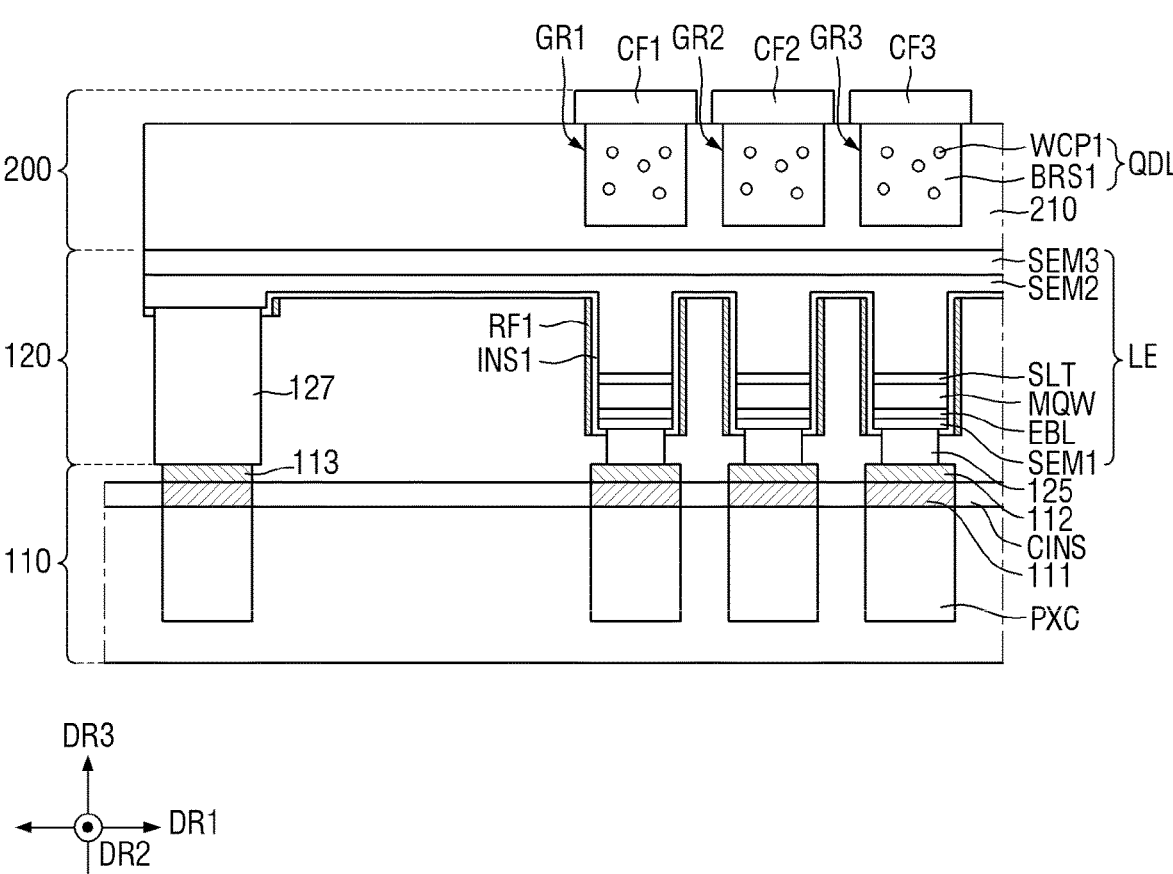

Referring to FIG. 36, the first color filter CF1 is formed on the wavelength conversion layer QDL received in the first groove GR1. The second color filter CF2 is formed on the wavelength conversion layer QDL received in the second groove GR2. The third color filter CF3 is formed on the wavelength conversion layer QDL received in the third groove GR3. The plurality of color filters CF1, CF2, and CF3 may be formed using a photo process. Each of the plurality of color filters CF1, CF2, and CF3 may have a thickness of 1 μm or smaller. However, the present disclosure is not limited thereto.

In more detail, a first color filter material layer is applied on the base substrate 210, and is patterned using a photo process to form the first color filter CF1 that overlaps with the first groove GR1. Then, a second color filter material layer is applied on the base substrate 210, and is patterned via a photo process to form the second color filter CF2 overlapping with the second groove GR2. Then, a third color filter material layer is applied on the base substrate 210, and is patterned via a photo process to form the third color filter CF3 that overlaps with the third groove GR3. Although the first color filter CF1, the second color filter CF2, and the third color filter CF3 are described as being formed in this order according to an embodiment, the present disclosure is not limited thereto, and the order may be variously modified as needed or desired.

As described with reference to FIG. 26 to FIG. 36, in the display device 10 according to an embodiment, the plurality of grooves GR may be defined in the base substrate 210 including sapphire or silicon. Thus, the high aspect ratio grooves GR may be formed. Accordingly, the wavelength conversion layers QDL are received in the plurality of grooves GR, and the color filters CF1, CF2, and CF3 are formed on the wavelength conversion layers QDL. Thus, the ultra-high resolution display device 10 may be provided.

As described above, in the display device according to one or more embodiments, the base substrate may include sapphire or silicon. Thus, the plurality of grooves having a high aspect ratio may be easily formed using the high aspect ratio etching. Accordingly, the ultra-high resolution light-emitting areas may be formed, thereby implementing an ultra-high resolution display device.

In the display device according to one or more embodiments, the wavelength conversion layers may include the light-transmissive pattern, the first wavelength conversion pattern, and the second wavelength conversion pattern, respectively, thereby improving the light emission efficiency of blue, green, and red light beams.

In the display device according to one or more embodiments, the first protective layer may be disposed between the wavelength conversion layer and the color filters, thereby preventing or substantially preventing the color filter from being damaged in the subsequent process.

In the display device according to one or more embodiments, the groove having a large depth may be formed. Thus, the color filter and the wavelength conversion layer may be received in the groove. Accordingly, alignment between the color filter and the wavelength conversion layer may be accurate, and a thickness of the wavelength conversion layer may be increased, thereby improving wavelength conversion efficiency.

The display device according to one or more embodiments may include the protrusion formed on the bottom face of the groove to induce diffusion and condensing of incident light, thereby improving the wavelength conversion efficiency of the wavelength conversion layer.

In the display device according to one or more embodiments, the fine convex-concave pattern may be formed on the side face and the bottom face of the groove, and the planarization layer may be formed on the bottom face. Thus, straightness of the light incident from the bottom face into the groove may be maintained or substantially maintained, and the diffusion of light from the side face may be induced, thereby improving the wavelength conversion efficiency of the wavelength conversion layer.

Figure 37:
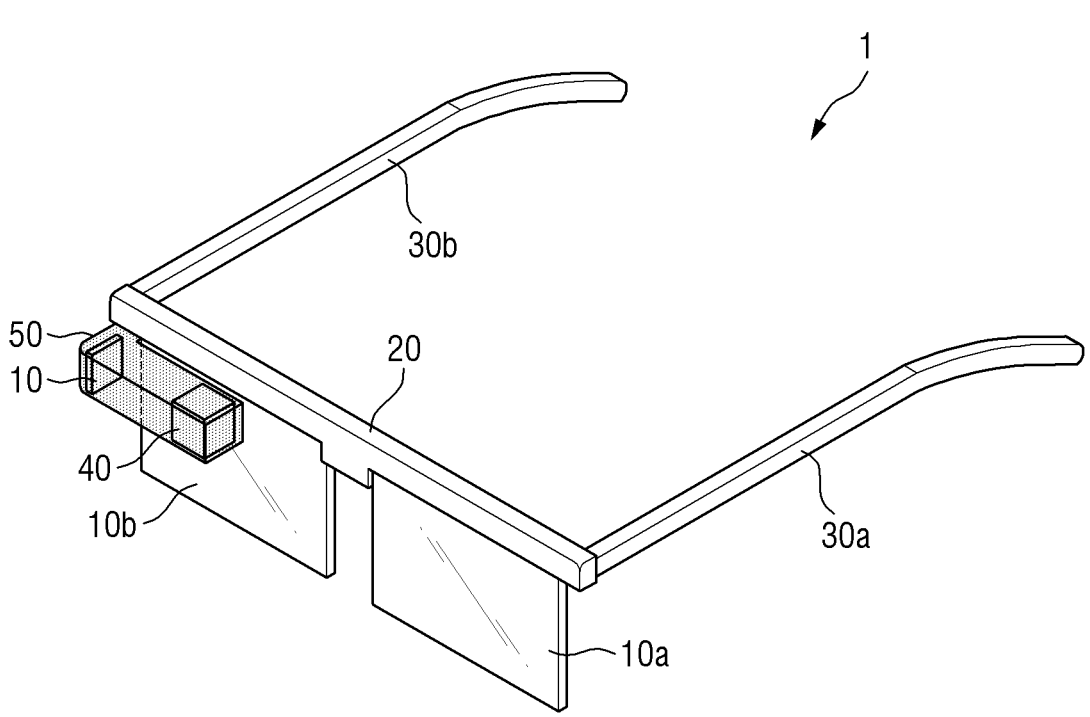
FIG. 37 is an example diagram showing a virtual reality device including a display device according to an embodiment.

FIG. 37 is an example diagram showing a virtual reality device including a display device according to an embodiment. FIG. 37 shows the virtual reality device 1 including the display device 10 according to one or more embodiments.

Referring to FIG. 37, the virtual reality device 1 according to one or more embodiments may be a device implemented in a form of glasses. The virtual reality device 1 according to an embodiment may include a display device 10, a left-eye lens 10a, a right-eye lens 10b, a support frame 20, left and right legs 30a and 30b, a reflective member 40, and a display device housing 50.

FIG. 37 shows an example of the virtual reality device 1 including the two legs 30a and 30b. However, the present disclosure is not limited thereto. The virtual reality device 1 according to an embodiment may be applied to a head mounted display including a head mounted band that may be mounted on the head of a user, instead of the legs 30a and 30b. In other words, the virtual reality device 1 according to one or more embodiments may not be limited to the example shown in FIG. 37, and may be applied in various suitable forms and in various suitable electronic devices.

The display device housing 50 may receive the display device 10 and the reflective member 40. An image displayed on the display device 10 may be reflected from the reflective member 40, and provided to the user's right-eye through the right-eye lens 10b. Thus, the user may view a virtual reality image displayed on the display device 10 via the user's right-eye.

FIG. 37 illustrates that the display device housing 50 is disposed at a right end of the support frame 20. However, the present disclosure is not limited thereto. For example, the display device housing 50 may be disposed at a left end of the support frame 20. In this case, the image displayed on the display device 10 may be reflected from the reflective member 40 and provided to the user's left-eye via the left-eye lens 10a. Thus, the user may view the virtual reality image displayed on the display device 10 via the user's left-eye. As another example, the display device housing 50 may be disposed at each of the left end and the right end of the support frame 20. In this case, the user may view the virtual reality image displayed on the display device 10 via both the user's left-eye and right-eye.

Figure 38:
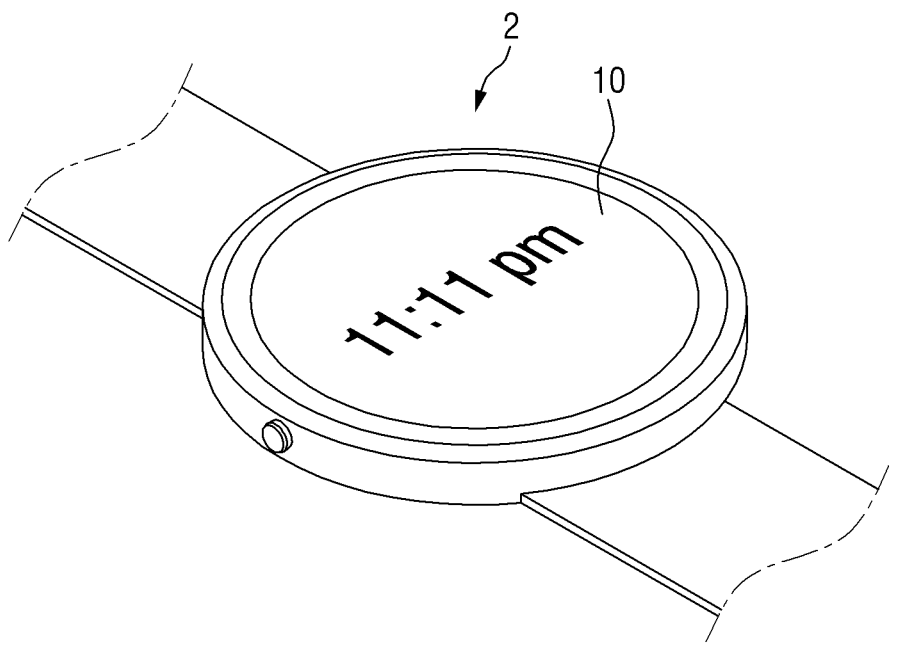
FIG. 38 is an example diagram showing a smart device including a display device according to an embodiment.

FIG. 38 is an example diagram showing a smart device including a display device according to an embodiment.

Referring to FIG. 38, a display device 10 according to one or more embodiments may be applied to (or implemented as) a smart watch 2 as one example of suitable smart devices.

Figure 39:
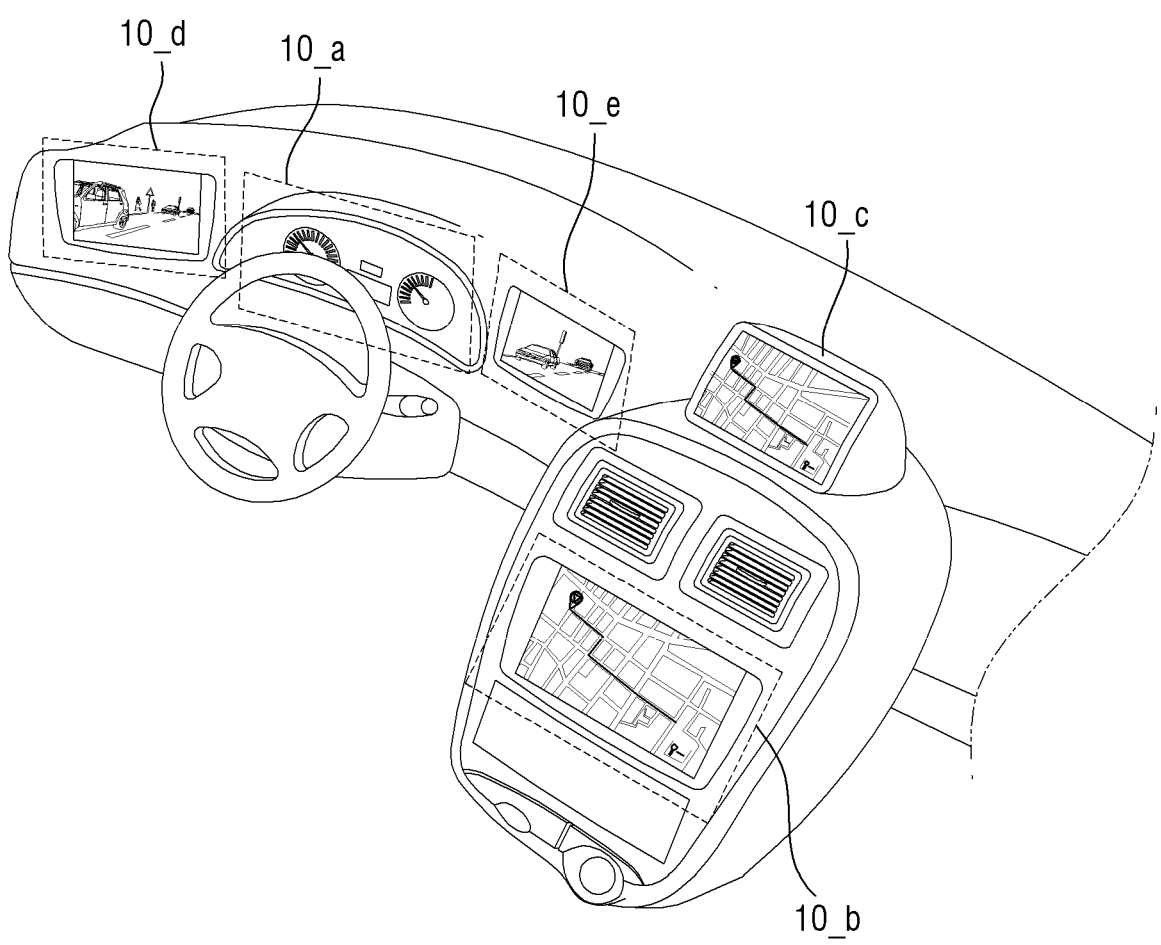
FIG. 39 is an example diagram showing a vehicle including a display device according to an embodiment.

FIG. 39 is a diagram showing a vehicle including a display device according to an embodiment. FIG. 39 shows a vehicle to which display devices according to one or more embodiments are applied (or are implemented).

Referring to FIG. 39, the display devices 10_a, 10_b, and 10_c according to one or more embodiments may be applied to the dashboard of the vehicle, the center fascia of the vehicle, and/or to a CID (Center Information Display) disposed on the dashboard of the vehicle. Further, the display devices 10_d and 10_e according to one or more embodiments may be applied to room mirror displays that replace side mirrors of the vehicle, respectively.

Figure 40:
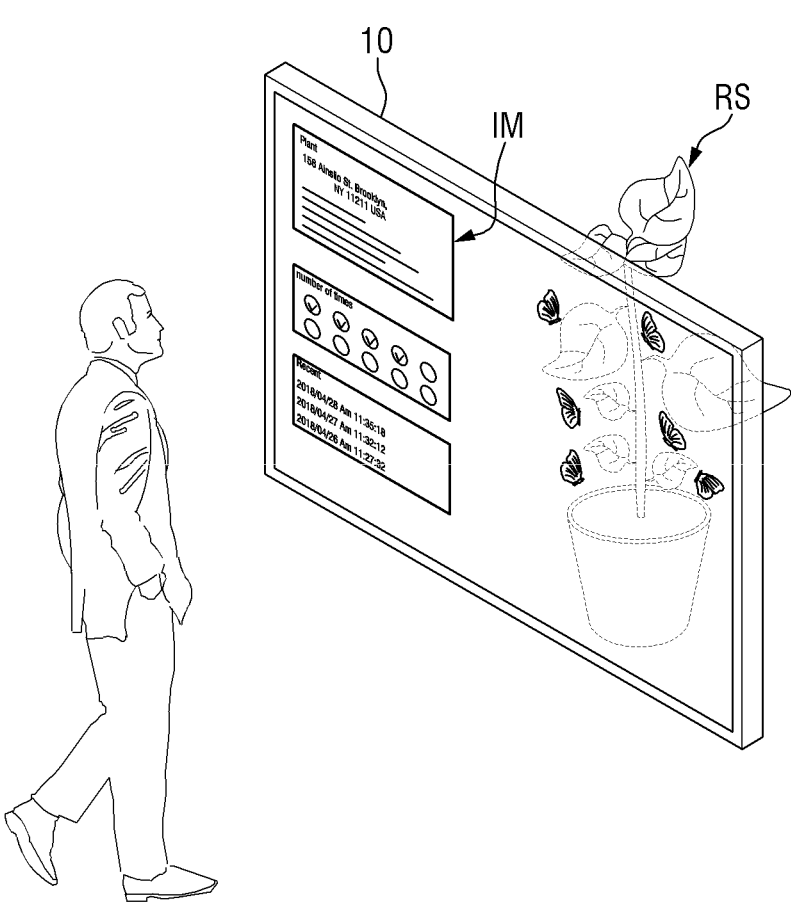
FIG. 40 is an example diagram showing a transparent display device including a display device according to an embodiment.

FIG. 40 is an example diagram showing a transparent display device including a display device according to an embodiment.

Referring to FIG. 40, a display device according to one or more embodiments may be applied to (e.g., may be implemented as) a transparent display device 10. The transparent display device 10 may transmit light therethrough, while displaying an image IM thereon. Therefore, a user located at the front of the transparent display device 10 may view the image IM displayed on the display device 10, and may also observe (e.g., may also see or view) an object RS or a background located at the rear of the transparent display device 10. When the display device 10 is applied to the transparent display device, a first substrate SUB1 of the display device 10 (e.g., shown in FIG. 4 and FIG. 5) may include a light transmitting portion that may transmit light therethrough, or may include (e.g., may be made of) a material that may transmit light therethrough.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a first substrate;
a plurality of light-emitting elements on the first substrate;
a second substrate opposite to the first substrate, and comprising one face facing the first substrate, and an opposite face to the one face;
a plurality of grooves at the opposite face of the second substrate;
a plurality of wavelength conversion layers, each of the wavelength conversion layers being located in a corresponding groove of the plurality of grooves to convert a wavelength of light emitted from a corresponding light-emitting element of the plurality of light-emitting elements; and
a plurality of color filters on the wavelength conversion layers, respectively,
wherein the plurality of grooves penetrate the opposite face of the second substrate and do not penetrate the one face of the second substrate, and wherein a same material of the second substrate that is located between the plurality of light-emitting elements and the plurality of grooves is also located between the plurality of grooves to space the grooves from each other.

2. The device of claim 1, wherein the plurality of grooves comprises a first groove, a second groove, and a third groove spaced apart from each other, and wherein the wavelength conversion layers fill the first groove, the second groove, and the third groove, respectively.

3. The device of claim 2, wherein:

the plurality of light-emitting elements are configured to emit first light;

the plurality of color filters comprise:

a first color filter configured to transmit the first light;

a second color filter configured to transmit second light having a wavelength band different from a wavelength band of the first light; and a third color filter configured to transmit third light having a wavelength band different from the wavelength band of each of the first light and the second light; and the first color filter is located on the first groove, the second color filter is located on the second groove, and the third color filter is located on the third groove.

4. The device of claim 3, wherein each of the wavelength conversion layers is configured to convert a portion of the first light into fourth light, and mix the first light and the fourth light to generate and output fifth light.

5. The device of claim 4, wherein:

the first color filter is configured to convert the fifth light to the first light;

the second color filter is configured to convert the fifth light to the second light; and the third color filter is configured to convert the fifth light to the third light.

6. The device of claim 3, wherein the wavelength conversion layers comprise:

a light-transmissive pattern configured to transmit the first light therethrough;

a first wavelength conversion pattern configured to convert the first light into the second light; and a second wavelength conversion pattern configured to convert the first light into the third light.

7. The device of claim 6, wherein the light-transmissive pattern overlaps with the first color filter and the first groove, wherein the first wavelength conversion pattern overlaps with the second color filter and the second groove, and wherein the second wavelength conversion pattern overlaps with the third color filter and the third groove.

8. The device of claim 1, wherein each of the plurality of grooves has a depth in a range of 1 micrometer (μm) to 10 μm.

9. The device of claim 1, wherein each of the plurality of light-emitting elements comprises:

a first semiconductor layer;

an active layer on the first semiconductor layer;

a second semiconductor layer on the active layer; and a third semiconductor layer on the second semiconductor layer.

10. The device of claim 9, wherein each of the second semiconductor layer and the third semiconductor layer is a common layer at the plurality of light-emitting elements.

11. The device of claim 10, wherein a thickness of the second semiconductor layer in an overlapping area at which the second semiconductor layer overlaps with the first semiconductor layer is greater than a thickness of the second semiconductor layer in a non-overlapping area at which the second semiconductor layer does not overlap with the first semiconductor layer.

12. The device of claim 9, further comprising:

a first insulating layer on side faces of each of the first semiconductor layer, the active layer, and the second semiconductor layer; and a first reflective layer on side faces of the first insulating layer.

13. The device of claim 12, further comprising a second reflective layer on side faces of each of the plurality of grooves, wherein the second reflective layer comprises a plurality of portions, each of the portions surrounding a corresponding wavelength conversion layer of the wavelength conversion layers.

14. The device of claim 9, wherein the first substrate comprises:

a plurality of pixel circuits, each comprising at least one transistor;

pixel electrodes on and connected to the plurality of pixel circuits, respectively;

a circuit insulating layer between the plurality of pixel circuits and the pixel electrodes; and contact electrodes on the pixel electrodes, respectively.

15. The device of claim 14, further comprising a plurality of connecting electrodes, each of the connecting electrodes being located between the first semiconductor layer of a corresponding light-emitting element of the light-emitting elements and a corresponding contact electrode of the contact electrodes, wherein each of the contact electrodes is in contact with a corresponding connecting electrode of the plurality of connecting electrodes.

16. The device of claim 1, further comprising a first protective layer between the second substrate and the color filters, wherein one face of the first protective layer is in contact with the wavelength conversion layers and the second substrate, and an opposite face of the first protective layer is in contact with the color filters.

17. The device of claim 1, wherein at least one of the plurality of color filters and at least one of the plurality of wavelength conversion layers are received in at least one of the plurality of grooves.

18. The device of claim 17, further comprising a second reflective layer on side faces of each of the plurality of grooves, wherein the second reflective layer contacts each of the wavelength conversion layers and the at least one of the plurality of color filters.

19. The device of claim 1, further comprising:

an organic layer on the second substrate; and a plurality of openings defined in the organic layer, and exposing the plurality of grooves, respectively, wherein the plurality of color filters are received in the plurality of openings, respectively.

20. The device of claim 19, wherein the plurality of grooves comprise a first groove, a second groove, and a third groove spaced from each other, wherein the plurality of openings comprise:

a first opening overlapping with the first groove;

a second opening overlapping with the second groove; and a third opening overlapping with the third groove, and wherein the plurality of color filters comprise:

a first color filter received in the first opening;

a second color filter received in the second opening; and a third color filter received in the third opening.

21. A display device comprising:

a first substrate;

a plurality of light-emitting elements on the first substrate;

a second substrate opposite to the first substrate, and comprising one face facing the first substrate, and an opposite face to the one face;

a plurality of grooves at the opposite face of the second substrate;

a plurality of wavelength conversion layers, each of the wavelength conversion layers being located in a corresponding groove of the plurality of grooves to convert a wavelength of light emitted from a corresponding light-emitting element of the plurality of light-emitting elements; and a plurality of color filters on the wavelength conversion layers, respectively, wherein a protrusion is on a bottom face of each of the plurality of grooves, the protrusion protruding toward the plurality of color filters, wherein the plurality of grooves penetrate the opposite face of the second substrate and do not penetrate the one face of the second substrate, and wherein a same material of the second substrate that is located between the plurality of light-emitting elements and the plurality of grooves is also located between the plurality of grooves to space the grooves from each other.

22. The device of claim 21, wherein the protrusion has a micro-lens shape or a prism shape.

23. The device of claim 22, wherein a height of each protrusion is smaller than a depth of each groove.

24. The device of claim 22, wherein the protrusion occupies 50% to 90% of an area of the bottom face.

25. A display device comprising:

a first substrate;

a plurality of light-emitting elements on the first substrate;

a second substrate opposite to the first substrate, and comprising one face facing the first substrate, and an opposite face to the one face;

a plurality of grooves at the opposite face of the second substrate;

a planarization layer received in each of the plurality of grooves;

a plurality of wavelength conversion layers on the planarization layer and received in the plurality of grooves, respectively, wherein each of the wavelength conversion layers is configured to convert a wavelength of light emitted from a corresponding light-emitting element of the plurality of light-emitting elements; and a plurality of color filters on the wavelength conversion layers, respectively, wherein each of the plurality of grooves has a bottom face and a side face, wherein a fine convex-concave pattern is on at least the side face of each of the grooves, wherein the plurality of grooves penetrate the opposite face of the second substrate and do not penetrate the one face of the second substrate, and wherein a same material of the second substrate that is located between the plurality of light-emitting elements and the plurality of grooves is also located between the plurality of grooves to space the grooves from each other.

26. The device of claim 25, wherein the planarization layer is located between the bottom face of each groove and the wavelength conversion layers.

27. The device of claim 26, wherein a thickness of the planarization layer is smaller than a depth of the grooves, and is in a range of 5% to 30% of the depth of the grooves.

28. The device of claim 26, wherein a thickness of the planarization layer is smaller than a thickness of the wavelength conversion layers.

* * * * *